(12) United States Patent
Suindykov et al.

(10) Patent No.: US 11,953,871 B2
(45) Date of Patent: Apr. 9, 2024

(54) BUILDING CONTROL SYSTEM WITH AUTOMATIC CONTROL PROBLEM FORMULATION USING BUILDING INFORMATION MODEL

(71) Applicant: Johnson Controls Technology Company, Auburn Hills, MI (US)

(72) Inventors: Serdar Suindykov, Shizuoka (JP); Mohammad N. Elbsat, Milwaukee, WI (US)

(73) Assignee: Johnson Controls Tyco IP Holdings LLP, Milwaukee, WI (US)

( * ) Notice: Subject to any disclaimer, the term of this patent is extended or adjusted under 35 U.S.C. 154(b) by 433 days.

(21) Appl. No.: 16/688,864

(22) Filed: Nov. 19, 2019

(65) Prior Publication Data
US 2021/0149353 A1     May 20, 2021

(51) Int. Cl.
*G05B 17/02*     (2006.01)
*G06F 17/00*     (2019.01)
*G06F 30/13*     (2020.01)

(52) U.S. Cl.
CPC ............. *G05B 17/02* (2013.01); *G06F 30/13* (2020.01)

(58) Field of Classification Search
CPC .............. G05B 17/02; G05B 2219/163; G05B 13/048; G06F 30/13
See application file for complete search history.

(56) References Cited

U.S. PATENT DOCUMENTS

| | | |
|---|---|---|
| 9,429,923 B2 | 8/2016 | Ward et al. |
| 9,447,985 B2 | 9/2016 | Johnson |
| 10,871,756 B2 | 12/2020 | Johnson et al. |
| 10,908,578 B2 | 2/2021 | Johnson et al. |
| 10,921,768 B2 | 2/2021 | Johnson et al. |
| 11,156,978 B2 | 10/2021 | Johnson et al. |

(Continued)

FOREIGN PATENT DOCUMENTS

| | | |
|---|---|---|
| CA | 2957726 A1 | 3/2016 |
| CA | 3043996 A1 | 2/2018 |

(Continued)

OTHER PUBLICATIONS

U.S. Appl. No. 16/513,054, filed Jul. 16, 2019, Johnson Controls Technology Company.

(Continued)

*Primary Examiner* — Charles R Kasenge
(74) *Attorney, Agent, or Firm* — Foley & Lardner LLP

(57) ABSTRACT

A controller for a building including one or more processors and one or more non-transitory computer-readable media storing instructions that, when executed by the one or more processors, cause the one or more processors to perform operations. The operations include parsing a computer-aided design (CAD) file or a building information model (BIM) file for the building to identify building equipment that operates to affect a variable state or condition of a zone of the building. The operations include generating one or more zone models describing one or more control relationships between the building equipment and the variable state or condition of the zone based on the CAD file or the BIM file. The operations include using the one or more zone models to perform a model-based operation for the building equipment.

20 Claims, 23 Drawing Sheets

(56) References Cited

U.S. PATENT DOCUMENTS

| | | |
|---|---|---|
| 2003/0055798 A1 | 3/2003 | Hittle et al. |
| 2008/0120069 A1* | 5/2008 | Martin ............... G06F 30/20 703/1 |
| 2014/0039845 A1* | 2/2014 | K M ................. G06F 30/18 703/1 |
| 2015/0316907 A1 | 11/2015 | Elbsat et al. |
| 2017/0104345 A1 | 4/2017 | Wenzel et al. |
| 2017/0211837 A1* | 7/2017 | Gupta ............. G05D 23/1934 |
| 2018/0197253 A1 | 7/2018 | Elbsat et al. |
| 2018/0307189 A1* | 10/2018 | Viehweider ........... G06Q 50/08 |
| 2019/0196526 A1* | 6/2019 | Meganathan ......... G06Q 50/06 |
| 2020/0033821 A1* | 1/2020 | Krishnamurthy ........ G06F 9/54 |
| 2020/0304375 A1* | 9/2020 | Chennai ................ H04L 41/12 |
| 2021/0073430 A1* | 3/2021 | Levy ..................... G06F 30/18 |
| 2021/0073433 A1* | 3/2021 | Austern ............... G06N 20/00 |

FOREIGN PATENT DOCUMENTS

| | | |
|---|---|---|
| EP | 1 156 286 A2 | 11/2001 |
| EP | 3 186 687 A4 | 7/2017 |
| EP | 3 497 377 A1 | 6/2019 |
| WO | WO-2012/161804 A1 | 11/2012 |
| WO | WO-2013/130956 A1 | 9/2013 |

OTHER PUBLICATIONS

Batterman, Stuart. Review and Extension of CO2-Based Methods to Determine Ventilation Rates with Application to School Classrooms. International Journal of Environmental Research and Public Health. Feb. 4, 2017. 22 Pages.

Chen, Xiao; Wang, Qian; Srebric, Jelena. Occupant Feedback Based Model Predictive Control for Thermal Comfort and Energy Optimization: A Chamber Experimental Evaluation. Applied Energy 164. 2016, pp. 341-351.

Kang et al., Novel Modeling and Control Strategies for a HVAC System Including Carbon Dioxide Control. Jun. 2, 2014. 19 Pages.

Lampinen, Markku J. Thermodynamics of Humid Air. Sep. 2015. 39 Pages.

Ljung, L. (1999). System Identification: Theory for the User, 2nd ed. (Prentice Hall PTR, Upper Saddle River).

Luo, Xiaoyan. Maximizing Thermal Comfort and International Design. Loughborough University. Jan. 18, 2019. 4 Pages.

Sama Aghniaey et al., The Assumption of Equidistance in the Seven-Point Thermal Sensation Scale and a Comparison between Categorical and Continuous Metrics. University of Georgia College of Engineering, Jan. 18, 2019. 4 Pages.

Sudhakaran, Saurabh; Shaurette Mark. Temperature, Relative Humidity, and CarbonDioxide Modulation in a Near-Zero Energy Efficient Retrofit House. Purdue University. 2016, 11 Pages.

Weekly, Kevin et al., Modeling and Estimation of the Humans' Effect on the CO2 Dynamics Inside a Conference Room. IEEE Transactions on Control Systems Technology, vol. 23, No. 5, Sep. 2015, 12 pages.

International Search Report and Written Opinion on PCT/US2020/061068, dated Mar. 11, 2021, 16 pages.

Neculoiu et al., "Model Predictive Control applied for building thermal control," 2015 Intl Aegean Conference on Electrical Machines & Power Electronics (ACEMP), 2015 Intl Conference on Optimization of Electrical & Electronic Equipment (OPTIM) & 2015 Intl Symposium on Advanced Electromechanical Motion Systems (ElectroMotion), Side, Turkey, 2015, pp. 363-368.

Zhang et al., "Model Predictive Control for Building Energy Reduction and Temperature Regulation," 2018 IEEE Green Technologies Conference (GreenTech), Austin, TX, USA, 2018, 7 pages.

CoolingLogic, "CoolingLogic: Up early, saving billions." URL: http://coolinglogic.com/documents/MarketingFlyer_FINAL_HiRes8. 5x11.pdf, retrieved from internet Oct. 27, 2022 (1 page).

Incomplete File of Communication with Various Companies, etc. in 2016-2021, URL: http://coolinglogic.com/documents/22072101_Letters_and_Signature_Receipts.pdf, published, as one document, on: Jul. 21, 2022 (211 pages).

Johnson Heating and Cooling L.L.C., "Divine Grace Building Automation (Images)," URL: http://cooljohnson.com/Building-Automation-Systems-Michigan/Oakland-County-Michigan/Building-Automation-Images.html, retrieved from internet Oct. 27, 2022 (8 pages).

Johnson Heating and Cooling L.L.C., "Divine Grace Building Automation," URL: http://cooljohnson.com/Building-Automation-Systems-Michigan/Oakland-County-Michigan/Building-Automation-Divine-Grace.html, retrieved from internet Oct. 27, 2022 (3 pages).

Johnson Heating and Cooling L.L.C., "Excel Rehabilitation Building Automation," URL: http://cooljohnson.com/Building-Automation-Systems-Michigan/Waterford-Michigan/Building-Automation-System-Excel.html, retrieved from internet Oct. 27, 2022 (2 pages).

Johnson Heating and Cooling L.L.C., "Intertek Testing Services Building Automation," URL: http://cooljohnson.com/Building-Automation-Systems-Michigan/Plymouth-Michigan/Building-Automation-System-Plymouth-Michigan.html, retrieved from internet Oct. 27, 2022 (8 pages).

Johnson Heating and Cooling L.L.C., "JLA Medical Building Building Automation," URL: http://cooljohnson.com/Building-Automation-Systems-Michigan/Waterford-Michigan/Building-Automation-System--JLA.html, retrieved from internet Oct. 27, 2022 (3 pages).

Johnson Heating and Cooling L.L.C., "Mosaic Christian Building Automation (Images)," URL: http://cooljohnson.com/Building-Automation-Systems-Michigan/Detroit/Building-Automation-Images.html, retrieved from internet Oct. 27, 2022 (12 pages).

Johnson Heating and Cooling L.L.C., "Mosaic Christian Building Automation," URL: http://cooljohnson.com/Building-Automation-Systems-Michigan/Detroit/Mosaic-Christian.html, retrieved from internet Oct. 27, 2022 (5 pages).

Johnson Heating and Cooling L.L.C., "Shepherd's Gate Lutheran Church Building Automation," URL: http://cooljohnson.com/Building-Automation-Systems-Michigan/Shelby-Township-Michigan/Building-Automation-Systems-SG.html, retrieved from internet Oct. 27, 2022 (3 pages).

Johnson Heating and Cooling L.L.C., "St. Clair County Residence Building Automation," URL: http://cooljohnson.com/Building-Automation-Systems-Michigan/St-Clair-Michigan/Building-Automation-System-St-Clair-Michigan.html, retrieved from internet Oct. 27, 2022 (4 pages).

Johnson Heating and Cooling L.L.C., "St. Joseph Mercy Oakland U. C. Building Automation," URL: http://cooljohnson.com/Building-Automation-Systems-Michigan/Waterford-Michigan/Building-Automation-Systems-SJMO.html, retrieved from internet Oct. 27, 2022 (2 pages).

Johnson Heating and Cooling L.L.C., "Waterford Internal Medicine Building Automation," URL: http://cooljohnson.com/Building-Automation-Systems-Michigan/Waterford-Michigan/Building-Automation-Systems-WIM.html, retrieved from internet Oct. 27, 2022 (3 pages).

Johnson Heating and Cooling, LLC, "Building Automation Clawson Michigan 2.0," URL: http://cooljohnson.com/Building-Automation-Systems-Michigan/Clawson-Michigan/Building-Automation-Clawson-Manor-2.html, retrieved from the internet Oct. 27, 2022 (6 pages).

Johnson Heating and Cooling, LLC, "Building Automation Images Clawson Michigan 2.0," URL: http://cooljohnson.com/Building-Automation-Systems-Michigan/Clawson-Michigan/Building-Automation-Clawson-Manor-2-Images.html, retrieved from the internet Oct. 27, 2022 (14 pages).

Johnson Heating and Cooling, LLC, "Building Automation System Clawson Michigan Clawson Manor," URL: http://cooljohnson.com/Building-Automation-Systems-Michigan/Clawson-Michigan/Building-Automation-System-Clawson-Manor.html; retrieved from the internet Oct. 27, 2022 (3 pages).

Johnson Heating and Cooling, LLC, "Building Automation System in Michigan Images," URL: http://cooljohnson.com/Building-Automation-Systems-Michigan/Macomb-County-Michigan/Building-Automation-Images.html; retrieved from the internet Oct. 27, 2022 (13 pages).

Johnson Heating and Cooling, LLC, "Building Automation System in Michigan," URL: http://cooljohnson.com/Building-Automation-

(56) References Cited

OTHER PUBLICATIONS

Systems-Michigan/Macomb-County-Michigan/Building-Automation-Confidential-Customer.html; retrieved from the internet, Oct. 27, 2022 (4 pages).
Johnson Solid State LLC, "Building Automation Equipment," URL: http://cooljohnson.com/Video/Building_Automation/Confidential_Customer_BLD_2/Building_Automation_Equipment.mp4, retrieved from internet Oct. 27, 2022 (35 pages).
Johnson Solid State LLC, "Building Automation GUI," URL: http://cooljohnson.com/Video/Building_Automation/Confidential_Customer_BLD_2/Building_Automation_GUI.mp4, retrieved from internet Oct. 27, 2022 (24 pages).
Johnson Solid State LLC, "Cooling Logic Overview," URL: http://coolinglogic.com/documents/CoolingLogic_Overview_High_Quality.mp4, retrieved from internet Oct. 27, 2022 (16 pages).
Johnson Solid State LLC, "So what is CoolingLogic™?" URL: http://coolinglogic.com/Coolinglogic-How-it-Works.html, retrieved from the internet Oct. 27, 2022 (3 pages).
Johnson, David, "A Method to Increase HVAC System Efficiency And Decrease Energy Consumption," White Paper: Johnson Solid State, LLC, URL: http://coolinglogic.com/documents/16102106_White_Paper_High_Resolution_Protected.pdf, Sep. 24, 2016 (51 pages).
Johnson, David, "CoolingLogic™: Changing the Way You Cool," Report: Johnson Solid State, LLC, URL: http://coolinglogic.com/documents/18111303_Changing_the_way_you_Cool.pdf, Nov. 7, 2018 (12 pages).
Johnson, David, "CoolingLogic™: Mosaic Christian Church A Case Study," Report: Johnson Solid State, LLC, URL: http://coolinglogic.com/documents/19020301_Mosaic_Christian_Coolinglogic_Case_Study.pdf, Feb. 2, 2019 (140 pages).
Johnson, David, "Excel Rehabilitation Building Automation: Building Automation System User Manual ," URL: http://cooljohnson.com/Building-Automation-Systems-Michigan/Waterford-Michigan/Building-Automation-System-Excel-Manual.html, 2012 (10 pages).
Johnson, David, "Temperature Control System and Methods for Operating Same," Pre-Publication printout of U.S. Appl. No. 15/231,943, filed Aug. 9, 2016, URL: http://coolinglogic.com/documents/16080901_CIP_As_Filed.pdf (99 pages).
Afram et al., "Theory and Application of HVAC Control Systems—A review of Model Predictive Control (MPC)," Building and Environment, Feb. 2014, vol. 72 (pp. 343-355).
Ahn et al., "Optimal Control Development for Chilled Water Plants Using a Quadratic Representation," Energy and Buildings, Apr. 2001, vol. 33, No. 4 (pp. 371-378).
Burer et al., "Non-convex Mixed-Integer Nonlinear Programming: A Survey," Surveys in Operations Research and Management Science, Jul. 2012, vol. 17, No. 2 (pp. 97-106).
Cantoni, A., "Optimal Curve Fitting with Piecewise Linear Functions," IEEE Transactions on Computers, Jan. 1971, vol. 20, No. (pp. 59-67).
Corbin et al., "A Model Predictive Control Optimization Environment for Real-Time Commercial Building Application," Journal of Building Performance Simulation, 2013, (Published online: Jan. 11, 2012) vol. 6, No. 3 (pp. 159-174).
Drgona et al., "All you Need to Know about Model Predictive Control for Buildings," Annual Reviews in Control, 2020, vol. 50 (pp. 190-232).
EPO Notice of Opposition to a European Patent issued in Appl. Ser. No. EP 16165681.4 dated May 2, 2023 (48 pages).
EPO Notice of Opposition to a European Patent issued in Appl. Ser. No. EP 16165681.4 dated May 2, 2023 (51 pages).
EPO Notice of Opposition to a European Patent with Consolidated List issued in EP Appl. Ser. No. 16165681.4 dated May 2, 2023 (4 pages).
Extended European Search Report on EP Appl. Ser. No. 16165681.4 dated Oct. 20, 2016 (5 pages).
Extended European Search Report on EP Appl. Ser. No. 22177772.5 dated Sep. 26, 2022 (11 pages).
Hackner, J.R., "Hvac system dynamics and energy use in existing buildings," Doctoral Dissertation, University of Madison, Wisconsin, 1984 (174 pages).
Haves et al., "Model Predictive Control of HVAC Systems: Implementation and Testing at the University of California, Merced," Technical Report, U.S. Department of Energy Office of Scientific and Technical Information, Jun. 29, 2010 (140 pages).
Huang et al., "A New Model Predictive Control Scheme for Energy and Cost Savings in Commercial Buildings: An Airport Terminal Building Case Study," Building and Environment, Jul. 2015, vol. 89 (pp. 203-216).
Kelman et al., "Analysis of Local Optima in Predictive Control for Energy Efficient Buildings," Journal of Building Performance Simulation, Apr. 16, 2012, vol. 6, No. 3 (pp. 236-255).
Koehler et al., "Building Temperature Distributed Control via Explicit MPC and 'Trim and Respond' Methods," European Control Conference (ECC), Jul. 17-19, 2013, Zurich, Switzerland (pp. 4334-4339).
Kwadzogah et al., "Model Predictive Control for HVAC Systems—A Review," 2013 IEEE International Conference on Automation Science and Engineering, Model Predictive Control for HVAC Systems—A Review, 2013 IEEE International Conference on Automation Science and Engineering (CASE), Madison, WI, United States, Aug. 17- 20, 2013 (pp. 442-447).
McKenna et al., "A Trnsys model of a building HVAC system with GSHP and PCM thermal energy storage—component modelling and validation," Proceedings of BS2013: 13th Conference of International Building Performance Simulation Association, Chambéry, France, Aug. 26-28, 2013 (pp. 3336-3343).
Mossolly et al., "Optimal Control Strategy for a Multizone Air Conditioning System Using a Genetic Algorithm," Energy, Jan. 2009, vol. 34, No. 1 (pp. 58-66).
Nassif et al., "Optimization of HVAC Control System Strategy Using Two-Objective genetic Algorithm," International Journal of HVA C&R Research, vol. 11, No. 3 (pp. 459-486).
Sourbon et al., "Dynamic Thermal Behaviour of Buildings with Concrete Core Activation," Dissertation, Arenberg Doctoral School of Science, Engineering & Technology, Katholieke Universiteit Leuven—Faculty of Engineering Celestijnenlaan: 300A box 2421, B-3001 Heverlee (Belgium) Sep. 2012 (416 pages).
Stluka et al., "Energy Management for Buildings and Microgrids," 2011 50th IEEE Conference on Decision and Control and European Control Conference (CDCECC) Orlando, FL, USA, Dec. 12-15, 2011 (pp. 5150-5157).
Strurznegger, D., "Model Predictive Building Climate Control, Steps Towards Practice," Doctoral Thesis, Automatic Control Laboratory, Zurich, Switzerland, 2014 (176 pages).
Sun et al., "Optimal Control of Building HVAC&R Systems Using Complete Simulation-Based Sequential Quadratic Programming (CSB-SQP)", Building and Environment, May 2005, vol. 40, No. 5 (pp. 657-669).
Third Party Observation Report on EP Appl. Ser. No. 16165681.4 dated Jan. 15, 2020 (8 pages).
Third Party Observation Report on EP Appl. Ser. No. 16165681.4 dated Oct. 5, 2018 (6 pages).
Verhelst et al., "Study of the Optimal Control Problem Formulation for Modulating Air-to-Water Heat Pumps Connected to a Residential Floor Heating System," Energy and Buildings, Feb. 2012, vol. 45 (pp. 43-53).
Verhelst, C., "Model Predictive Control of Ground Coupled Heat Pump Systems in Office Buildings," Dissertation, Arenberg Doctoral School of Science, Engineering & Technology, Katholieke Universiteit Leuven—Faculty of Engineering Celestijnenlaan : 300A box 2421, B-3001 Heverlee (Belgium) Apr. 20, 2012 (316 pages).
Wang et al., "Model-Based Optimal Control of VAV Air-Conditioning System Using Genetic Algorithm," Building and Environment, Aug. 2000, vol. 35, No. 6 (pp. 471-487).
Wang et al., "Supervisory and Optimal Control of Building HVAC Systems: A Review," HVAC&R Research, Jan. 2008, vol. 14, No. 1 (pp. 3-32).
Xi et al., "Support Vector Regression Model Predictive Control on a HVAC Plant," Control Engineering Practice, Aug. 2007, vol. 15, No. 8 (pp. 897-908).

(56) References Cited

OTHER PUBLICATIONS

Yao et al., "Global Optimization of a Central Air-Conditioning System Using Decomposition—Coordination Method," Energy and Buildings, May 2010, vol. 42, No. 5 (pp. 570-583).
EPO Office Action on EP Appl. Ser. No. 16165681.4 dated Apr. 6, 2021 (7 pages).

* cited by examiner

US 11,953,871 B2

BUILDING CONTROL SYSTEM WITH AUTOMATIC CONTROL PROBLEM FORMULATION USING BUILDING INFORMATION MODEL

BACKGROUND

The present disclosure relates generally to a building system for a building. The present disclosure relates more particularly to a building system for determining properties of a building.

A building can have many components that can affect conditions in the building. Typically, if an environmental control system (e.g., a heat, ventilation, or air conditioning system) is installed and used in operation, little to no information is available concerning a building layout, building orientation, location of components of the environmental control system, etc. However, to maintain occupant comfort while reducing operational costs, the building and components therein should be properly understood.

To capture characteristics of the building, a building information model (BIM) can be utilized. A BIM is a representation of the physical and/or functional characteristics of a building. A BIM may represent structural characteristics of the building (e.g., walls, floors, ceilings, doors, windows, etc.) as well as the systems or components contained within the building (e.g., lighting components, electrical systems, mechanical systems, HVAC components, furniture, plumbing systems or fixtures, etc.). In some embodiments, a BIM is a 3D graphical model of the building. A BIM may be created using computer modeling software or other computer-aided design (CAD) tools and may be used by any of a plurality of entities that provide building-related services.

SUMMARY

One implementation of the present disclosure is a controller for a building, according to some embodiments. The controller includes one or more processors, according to some embodiments. The controller includes one or more non-transitory computer-readable media storing instructions that, when executed by the one or more processors, cause the one or more processors to perform operations, according to some embodiments. The operations include parsing a computer-aided design (CAD) file or a building information model (BIM) file for the building to identify building equipment that operates to affect a variable state or condition of a zone of the building, according to some embodiments. The operations include generating one or more zone models describing one or more control relationships between the building equipment and the variable state or condition of the zone based on the CAD file or the BIM file, according to some embodiments. The operations include using the one or more zone models to perform a model-based operation for the building equipment, according to some embodiments.

In some embodiments, the operations include determining if any properties of the building equipment cannot be obtained based on the CAD file or the BIM file. The operations include, in response to a determination that one or more properties of the building equipment cannot be obtained based on the CAD file or the BIM file, notifying a user regarding the one or more properties of the building equipment that cannot be obtained, according to some embodiments. The operations include receiving values of the one or more properties of the building equipment from the user, according to some embodiments. The one or more control relationships are determined based on the values of the one or more properties of the building equipment, according to some embodiments.

In some embodiments, the operations include determining if any properties of the building equipment cannot be obtained based on the CAD file or the BIM file. The operations include, in response to a determination that one or more properties of the building equipment cannot be obtained based on the CAD file or the BIM file, triggering a system identification experiment to obtain the one or more properties, according to some embodiments.

In some embodiments, the operations include formulating an optimization problem based on the one or more control relationships. The operations include solving the optimization problem to generate operating setpoints for the building equipment, according to some embodiments.

In some embodiments, the operations include generating one or more constraints on the optimization problem based on the one or more control relationships between the building equipment and the variable state or condition of the zone.

In some embodiments, the one or more thermal properties of the building are used to predict a temperature of the building based on the operating setpoints for the building equipment.

In some embodiments, the operations include identifying a layout of the zone indicated by the CAD file or the BIM file. The operations include determining the one or more control relationships based on a prediction of how the building equipment affects the variable state or condition of the zone provided the layout of the zone, according to some embodiments.

Another implementation of the present disclosure is a method for operating building equipment of a building, according to some embodiments. The method includes parsing a computer-aided design (CAD) file or a building information model (BIM) file for the building to determine a layout of a zone of the building, according to some embodiments. The method includes predicting one or more thermal properties of the zone based on the layout of the zone, according to some embodiments. The one or more thermal properties include at least one of a thermal resistance associated with the zone or a thermal capacitance associated with the zone, according to some embodiments. The method includes operating the building equipment to affect a variable state or condition of the zone based on the one or more thermal properties of the zone, according to some embodiments.

In some embodiments, the method includes determining if any information associated with the layout of the zone cannot be obtained based on the CAD file or the BIM file. The method includes in response to a determination that the information associated with the layout of the zone cannot be obtained based on the CAD file or the BIM file, notifying a user regarding the information associated with the layout of the zone that cannot be obtained, according to some embodiments. The method includes receiving values of the information associated with the layout of the zone from the user, according to some embodiments. The one or more relationships are determined based on the values of the information associated with the layout of the zone, according to some embodiments.

In some embodiments, the method includes generating a zone model describing the layout of the zone and the variable state or condition of the zone. The method includes generating control decisions based on the zone model, according to some embodiments. The method includes operating the building equipment based on the control decisions, according to some embodiments.

In some embodiments, the method includes formulating an optimization problem based on the one or more thermal properties of the zone. The method includes generating one or more constraints on the optimization problem based on the layout of the zone, according to some embodiments. The method includes solving the optimization problem to generate operating setpoints for the building equipment, according to some embodiments.

In some embodiments, the method includes predicting thermal dynamics of the zone based on the one or more thermal properties.

In some embodiments, the method includes identifying a type of material contained within one or more walls of the zone or within objects inside the zone based on the CAD file or the BIM file. The thermal resistance or the thermal capacitance are predicted based on the type of material, according to some embodiments.

Another implementation of the present disclosure is an environmental control system for a building, according to some embodiments. The system includes building equipment that operates to affect a variable state or condition of a zone of the building, according to some embodiments. The system includes a controller including a processing circuit configured to perform operations, according to some embodiments. The operations include parsing a computer-aided design (CAD) file or a building information model (BIM) file for the building to identify the building equipment that operates to affect the variable state or condition of the zone, according to some embodiments. The operations include generating one or more zone models describing one or more control relationships between the building equipment and the variable state or condition of the zone based on the CAD file or the BIM file, according to some embodiments. The operations include using the one or more zone models to perform a model-based operation for the building equipment, according to some embodiments.

In some embodiments, the operations include determining if any properties of the building equipment cannot be obtained based on the CAD file or the BIM file. The operations include, in response to a determination that one or more properties of the building equipment cannot be obtained based on the CAD file or the BIM file, notifying a user regarding the one or more properties of the building equipment that cannot be obtained, according to some embodiments. The operations include receiving values of the one or more properties of the building equipment from the user, according to some embodiments. The one or more control relationships are determined further based on the values of the one or more properties of the building equipment, according to some embodiments.

In some embodiments, the operations include determining if any properties of the building equipment cannot be obtained based on the CAD file or the BIM file. The operations include, in response to a determination that one or more properties of the building equipment cannot be obtained based on the CAD file or the BIM file, triggering a system identification experiment to obtain the one or more properties, according to some embodiments.

In some embodiments, the operations include formulating an optimization problem based on the one or more control relationships. The operations include solving the optimization problem to generate operating setpoints for the building equipment, according to some embodiments.

In some embodiments, the operations include generating one or more constraints on the optimization problem based on the one or more control relationships between the building equipment and the variable state or condition of the zone.

In some embodiments, the one or more control relationships define how operation of the building equipment affects one or more environmental conditions of the building and how operation of the building equipment affects other building equipment of the building.

In some embodiments, the operations include identifying a layout of the zone indicated by the CAD file or the BIM file. The operations include determining the one or more control relationships based on a prediction of how the building equipment affects the variable state or condition of the zone provided the layout of the zone, according to some embodiments.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Overview

Figure 1:
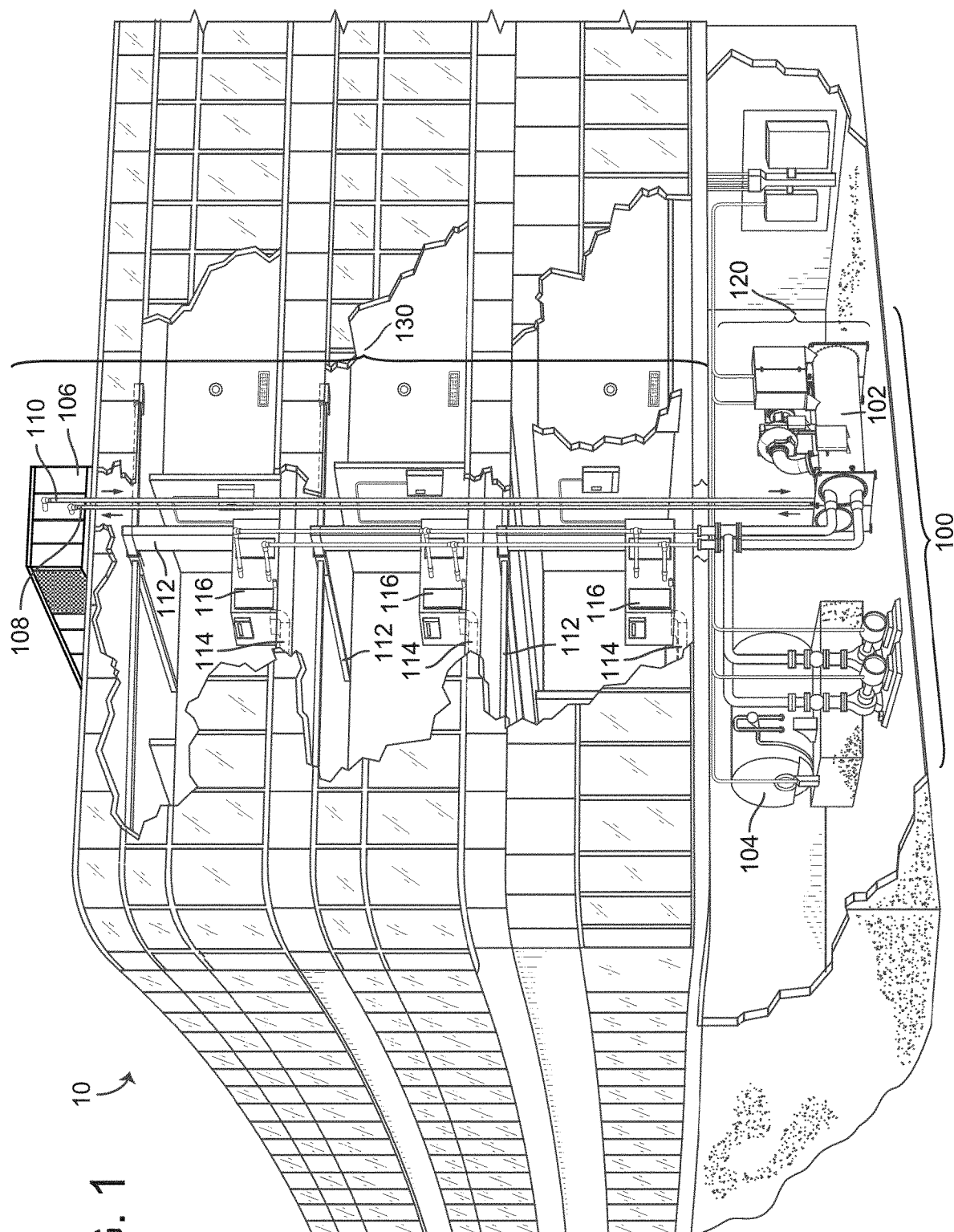
FIG. 1 is a drawing of a building equipped with a HVAC system, according to some embodiments.

Referring generally to the FIGURES, systems and methods for determining and extracting information from computer aided design (CAD) files and/or building information modeling (BIM) files for use in generating a model predictive control (MPC) problem are shown, according to some embodiments. Information in CAD/BIM files can be useful when performing MPC as acute dynamics of a building can be captured. For example, a CAD/BIM file can allow various windows in the building to be identified through which heat can easily enter and/or escape from. However, CAD/BIM files may not explicitly include some information. As such, various building information can be calculated based on readily available information in the files. Information gathered/calculated based on the CAD/BIM files can be utilized be an asset allocator of a central plant to more accurately determine how to operate building equipment to maintain occupant comfort and optimize (e.g., reduce) a cost of operating the building equipment.

Information gathered/calculated based on the CAD/BIM files can be utilized in a central plant including an asset allocator and components thereof are shown, according to some embodiments. The asset allocator can be configured to manage energy assets such as central plant equipment, battery storage, and other types of equipment configured to serve the energy loads of a building. The asset allocator can determine an optimal distribution of heating, cooling, electricity, and energy loads across different subplants (i.e., equipment groups) of the central plant capable of producing that type of energy.

In some embodiments, the asset allocator is configured to control the distribution, production, storage, and usage of resources in the central plant. The asset allocator can be configured to minimize the economic cost (or maximize the economic value) of operating the central plant over a duration of an optimization period. The economic cost may be defined by a cost function $J(x)$ that expresses economic cost as a function of the control decisions made by the asset allocator. The cost function $J(x)$ may account for the cost of resources purchased from various sources, as well as the revenue generated by selling resources (e.g., to an energy grid) or participating in incentive programs.

The asset allocator can be configured to define various sources, subplants, storage, and sinks. These four categories of objects define the assets of a central plant and their interaction with the outside world. Sources may include commodity markets or other suppliers from which resources such as electricity, water, natural gas, and other resources can be purchased or obtained. Sinks may include the requested loads of a building or campus as well as other types of resource consumers. Subplants are the main assets of a central plant. Subplants can be configured to convert resource types, making it possible to balance requested loads from a building or campus using resources purchased from the sources. Storage can be configured to store energy or other types of resources for later use.

In some embodiments, the asset allocator performs an optimization process determine an optimal set of control decisions for each time step within the optimization period. The control decisions may include, for example, an optimal amount of each resource to purchase from the sources, an optimal amount of each resource to produce or convert using the subplants, an optimal amount of each resource to store or remove from storage, an optimal amount of each resource to sell to resources purchasers, and/or an optimal amount of each resource to provide to other sinks. In some embodiments, the asset allocator is configured to optimally dispatch all campus energy assets (i.e., the central plant equipment) in order to meet the requested heating, cooling, and electrical loads of the campus for each time step within the optimization period. These and other features of the asset allocator are described in greater detail below.

Building and HVAC System

Referring now to FIG. 1, a perspective view of a building 10 is shown. Building 10 can be served by a building management system (BMS). A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof. An example of a BMS which can be used to monitor and control building 10 is described in U.S. patent application Ser. No. 14/717,593 filed May 20, 2015, the entire disclosure of which is incorporated by reference herein.

The BMS that serves building 10 may include a HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. In some embodiments, waterside system 120 can be replaced with or supplemented by a central plant or central energy facility (described in greater detail with reference to FIG. 2). An example of an airside system which can be used in HVAC system 100 is described in greater detail with reference to FIG. 3.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 may place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 may transfer heat between the airflow and the working fluid to provide heating or cooling for the airflow. For example, AHU 106 can include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Central Plant

Figure 2:
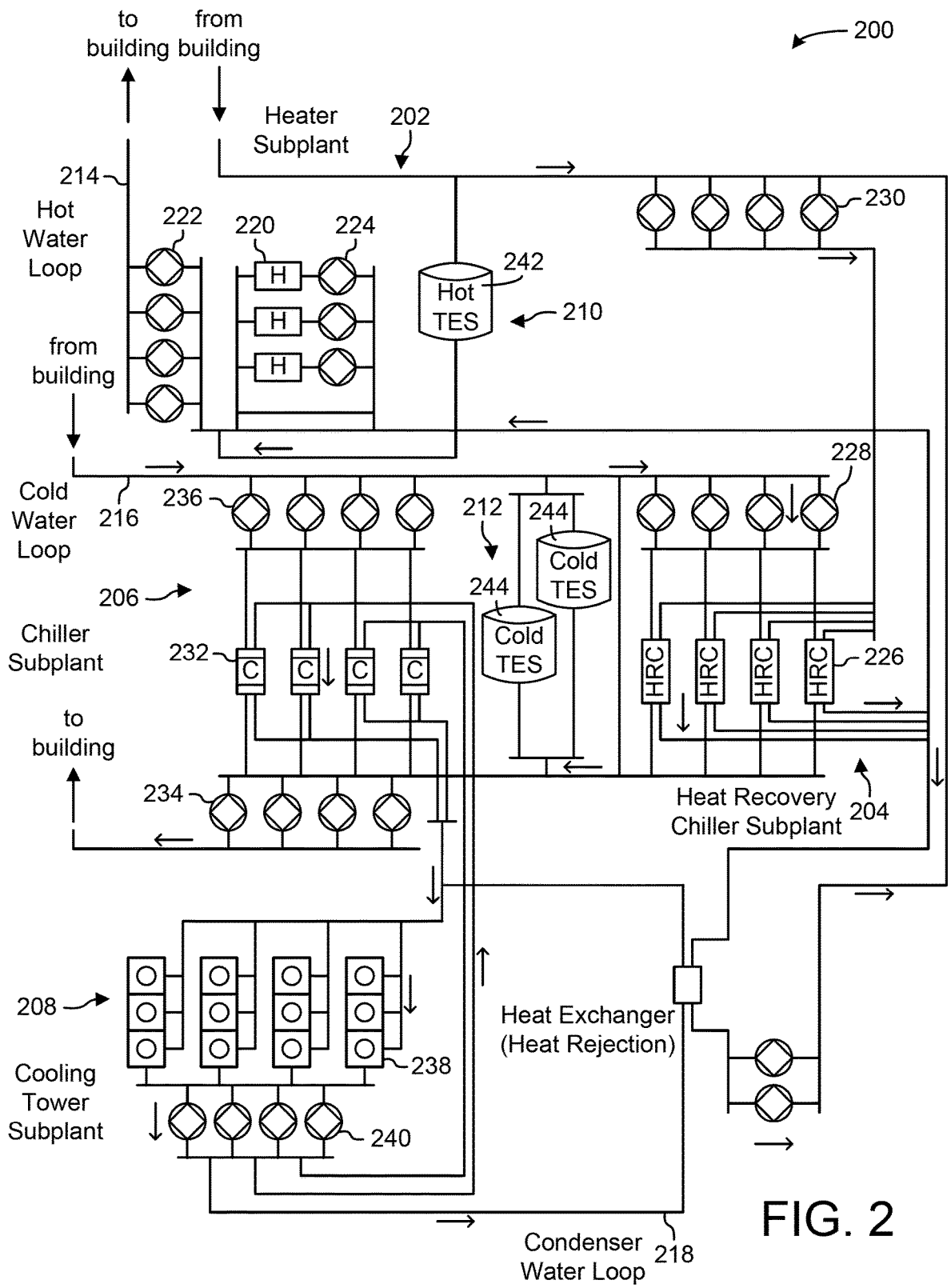
FIG. 2 is a block diagram of a central plant which can be used to serve the energy loads of the building of FIG. 1, according to some embodiments.

Referring now to FIG. 2, a block diagram of a central plant 200 is shown, according to some embodiments. In various embodiments, central plant 200 can supplement or replace waterside system 120 in HVAC system 100 or can be implemented separate from HVAC system 100. When implemented in HVAC system 100, central plant 200 can include a subset of the HVAC devices in HVAC system 100 (e.g., boiler 104, chiller 102, pumps, valves, etc.) and may operate to supply a heated or chilled fluid to AHU 106. The HVAC devices of central plant 200 can be located within building 10 (e.g., as components of waterside system 120) or at an offsite location such as a central energy facility that serves multiple buildings.

Central plant 200 is shown to include a plurality of subplants 202-208. Subplants 202-208 can be configured to convert energy or resource types (e.g., water, natural gas, electricity, etc.). For example, subplants 202-208 are shown to include a heater subplant 202, a heat recovery chiller subplant 204, a chiller subplant 206, and a cooling tower subplant 208. In some embodiments, subplants 202-208 consume resources purchased from utilities to serve the energy loads (e.g., hot water, cold water, electricity, etc.) of a building or campus. For example, heater subplant 202 can be configured to heat water in a hot water loop 214 that circulates the hot water between heater subplant 202 and building 10. Similarly, chiller subplant 206 can be configured to chill water in a cold water loop 216 that circulates the cold water between chiller subplant 206 building 10.

Heat recovery chiller subplant 204 can be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. In various embodiments, central plant 200 can include an electricity subplant (e.g., one or more electric generators) configured to generate electricity or any other type of subplant configured to convert energy or resource types.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve thermal energy loads of building 10. The water then returns to subplants 202-208 to receive further heating or cooling.

Although subplants 202-208 are shown and described as heating and cooling water for circulation to a building, it is understood that any other type of working fluid (e.g., glycol, $CO_2$, etc.) can be used in place of or in addition to water to serve thermal energy loads. In other embodiments, subplants 202-208 may provide heating and/or cooling directly to the building or campus without requiring an intermediate heat transfer fluid. These and other variations to central plant 200 are within the teachings of the present disclosure.

Each of subplants 202-208 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

In some embodiments, one or more of the pumps in central plant 200 (e.g., pumps 222, 224, 228, 230, 234, 236, and/or 240) or pipelines in central plant 200 include an isolation valve associated therewith. Isolation valves can be integrated with the pumps or positioned upstream or downstream of the pumps to control the fluid flows in central plant 200. In various embodiments, central plant 200 can include more, fewer, or different types of devices and/or subplants based on the particular configuration of central plant 200 and the types of loads served by central plant 200.

Still referring to FIG. 2, central plant 200 is shown to include hot thermal energy storage (TES) 210 and cold thermal energy storage (TES) 212. Hot TES 210 and cold TES 212 can be configured to store hot and cold thermal energy for subsequent use. For example, hot TES 210 can include one or more hot water storage tanks 242 configured to store the hot water generated by heater subplant 202 or heat recovery chiller subplant 204. Hot TES 210 may also include one or more pumps or valves configured to control the flow rate of the hot water into or out of hot TES tank 242.

Similarly, cold TES 212 can include one or more cold water storage tanks 244 configured to store the cold water generated by chiller subplant 206 or heat recovery chiller subplant 204. Cold TES 212 may also include one or more pumps or valves configured to control the flow rate of the cold water into or out of cold TES tanks 244. In some embodiments, central plant 200 includes electrical energy storage (e.g., one or more batteries) or any other type of device configured to store resources. The stored resources can be purchased from utilities, generated by central plant 200, or otherwise obtained from any source.

Airside System

Figure 3:
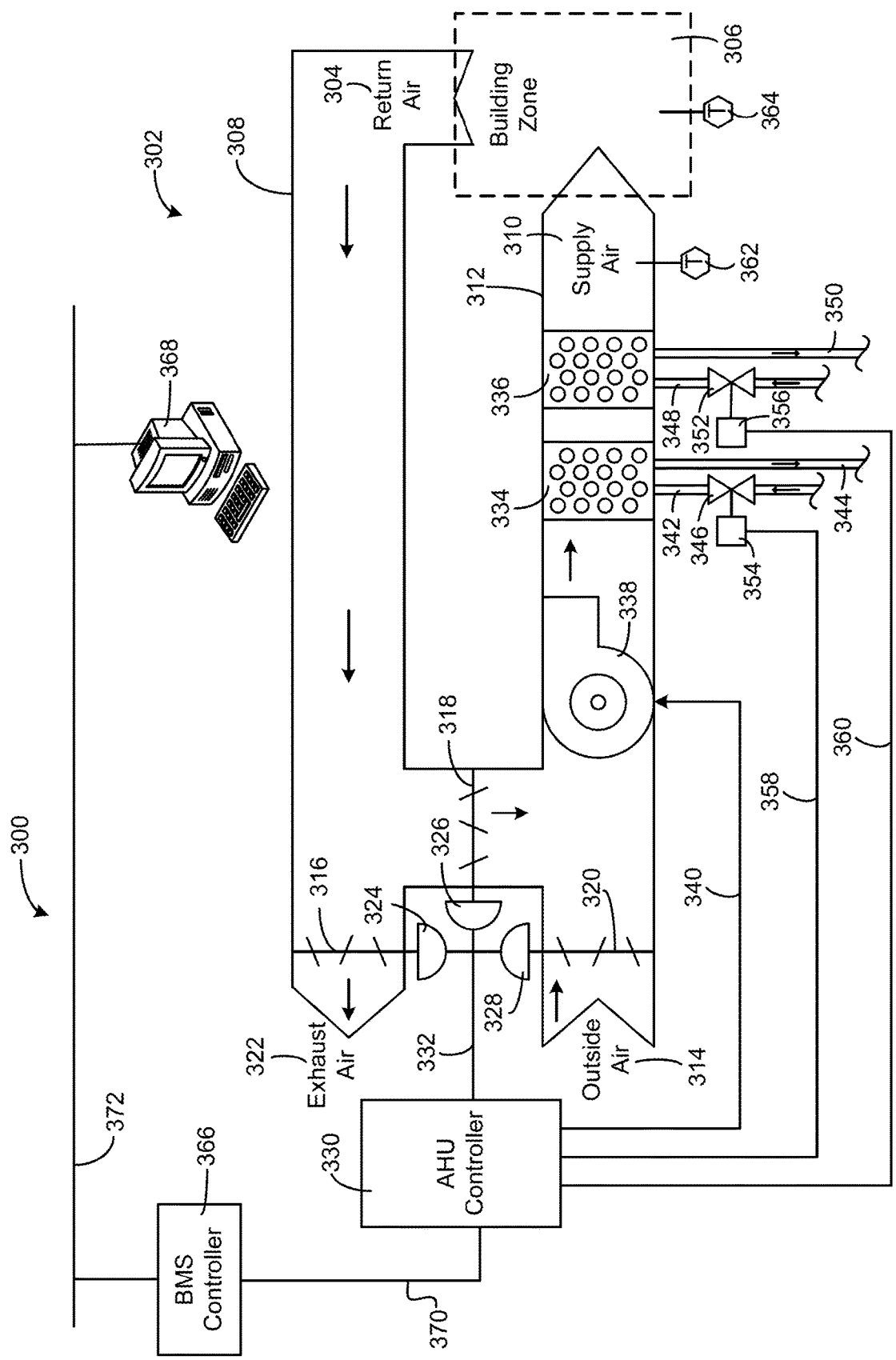
FIG. 3 is a block diagram of an airside system which can be implemented in the building of FIG. 1, according to some embodiments.

Referring now to FIG. 3, a block diagram of an airside system 300 is shown, according to some embodiments. In various embodiments, airside system 300 may supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, ducts 112-114, fans, dampers, etc.) and can be located in or around building 10. Airside system 300 may operate to heat or cool an airflow provided to building 10 using a heated or chilled fluid provided by central plant 200.

Airside system 300 is shown to include an economizer-type air handling unit (AHU) 302. Economizer-type AHUs vary the amount of outside air and return air used by the air handling unit for heating or cooling. For example, AHU 302 may receive return air 304 from building zone 306 via return air duct 308 and may deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 may communicate with an AHU controller 330 via a communications link 332. Actuators 324-328 may receive control signals from AHU controller 330 and may provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MW) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 may communicate with fan 338 via communications link 340 to control a flow rate of supply air 310. In some embodiments, AHU controller 330 controls an amount of heating or cooling applied to supply air 310 by modulating a speed of fan 338.

Cooling coil 334 may receive a chilled fluid from central plant 200 (e.g., from cold water loop 216) via piping 342 and may return the chilled fluid to central plant 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 may receive a heated fluid from central plant 200 (e.g., from hot water loop 214) via piping 348 and may return the heated fluid to central plant 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 may communicate with AHU controller 330 via communications links 358-360. Actuators 354-356 may receive control signals from AHU controller 330 and may provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 may also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU 330 may control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, central plant 200, HVAC system 100, and/or other controllable systems that serve building 10. BMS controller 366 may communicate with multiple downstream building systems or subsystems (e.g., HVAC system 100, a security system, a lighting system, central plant 200, etc.) via a communications link 370 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 may provide BMS controller 366 with temperature measurements from temperature sensors 362-364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 may communicate with BMS controller 366 and/or AHU controller 330 via communications link 372.

Asset Allocation System

Figure 4:
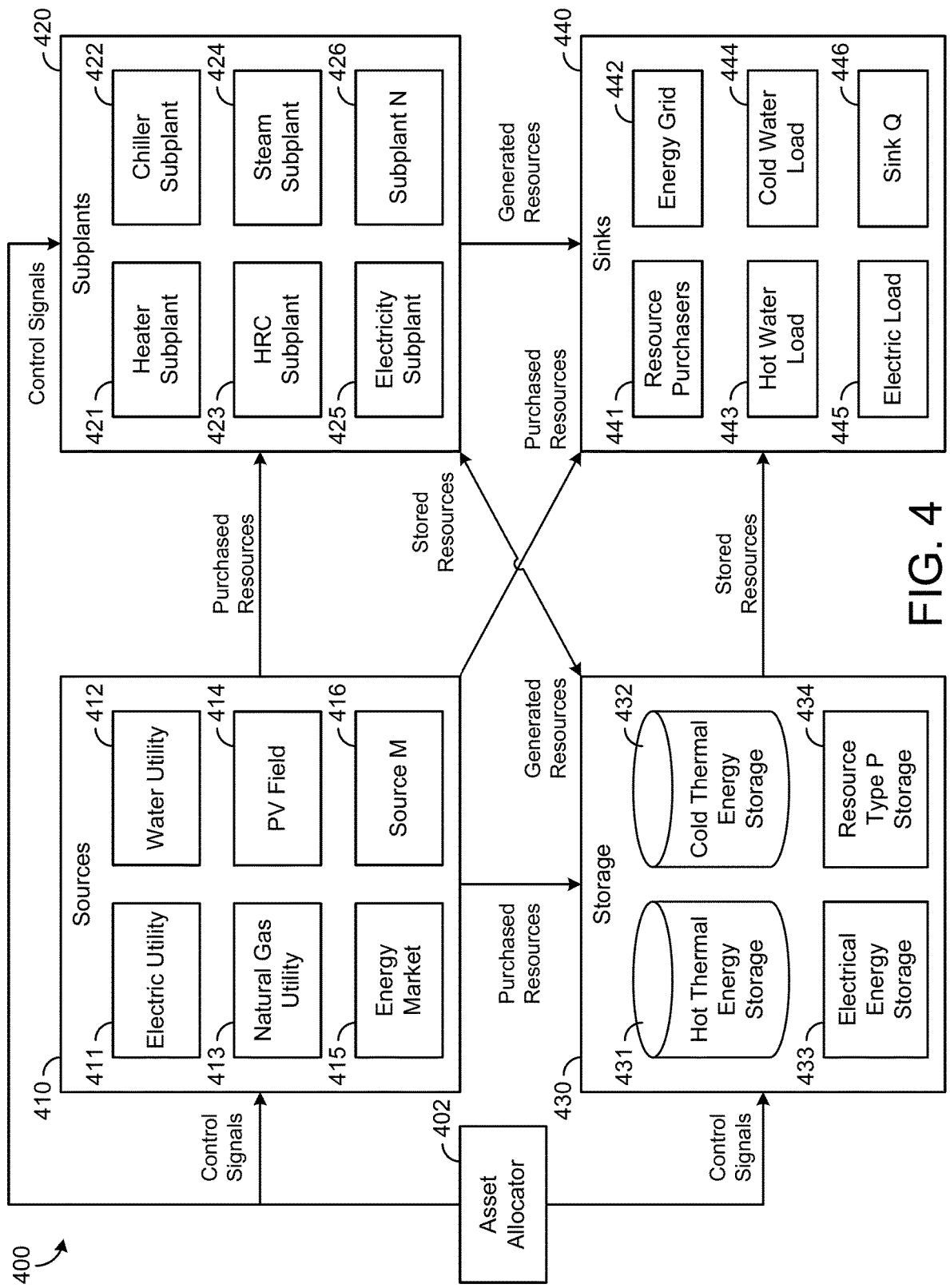
FIG. 4 is a block diagram of an asset allocation system including sources, subplants, storage, sinks, and an asset allocator configured to optimize the allocation of these assets, according to some embodiments.

Referring now to FIG. 4, a block diagram of an asset allocation system 400 is shown, according to an exemplary embodiment. Asset allocation system 400 can be configured to manage energy assets such as central plant equipment, battery storage, and other types of equipment configured to serve the energy loads of a building. Asset allocation system 400 can determine an optimal distribution of heating, cooling, electricity, and energy loads across different subplants (i.e., equipment groups) capable of producing that type of energy. In some embodiments, asset allocation system 400 is implemented as a component of central plant 200 and interacts with the equipment of central plant 200 in an online operational environment (e.g., performing real-time control of the central plant equipment). In other embodiments, asset allocation system 400 can be implemented as a component of a planning tool (described with reference to FIGS. 7-8) and can be configured to simulate the operation of a central plant over a predetermined time period for planning, budgeting, and/or design considerations.

Asset allocation system 400 is shown to include sources 410, subplants 420, storage 430, and sinks 440. These four categories of objects define the assets of a central plant and their interaction with the outside world. Sources 410 may include commodity markets or other suppliers from which resources such as electricity, water, natural gas, and other resources can be purchased or obtained. Sources 410 may provide resources that can be used by asset allocation system 400 to satisfy the demand of a building or campus. For example, sources 410 are shown to include an electric utility 411, a water utility 412, a natural gas utility 413, a photovoltaic (PV) field 414 (e.g., a collection of solar panels), an energy market 415, and source M 416, where M is the total number of sources 410. Resources purchased from sources 410 can be used by subplants 420 to produce generated resources (e.g., hot water, cold water, electricity, steam, etc.), stored in storage 430 for later use, or provided directly to sinks 440.

Subplants 420 are the main assets of a central plant. Subplants 420 are shown to include a heater subplant 421, a chiller subplant 422, a heat recovery chiller subplant 423, a steam subplant 424, an electricity subplant 425, and subplant N, where N is the total number of subplants 420. In some embodiments, subplants 420 include some or all of the subplants of central plant 200, as described with reference to FIG. 2. For example, subplants 420 can include heater subplant 202, heat recovery chiller subplant 204, chiller subplant 206, and/or cooling tower subplant 208.

Subplants 420 can be configured to convert resource types, making it possible to balance requested loads from the building or campus using resources purchased from sources 410. For example, heater subplant 421 may be configured to generate hot thermal energy (e.g., hot water) by heating water using electricity or natural gas. Chiller subplant 422 may be configured to generate cold thermal energy (e.g., cold water) by chilling water using electricity. Heat recovery chiller subplant 423 may be configured to generate hot thermal energy and cold thermal energy by removing heat from one water supply and adding the heat to another water supply. Steam subplant 424 may be configured to generate steam by boiling water using electricity or natural gas. Electricity subplant 425 may be configured to generate electricity using mechanical generators (e.g., a steam turbine, a gas-powered generator, etc.) or other types of electricity-generating equipment (e.g., photovoltaic equipment, hydroelectric equipment, etc.).

The input resources used by subplants 420 may be provided by sources 410, retrieved from storage 430, and/or generated by other subplants 420. For example, steam subplant 424 may produce steam as an output resource. Electricity subplant 425 may include a steam turbine that uses the steam generated by steam subplant 424 as an input resource to generate electricity. The output resources produced by subplants 420 may be stored in storage 430, provided to sinks 440, and/or used by other subplants 420. For example, the electricity generated by electricity subplant 425 may be stored in electrical energy storage 433, used by chiller subplant 422 to generate cold thermal energy, used to satisfy the electric load 445 of a building, or sold to resource purchasers 441.

Storage 430 can be configured to store energy or other types of resources for later use. Each type of storage within storage 430 may be configured to store a different type of resource. For example, storage 430 is shown to include hot thermal energy storage 431 (e.g., one or more hot water storage tanks), cold thermal energy storage 432 (e.g., one or more cold thermal energy storage tanks), electrical energy storage 433 (e.g., one or more batteries), and resource type P storage 434, where P is the total number of storage 430. In some embodiments, storage 430 include some or all of the storage of central plant 200, as described with reference to FIG. 2. In some embodiments, storage 430 includes the heat capacity of the building served by the central plant. The resources stored in storage 430 may be purchased directly from sources or generated by subplants 420.

In some embodiments, storage 430 is used by asset allocation system 400 to take advantage of price-based demand response (PBDR) programs. PBDR programs encourage consumers to reduce consumption when generation, transmission, and distribution costs are high. PBDR programs are typically implemented (e.g., by sources 410) in the form of energy prices that vary as a function of time. For example, some utilities may increase the price per unit of electricity during peak usage hours to encourage customers to reduce electricity consumption during peak times. Some utilities also charge consumers a separate demand charge based on the maximum rate of electricity consumption at any time during a predetermined demand charge period.

Advantageously, storing energy and other types of resources in storage 430 allows for the resources to be purchased at times when the resources are relatively less expensive (e.g., during non-peak electricity hours) and stored for use at times when the resources are relatively more expensive (e.g., during peak electricity hours). Storing resources in storage 430 also allows the resource demand of the building or campus to be shifted in time. For example, resources can be purchased from sources 410 at times when the demand for heating or cooling is low and immediately converted into hot or cold thermal energy by subplants 420. The thermal energy can be stored in storage 430 and retrieved at times when the demand for heating or cooling is high. This allows asset allocation system 400 to smooth the resource demand of the building or campus and reduces the maximum required capacity of subplants 420. Smoothing the demand also asset allocation system 400 to reduce the peak electricity consumption, which results in a lower demand charge.

In some embodiments, storage 430 is used by asset allocation system 400 to take advantage of incentive-based demand response (IBDR) programs. IBDR programs provide incentives to customers who have the capability to store energy, generate energy, or curtail energy usage upon request. Incentives are typically provided in the form of monetary revenue paid by sources 410 or by an independent service operator (ISO). IBDR programs supplement traditional utility-owned generation, transmission, and distribution assets with additional options for modifying demand load curves. For example, stored energy can be sold to resource purchasers 441 or an energy grid 442 to supplement the energy generated by sources 410. In some instances, incentives for participating in an IBDR program vary based on how quickly a system can respond to a request to change power output/consumption. Faster responses may be compensated at a higher level. Advantageously, electrical energy storage 433 allows system 400 to quickly respond to a request for electric power by rapidly discharging stored electrical energy to energy grid 442.

Sinks 440 may include the requested loads of a building or campus as well as other types of resource consumers. For example, sinks 440 are shown to include resource purchasers 441, an energy grid 442, a hot water load 443, a cold water load 444, an electric load 445, and sink Q, where Q is the total number of sinks 440. A building may consume various resources including, for example, hot thermal energy (e.g., hot water), cold thermal energy (e.g., cold water), and/or electrical energy. In some embodiments, the resources are consumed by equipment or subsystems within the building (e.g., HVAC equipment, lighting, computers and other electronics, etc.). The consumption of each sink 440 over the optimization period can be supplied as an input to asset allocation system 400 or predicted by asset allocation system 400. Sinks 440 can receive resources directly from sources 410, from subplants 420, and/or from storage 430.

Still referring to FIG. 4, asset allocation system 400 is shown to include an asset allocator 402. Asset allocator 402 may be configured to control the distribution, production, storage, and usage of resources in asset allocation system 400. In some embodiments, asset allocator 402 performs an optimization process determine an optimal set of control decisions for each time step within an optimization period. The control decisions may include, for example, an optimal amount of each resource to purchase from sources 410, an optimal amount of each resource to produce or convert using subplants 420, an optimal amount of each resource to store or remove from storage 430, an optimal amount of each resource to sell to resources purchasers 441 or energy grid 440, and/or an optimal amount of each resource to provide to other sinks 440. In some embodiments, the control decisions include an optimal amount of each input resource and output resource for each of subplants 420.

In some embodiments, asset allocator 402 is configured to optimally dispatch all campus energy assets in order to meet the requested heating, cooling, and electrical loads of the campus for each time step within an optimization horizon or optimization period of duration h. Instead of focusing on only the typical HVAC energy loads, the concept is extended to the concept of resource. Throughout this disclosure, the term "resource" is used to describe any type of commodity purchased from sources 410, used or produced by subplants 420, stored or discharged by storage 430, or consumed by sinks 440. For example, water may be considered a resource that is consumed by chillers, heaters, or cooling towers during operation. This general concept of a resource can be extended to chemical processing plants where one of the resources is the product that is being produced by the chemical processing plat.

Asset allocator 402 can be configured to operate the equipment of asset allocation system 400 to ensure that a resource balance is maintained at each time step of the optimization period. This resource balance is shown in the following equation:

$$\Sigma x_{time} = 0 \forall \text{resources}, \forall \text{time} \in \text{horizon}$$

where the sum is taken over all producers and consumers of a given resource (i.e., all of sources 410, subplants 420, storage 430, and sinks 440) and time is the time index. Each time element represents a period of time during which the resource productions, requests, purchases, etc. are assumed constant. Asset allocator 402 may ensure that this equation is satisfied for all resources regardless of whether that resource is required by the building or campus. For example, some of the resources produced by subplants 420 may be intermediate resources that function only as inputs to other subplants 420.

In some embodiments, the resources balanced by asset allocator 402 include multiple resources of the same type (e.g., multiple chilled water resources, multiple electricity resources, etc.). Defining multiple resources of the same type may allow asset allocator 402 to satisfy the resource balance given the physical constraints and connections of the central plant equipment. For example, suppose a central plant has multiple chillers and multiple cold water storage tanks, with each chiller physically connected to a different cold water storage tank (i.e., chiller A is connected to cold water storage tank A, chiller B is connected to cold water storage tank B, etc.). Given that only one chiller can supply cold water to each cold water storage tank, a different cold water resource can be defined for the output of each chiller. This allows asset allocator 402 to ensure that the resource balance is satisfied for each cold water resource without attempting to allocate resources in a way that is physically impossible (e.g., storing the output of chiller A in cold water storage tank B, etc.).

Asset allocator 402 may be configured to minimize the economic cost (or maximize the economic value) of operating asset allocation system 400 over the duration of the optimization period. The economic cost may be defined by a cost function J(x) that expresses economic cost as a function of the control decisions made by asset allocator 402. The cost function J(x) may account for the cost of resources purchased from sources 410, as well as the revenue generated by selling resources to resource purchasers 441 or energy grid 442 or participating in incentive programs. The cost optimization performed by asset allocator 402 can be expressed as:

$$\operatorname*{argmin}_{x} J(x)$$

where J(x) is defined as follows:

$$J(x) = \sum_{sources} \sum_{horizon} \text{cost}(purchase_{resource,time}, time) - \sum_{incentives} \sum_{horizon} \text{revenue}(ReservationAmount)$$

The first term in the cost function J(x) represents the total cost of all resources purchased over the optimization horizon. Resources can include, for example, water, electricity, natural gas, or other types of resources purchased from a utility or other source 410. The second term in the cost function J(x) represents the total revenue generated by participating in incentive programs (e.g., IBDR programs) over the optimization horizon. The revenue may be based on the amount of power reserved for participating in the incentive programs. Accordingly, the total cost function represents the total cost of resources purchased minus any revenue generated from participating in incentive programs.

Each of subplants 420 and storage 430 may include equipment that can be controlled by asset allocator 402 to optimize the performance of asset allocation system 400. Subplant equipment may include, for example, heating devices, chillers, heat recovery heat exchangers, cooling towers, energy storage devices, pumps, valves, and/or other devices of subplants 420 and storage 430. Individual devices of subplants 420 can be turned on or off to adjust the resource production of each subplant 420. In some embodiments, individual devices of subplants 420 can be operated at variable capacities (e.g., operating a chiller at 10% capacity or 60% capacity) according to an operating setpoint received from asset allocator 402. Asset allocator 402 can control the equipment of subplants 420 and storage 430 to adjust the amount of each resource purchased, consumed, and/or produced by system 400.

In some embodiments, asset allocator 402 minimizes the cost function while participating in PBDR programs, IBDR programs, or simultaneously in both PBDR and IBDR programs. For the IBDR programs, asset allocator 402 may use statistical estimates of past clearing prices, mileage ratios, and event probabilities to determine the revenue generation potential of selling stored energy to resource purchasers 441 or energy grid 442. For the PBDR programs, asset allocator 402 may use predictions of ambient conditions, facility thermal loads, and thermodynamic models of installed equipment to estimate the resource consumption of subplants 420. Asset allocator 402 may use predictions of the resource consumption to monetize the costs of running the equipment.

Asset allocator 402 may automatically determine (e.g., without human intervention) a combination of PBDR and/or IBDR programs in which to participate over the optimization horizon in order to maximize economic value. For example, asset allocator 402 may consider the revenue generation potential of IBDR programs, the cost reduction potential of PBDR programs, and the equipment maintenance/replacement costs that would result from participating in various combinations of the IBDR programs and PBDR programs. Asset allocator 402 may weigh the benefits of participation against the costs of participation to determine an optimal combination of programs in which to participate. Advantageously, this allows asset allocator 402 to determine an optimal set of control decisions that maximize the overall value of operating asset allocation system 400.

In some embodiments, asset allocator 402 optimizes the cost function J(x) subject to the following constraint, which guarantees the balance between resources purchased, produced, discharged, consumed, and requested over the optimization horizon:

$$\sum_{sources} purchase_{resource,time} +$$
$$\sum_{subplants} produces(x_{internal,time}, x_{external,time}, v_{uncontrolled,time}) -$$
$$\sum_{subplants} consumes(x_{internal,time}, x_{external,time}, v_{uncontrolled,time}) +$$
$$\sum_{storages} discharges_{resource}(x_{internal,time}, x_{external,time}) - \sum_{sinks} requests_{resource} =$$
$$0 \ \forall \ resources, \ \forall \ time \in horizon$$

where $x_{internal,time}$ includes internal decision variables (e.g., load allocated to each component of asset allocation system 400), $x_{external,time}$ includes external decision variables (e.g., condenser water return temperature or other shared variables across subplants 420), and $v_{uncontrolled,time}$ includes uncontrolled variables (e.g., weather conditions).

The first term in the previous equation represents the total amount of each resource (e.g., electricity, water, natural gas, etc.) purchased from each source 410 over the optimization horizon. The second and third terms represent the total production and consumption of each resource by subplants 420 over the optimization horizon. The fourth term represents the total amount of each resource discharged from storage 430 over the optimization horizon. Positive values indicate that the resource is discharged from storage 430, whereas negative values indicate that the resource is charged or stored. The fifth term represents the total amount of each resource requested by sinks 440 over the optimization horizon. Accordingly, this constraint ensures that the total amount of each resource purchased, produced, or discharged from storage 430 is equal to the amount of each resource consumed, stored, or provided to sinks 440.

In some embodiments, additional constraints exist on the regions in which subplants 420 can operate. Examples of such additional constraints include the acceptable space (i.e., the feasible region) for the decision variables given the uncontrolled conditions, the maximum amount of a resource that can be purchased from a given source 410, and any number of plant-specific constraints that result from the mechanical design of the plant. These additional constraints can be generated and imposed by operational domain module 904 (described in greater detail with reference to FIGS. 9 and 12).

Asset allocator 402 may include a variety of features that enable the application of asset allocator 402 to nearly any central plant, central energy facility, combined heating and cooling facility, or combined heat and power facility. These features include broadly applicable definitions for subplants 420, sinks 440, storage 430, and sources 410; multiples of the same type of subplant 420 or sink 440; subplant resource connections that describe which subplants 420 can send resources to which sinks 440 and at what efficiency; subplant minimum turndown into the asset allocation optimization; treating electrical energy as any other resource that must be balanced; constraints that can be commissioned during runtime; different levels of accuracy at different points in the horizon; setpoints (or other decisions) that are shared between multiple subplants included in the decision vector; disjoint subplant operation regions; incentive based electrical energy programs; and high level airside models. Incorporation of these features may allow asset allocator 402 to support a majority of the central energy facilities that will be seen in the future. Additionally, it will be possible to rapidly adapt to the inclusion of new subplant types. Some of these features are described in greater detail below.

Broadly applicable definitions for subplants 420, sinks 440, storage 430, and sources 410 allow each of these components to be described by the mapping from decision variables to resources consume and resources produced. Resources and other components of system 400 do not need to be "typed," but rather can be defined generally. The mapping from decision variables to resource consumption and production can change based on extrinsic conditions. Asset allocator 420 can solve the optimization problem by simply balancing resource use and can be configured to solve in terms of consumed resource 1, consumed resource 2, produced resource 1, etc., rather than electricity consumed, water consumed, and chilled water produced. Such an interface at the high level allows for the mappings to be injected into asset allocation system 400 rather than needing them hard coded. Of course, "typed" resources and other components of system 400 can still exist in order to generate the mapping at run time, based on equipment out of service.

Incorporating multiple subplants 420 or sinks 440 of the same type allows for modeling the interconnections between subplants 420, sources 410, storage 430, and sinks 440. This type of modeling describes which subplants 420 can use resource from which sources 410 and which subplants 420 can send resources to which sinks 440. This can be visualized as a resource connection matrix (i.e., a directed graph) between the subplants 420, sources 410, sinks 440, and storage 430. Examples of such directed graphs are described in greater detail with reference to FIGS. 5A-5B. Extending this concept, it is possible to include costs for delivering the resource along a connection and also, efficiencies of the transmission (e.g., amount of energy that makes it to the other side of the connection).

In some instances, constraints arise due to mechanical problems after an energy facility has been built. Accordingly, these constraints are site specific and are often not incorporated into the main code for any of subplants 420 or the high level problem itself. Commissioned constraints allow for such constraints to be added without software updates during the commissioning phase of the project. Furthermore, if these additional constraints are known prior to the plant build, they can be added to the design tool run. This would allow the user to determine the cost of making certain design decisions.

Incorporating minimum turndown and allowing disjoint operating regions may greatly enhance the accuracy of the asset allocation problem solution as well as decrease the number of modifications to solution of the asset allocation by the low level optimization or another post-processing technique. It may be beneficial to allow for certain features to change as a function of time into the horizon. One could use the full disjoint range (most accurate) for the first four hours, then switch to only incorporating the minimum turndown for the next two days, and finally using to the linear relaxation with no binary constraints for the rest of the horizon. For example, asset allocator 402 can be given the operational domain that correctly allocates three chillers with a range of 1800 to 2500 tons. The true subplant range is then the union of [1800, 2500], [3600, 5000], and [5400, 7500]. If the range were approximated as [1800, 7500] the low level optimization or other post-processing technique would have to rebalance any solution between 2500 and 3600 or between 5000 and 5400 tons. Rebalancing is typically done heuristically and is unlikely to be optimal. Incorporating these disjoint operational domains adds binary variables to the optimization problem (described in greater detail below).

Some decisions made by asset allocator 402 may be shared by multiple elements of system 400. The condenser water setpoint of cooling towers is an example. It is possible to assume that this variable is fixed and allow the low level optimization to decide on its value. However, this does not allow one to make a trade-off between the chiller's electrical use and the tower's electrical use, nor does it allow the optimization to exceed the chiller's design load by feeding it cooler condenser water. Incorporating these extrinsic decisions into asset allocator 402 allows for a more accurate solution at the cost of computational time.

Incentive programs often require the reservation of one or more assets for a period of time. In traditional systems, these assets are typically turned over to alternative control, different than the typical resource price based optimization. Advantageously, asset allocator 402 can be configured to add revenue to the cost function per amount of resource reserved. Asset allocator 402 can then make the reserved portion of the resource unavailable for typical price based cost optimization. For example, asset allocator 402 can reserve a portion of a battery asset for frequency response. In this case, the battery can be used to move the load or shave the peak demand, but can also be reserved to participate in the frequency response program.

Plant Resource Diagrams

Figure 5A:
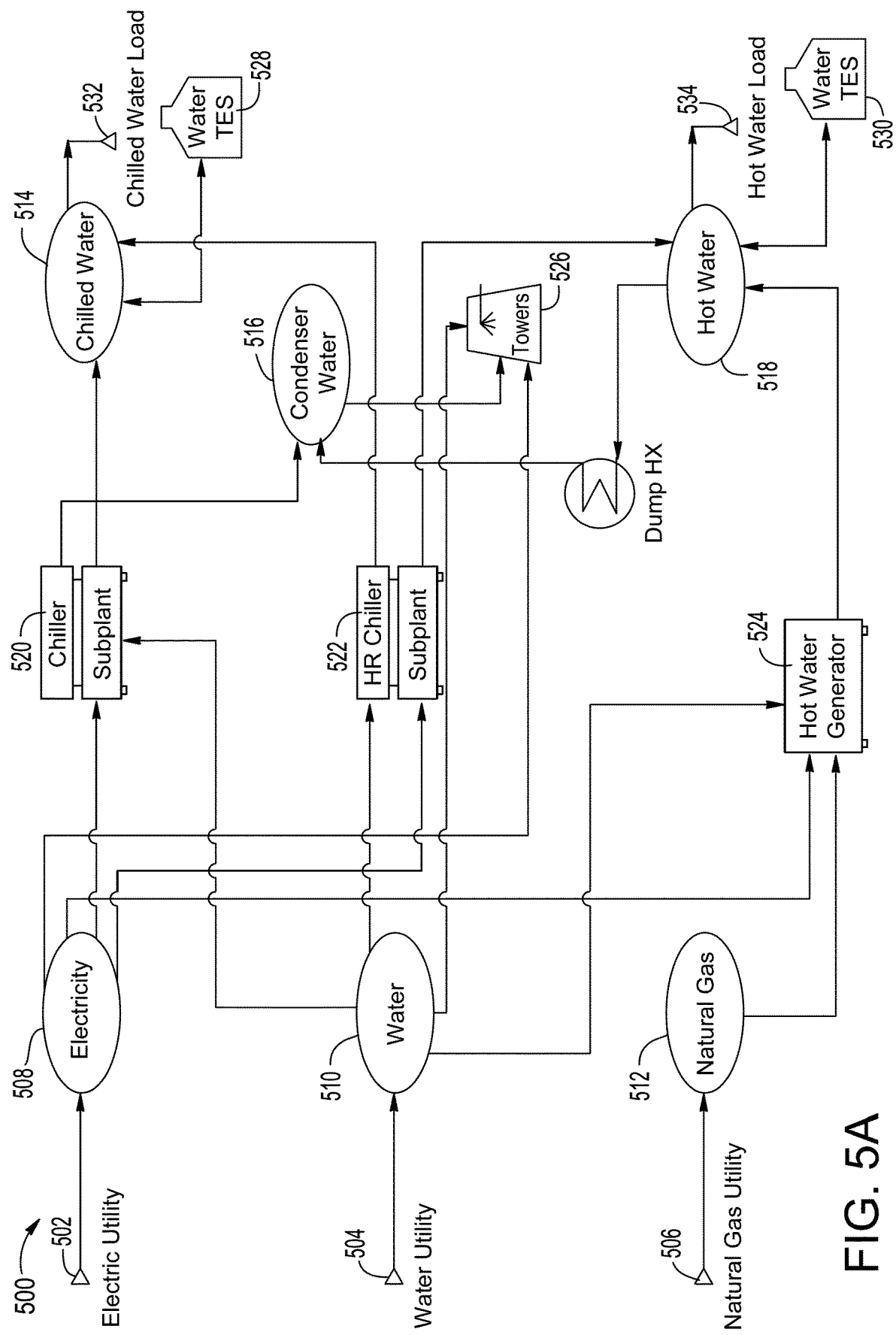
FIG. 5A is a plant resource diagram illustrating the elements of a central plant and the connections between such elements, according to some embodiments.

Referring now to FIG. 5A, a plant resource diagram 500 is shown, according to an exemplary embodiment. Plant resource diagram 500 represents a particular implementation of a central plant and indicates how the equipment of the central plant are connected to each other and to external systems or devices. Asset allocator 402 can use plant resource diagram 500 to identify the interconnections between various sources 410, subplants 420, storage 430, and sinks 440 in the central plant. In some instances, the interconnections defined by diagram 500 are not capable of being inferred based on the type of resource produced. For this reason, plant resource diagram 500 may provide asset allocator 402 with new information that can be used to establish constraints on the asset allocation problem.

Plant resource diagram 500 is shown to include an electric utility 502, a water utility 504, and a natural gas utility 506. Utilities 502-506 are examples of sources 410 that provide resources to the central plant. For example, electric utility 502 may provide an electricity resource 508, water utility 504 may provide a water resource 510, and natural gas utility 506 may provide a natural gas resource 512. The lines connecting utilities 502-506 to resources 508-512 along with the directions of the lines (i.e., pointing toward resources 508-512) indicate that resources purchased from utilities 502-506 add to resources 508-512.

Plant resource diagram 500 is shown to include a chiller subplant 520, a heat recovery (HR) chiller subplant 522, a hot water generator subplant 524, and a cooling tower subplant 526. Subplants 520-526 are examples of subplants 420 that convert resource types (i.e., convert input resources to output resources). For example, the lines connecting electricity resource 508 and water resource 510 to chiller subplant 520 indicate that chiller subplant 520 receives electricity resource 508 and water resource 510 as input resources. The lines connecting chiller subplant 520 to chilled water resource 514 and condenser water resource 516 indicate that chiller subplant 520 produces chilled water resource 514 and condenser water resource 516. Similarly, the lines connecting electricity resource 508 and water resource 510 to HR chiller subplant 522 indicate that HR chiller subplant 522 receives electricity resource 508 and water resource 510 as input resources. The lines connecting HR chiller subplant 522 to chilled water resource 514 and hot water resource 518 indicate that HR chiller subplant 522 produces chilled water resource 514 and hot water resource 518.

Plant resource diagram 500 is shown to include water TES 528 and 530. Water TES 528-530 are examples of storage 530 that can be used to store and discharge resources. The line connecting chilled water resource 514 to water TES 528 indicates that water TES 528 stores and discharges chilled water resource 514. Similarly, the line connecting hot water resource 518 to water TES 530 indicates that water TES 530 stores and discharges hot water resource 518. In diagram 500, water TES 528 is connected to only chilled water resource 514 and not to any of the other water resources 516 or 518. This indicates that water TES 528 can be used by asset allocator 402 to store and discharge only chilled water resource 514 and not the other water resources 516 or 518. Similarly, water TES 530 is connected to only hot water resource 518 and not to any of the other water resources 514 or 516. This indicates that water TES 530 can be used by asset allocator 402 to store and discharge only hot water resource 518 and not the other water resources 514 or 516.

Plant resource diagram 500 is shown to include a chilled water load 532 and a hot water load 534. Loads 532-534 are examples of sinks 440 that consume resources. The line connecting chilled water load 532 to chilled water resource 514 indicates that chilled water resource 514 can be used to satisfy chilled water load 532. Similarly, the line connecting hot water load 534 to hot water resource 518 indicates that hot water resource 518 can be used to satisfy hot water load 534. Asset allocator 402 can use the interconnections and limitations defined by plant resource diagram 500 to establish appropriate constraints on the optimization problem.

Figure 5B:
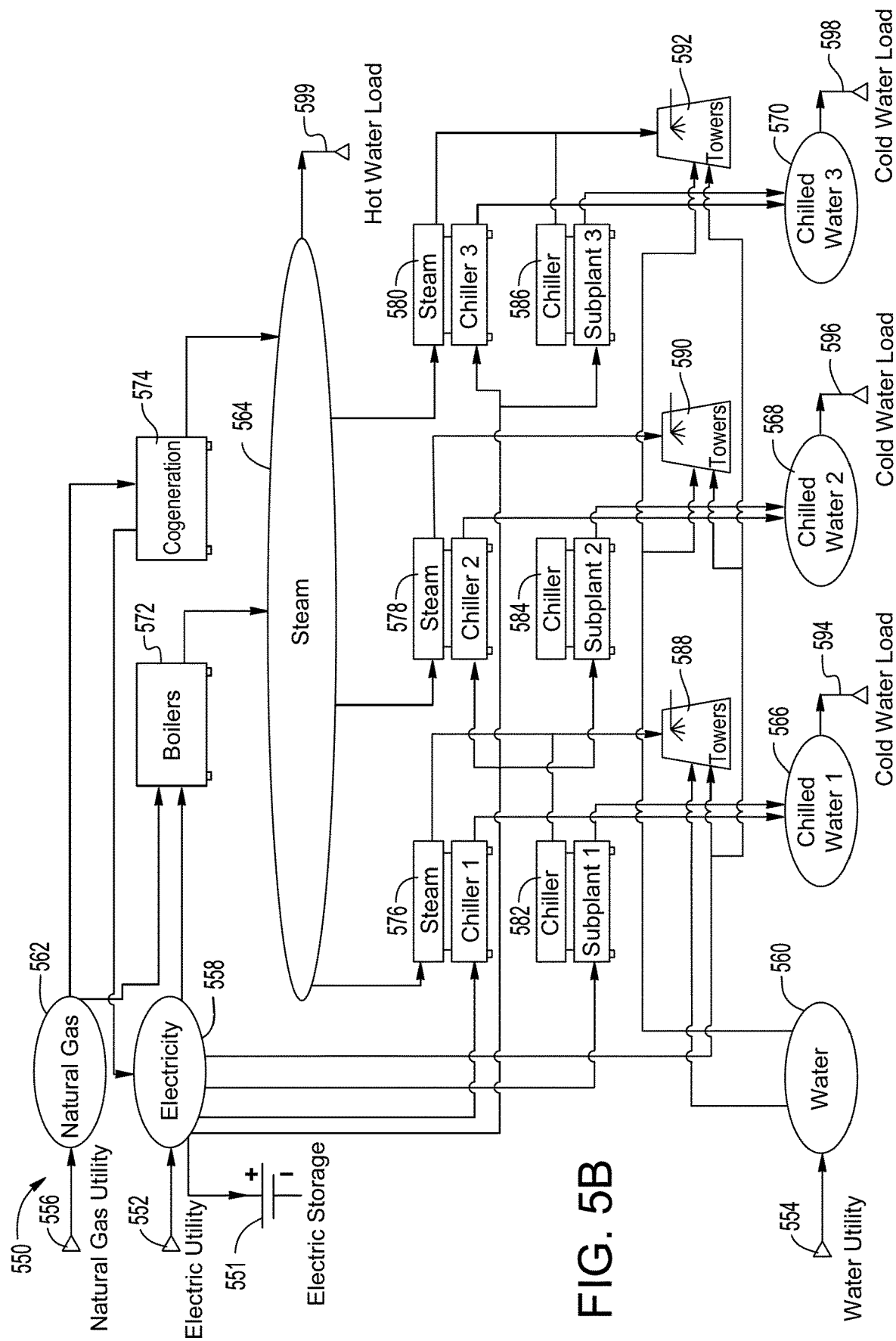
FIG. 5B is another plant resource diagram illustrating the elements of a central plant and the connections between such elements, according to some embodiments.

Referring now to FIG. 5B, another plant resource diagram 550 is shown, according to an exemplary embodiment. Plant resource diagram 550 represents another implementation of a central plant and indicates how the equipment of the central plant are connected to each other and to external systems or devices. Asset allocator 402 can use plant resource diagram 550 to identify the interconnections between various sources 410, subplants 420, storage 430, and sinks 440 in the central plant. In some instances, the interconnections defined by diagram 550 are not capable of being inferred based on the type of resource produced. For this reason, plant resource diagram 550 may provide asset allocator 402 with new information that can be used to establish constraints on the asset allocation problem.

Plant resource diagram 550 is shown to include an electric utility 552, a water utility 554, and a natural gas utility 556. Utilities 552-556 are examples of sources 410 that provide resources to the central plant. For example, electric utility 552 may provide an electricity resource 558, water utility 554 may provide a water resource 560, and natural gas utility 556 may provide a natural gas resource 562. The lines connecting utilities 552-556 to resources 558-562 along with the directions of the lines (i.e., pointing toward resources 558-562) indicate that resources purchased from utilities 552-556 add to resources 558-562. The line connecting electricity resource 558 to electrical storage 551 indicates that electrical storage 551 can store and discharge electricity resource 558.

Plant resource diagram 550 is shown to include a boiler subplant 572, a cogeneration subplant 574, several steam chiller subplants 576-580, several chiller subplants 582-586, and several cooling tower subplants 588-592. Subplants 572-592 are examples of subplants 420 that convert resource types (i.e., convert input resources to output resources). For example, the lines connecting boiler subplant 572 and cogeneration subplant 574 to natural gas resource 562, electricity resource 558, and steam resource 564 indicate that both boiler subplant 572 and cogeneration subplant 574 consume natural gas resource 562 and electricity resource 558 to produce steam resource 564.

The lines connecting steam resource 564 and electricity resource 558 to steam chiller subplants 576-580 indicate that each of steam chiller subplants 576-580 receives steam resource 564 and electricity resource 558 as input resources. However, each of steam chiller subplants 576-580 produces a different output resource. For example, steam chiller subplant 576 produces chilled water resource 566, steam chiller subplant 578 produces chilled water resource 568, and steam chiller subplant 580 produces chilled water resource 570. Similarly, the lines connecting electricity resource 558 to chiller subplants 582-586 indicate that each of chiller subplants 582-586 receives electricity resource 558 as an input. However, each of chiller subplants 582-586 produces a different output resource. For example, chiller subplant 582 produces chilled water resource 566, chiller subplant 584 produces chilled water resource 568, and chiller subplant 586 produces chilled water resource 570.

Chilled water resources 566-570 have the same general type (i.e., chilled water) but can be defined as separate resources by asset allocator 402. The lines connecting chilled water resources 566-570 to subplants 576-586 indicate which of subplants 576-586 can produce each chilled water resource 566-570. For example, plant resource diagram 550 indicates that chilled water resource 566 can only be produced by steam chiller subplant 576 and chiller subplant 582. Similarly, chilled water resource 568 can only be produced by steam chiller subplant 578 and chiller subplant 584, and chilled water resource 570 can only be produced by steam chiller subplant 580 and chiller subplant 586.

Plant resource diagram 550 is shown to include a hot water load 599 and several cold water loads 594-598. Loads 594-599 are examples of sinks 440 that consume resources. The line connecting hot water load 599 to steam resource 564 indicates that steam resource 564 can be used to satisfy hot water load 599. Similarly, the lines connecting chilled water resources 566-570 to cold water loads 594-598 indicate which of chilled water resources 566-570 can be used to satisfy each of cold water loads 594-598. For example, only chilled water resource 566 can be used to satisfy cold water load 594, only chilled water resource 568 can be used to satisfy cold water load 596, and only chilled water resource 570 can be used to satisfy cold water load 598. Asset allocator 402 can use the interconnections and limitations defined by plant resource diagram 550 to establish appropriate constraints on the optimization problem.

Central Plant Controller

Figure 6:
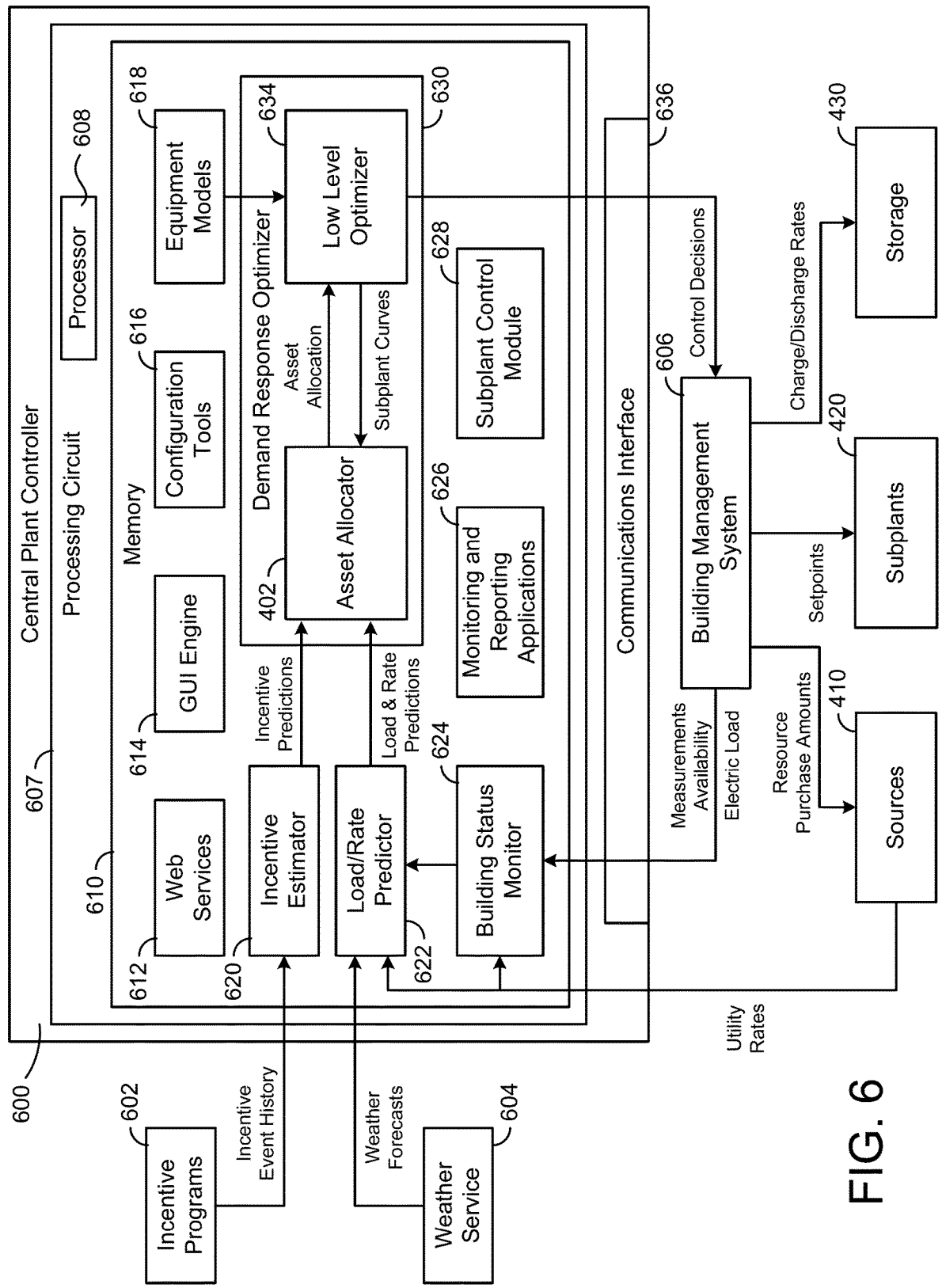
FIG. 6 is a block diagram of a central plant controller in which the asset allocator of FIG. 4 can be implemented, according to some embodiments.

Referring now to FIG. 6, a block diagram of a central plant controller 600 in which asset allocator 402 can be implemented is shown, according to an exemplary embodiment. In various embodiments, central plant controller 600 can be configured to monitor and control central plant 200, asset allocation system 400, and various components thereof (e.g., sources 410, subplants 420, storage 430, sinks 440, etc.). Central plant controller 600 is shown providing control decisions to a building management system (BMS) 606. The control decisions provided to BMS 606 may include resource purchase amounts for sources 410, setpoints for subplants 420, and/or charge/discharge rates for storage 430.

In some embodiments, BMS 606 is the same or similar to the BMS described with reference to FIG. 1. BMS 606 may be configured to monitor conditions within a controlled building or building zone. For example, BMS 606 may receive input from various sensors (e.g., temperature sensors, humidity sensors, airflow sensors, voltage sensors, etc.) distributed throughout the building and may report building conditions to central plant controller 600. Building conditions may include, for example, a temperature of the building or a zone of the building, a power consumption (e.g., electric load) of the building, a state of one or more actuators configured to affect a controlled state within the building, or other types of information relating to the controlled building. BMS 606 may operate subplants 420 and storage 430 to affect the monitored conditions within the building and to serve the thermal energy loads of the building.

BMS 606 may receive control signals from central plant controller 600 specifying on/off states, charge/discharge rates, and/or setpoints for the subplant equipment. BMS 606 may control the equipment (e.g., via actuators, power relays, etc.) in accordance with the control signals provided by central plant controller 600. For example, BMS 606 may operate the equipment using closed loop control to achieve the setpoints specified by central plant controller 600. In various embodiments, BMS 606 may be combined with central plant controller 600 or may be part of a separate building management system. According to an exemplary embodiment, BMS 606 is a METASYS® brand building management system, as sold by Johnson Controls, Inc.

Central plant controller 600 may monitor the status of the controlled building using information received from BMS 606. Central plant controller 600 may be configured to predict the thermal energy loads (e.g., heating loads, cooling loads, etc.) of the building for plurality of time steps in an optimization period (e.g., using weather forecasts from a weather service 604). Central plant controller 600 may also predict the revenue generation potential of incentive based demand response (IBDR) programs using an incentive event history (e.g., past clearing prices, mileage ratios, event probabilities, etc.) from incentive programs 602. Central plant controller 600 may generate control decisions that optimize the economic value of operating central plant 200 over the duration of the optimization period subject to constraints on the optimization process (e.g., energy balance constraints, load satisfaction constraints, etc.). The optimization process performed by central plant controller 600 is described in greater detail below.

In some embodiments, central plant controller 600 is integrated within a single computer (e.g., one server, one housing, etc.). In various other exemplary embodiments, central plant controller 600 can be distributed across multiple servers or computers (e.g., that can exist in distributed locations). In another exemplary embodiment, central plant controller 600 may integrated with a smart building manager that manages multiple building systems and/or combined with BMS 606.

Central plant controller 600 is shown to include a communications interface 636 and a processing circuit 607. Communications interface 636 may include wired or wireless interfaces (e.g., jacks, antennas, transmitters, receivers, transceivers, wire terminals, etc.) for conducting data communications with various systems, devices, or networks. For example, communications interface 636 may include an Ethernet card and port for sending and receiving data via an Ethernet-based communications network and/or a WiFi transceiver for communicating via a wireless communications network. Communications interface 636 may be configured to communicate via local area networks or wide area networks (e.g., the Internet, a building WAN, etc.) and may use a variety of communications protocols (e.g., BACnet, IP, LON, etc.).

Communications interface 636 may be a network interface configured to facilitate electronic data communications between central plant controller 600 and various external systems or devices (e.g., BMS 606, subplants 420, storage 430, sources 410, etc.). For example, central plant controller 600 may receive information from BMS 606 indicating one or more measured states of the controlled building (e.g., temperature, humidity, electric loads, etc.) and one or more states of subplants 420 and/or storage 430 (e.g., equipment status, power consumption, equipment availability, etc.). Communications interface 636 may receive inputs from BMS 606, subplants 420, and/or storage 430 and may provide operating parameters (e.g., on/off decisions, setpoints, etc.) to subplants 420 and storage 430 via BMS 606. The operating parameters may cause subplants 420 and storage 430 to activate, deactivate, or adjust a setpoint for various devices thereof.

Still referring to FIG. 6, processing circuit 607 is shown to include a processor 608 and memory 610. Processor 608 may be a general purpose or specific purpose processor, an application specific integrated circuit (ASIC), one or more field programmable gate arrays (FPGAs), a group of processing components, or other suitable processing components. Processor 608 may be configured to execute computer code or instructions stored in memory 610 or received from other computer readable media (e.g., CDROM, network storage, a remote server, etc.).

Memory 610 may include one or more devices (e.g., memory units, memory devices, storage devices, etc.) for storing data and/or computer code for completing and/or facilitating the various processes described in the present disclosure. Memory 610 may include random access memory (RAM), read-only memory (ROM), hard drive storage, temporary storage, non-volatile memory, flash memory, optical memory, or any other suitable memory for storing software objects and/or computer instructions. Memory 610 may include database components, object code components, script components, or any other type of information structure for supporting the various activities and information structures described in the present disclosure. Memory 610 may be communicably connected to processor 608 via processing circuit 607 and may include computer code for executing (e.g., by processor 608) one or more processes described herein.

Memory 610 is shown to include a building status monitor 624. Central plant controller 600 may receive data regarding the overall building or building space to be heated or cooled by system 400 via building status monitor 624. In an exemplary embodiment, building status monitor 624 may include a graphical user interface component configured to provide graphical user interfaces to a user for selecting building requirements (e.g., overall temperature parameters, selecting schedules for the building, selecting different temperature levels for different building zones, etc.).

Central plant controller 600 may determine on/off configurations and operating setpoints to satisfy the building requirements received from building status monitor 624. In some embodiments, building status monitor 624 receives, collects, stores, and/or transmits cooling load requirements, building temperature setpoints, occupancy data, weather data, energy data, schedule data, and other building parameters. In some embodiments, building status monitor 624 stores data regarding energy costs, such as pricing information available from sources 410 (energy charge, demand charge, etc.).

Still referring to FIG. 6, memory 610 is shown to include a load/rate predictor 622. Load/rate predictor 622 may be configured to predict the thermal energy loads ($\hat{\ell}_k$) of the building or campus for each time step k (e.g., k=1 . . . n) of an optimization period. Load/rate predictor 622 is shown receiving weather forecasts from a weather service 604. In some embodiments, load/rate predictor 622 predicts the thermal energy loads $\hat{\ell}_k$ as a function of the weather forecasts. In some embodiments, load/rate predictor 622 uses feedback from BMS 606 to predict loads $\hat{\ell}_k$. Feedback from BMS 606 may include various types of sensory inputs (e.g., temperature, flow, humidity, enthalpy, etc.) or other data relating to the controlled building (e.g., inputs from a HVAC system, a lighting control system, a security system, a water system, etc.).

In some embodiments, load/rate predictor 622 receives a measured electric load and/or previous measured load data from BMS 606 (e.g., via building status monitor 624). Load/rate predictor 622 may predict loads $\hat{\ell}_k$ as a function of a given weather forecast ($\hat{\phi}_w$), a day type (day), the time of day (t), and previous measured load data ($Y_{k-1}$). Such a relationship is expressed in the following equation:

$$\hat{\ell}_k = f(\hat{\phi}_w, \text{day}, t | Y_{k-1})$$

In some embodiments, load/rate predictor 622 uses a deterministic plus stochastic model trained from historical load data to predict loads $\hat{\ell}_k$. Load/rate predictor 622 may use any of a variety of prediction methods to predict loads $\hat{\ell}_k$ (e.g., linear regression for the deterministic portion and an AR model for the stochastic portion). Load/rate predictor 622 may predict one or more different types of loads for the building or campus. For example, load/rate predictor 622 may predict a hot water load $\hat{\ell}_{Hot,k}$ and a cold water load $\hat{\ell}_{Cold,k}$ for each time step k within the prediction window. In some embodiments, load/rate predictor 622 makes load/rate predictions using the techniques described in U.S. patent application Ser. No. 14/717,593 filed May 20, 2015, incorporated by reference herein in its entirety.

Load/rate predictor 622 is shown receiving utility rates from sources 410. Utility rates may indicate a cost or price per unit of a resource (e.g., electricity, natural gas, water, etc.) provided by sources 410 at each time step k in the prediction window. In some embodiments, the utility rates are time-variable rates. For example, the price of electricity may be higher at certain times of day or days of the week (e.g., during high demand periods) and lower at other times of day or days of the week (e.g., during low demand periods). The utility rates may define various time periods and a cost per unit of a resource during each time period. Utility rates may be actual rates received from sources 410 or predicted utility rates estimated by load/rate predictor 622.

In some embodiments, the utility rates include demand charges for one or more resources provided by sources 410. A demand charge may define a separate cost imposed by sources 410 based on the maximum usage of a particular resource (e.g., maximum energy consumption) during a demand charge period. The utility rates may define various demand charge periods and one or more demand charges associated with each demand charge period. In some instances, demand charge periods may overlap partially or completely with each other and/or with the prediction window. Advantageously, demand response optimizer 630 may be configured to account for demand charges in the high level optimization process performed by asset allocator 402. Sources 410 may be defined by time-variable (e.g., hourly) prices, a maximum service level (e.g., a maximum rate of consumption allowed by the physical infrastructure or by contract) and, in the case of electricity, a demand charge or a charge for the peak rate of consumption within a certain period. Load/rate predictor 622 may store the predicted load $\hat{\ell}_k$ and the utility rates in memory 610 and/or provide the predicted loads $\hat{\ell}_k$ and the utility rates to demand response optimizer 630.

Still referring to FIG. 6, memory 610 is shown to include an incentive estimator 620. Incentive estimator 620 may be configured to estimate the revenue generation potential of participating in various incentive-based demand response (IBDR) programs. In some embodiments, incentive estimator 620 receives an incentive event history from incentive programs 602. The incentive event history may include a history of past IBDR events from incentive programs 602. An IBDR event may include an invitation from incentive programs 602 to participate in an IBDR program in exchange for a monetary incentive. The incentive event history may indicate the times at which the past IBDR events occurred and attributes describing the IBDR events (e.g., clearing prices, mileage ratios, participation requirements, etc.). Incentive estimator 620 may use the incentive event history to estimate IBDR event probabilities during the optimization period.

Incentive estimator 620 is shown providing incentive predictions to demand response optimizer 630. The incentive predictions may include the estimated IBDR probabilities, estimated participation requirements, an estimated amount of revenue from participating in the estimated IBDR events, and/or any other attributes of the predicted IBDR events. Demand response optimizer 630 may use the incentive predictions along with the predicted loads $\hat{\ell}_k$ and utility rates from load/rate predictor 622 to determine an optimal set of control decisions for each time step within the optimization period.

Still referring to FIG. 6, memory 610 is shown to include a demand response optimizer 630. Demand response optimizer 630 may perform a cascaded optimization process to optimize the performance of asset allocation system 400. For example, demand response optimizer 630 is shown to include asset allocator 402 and a low level optimizer 634. Asset allocator 402 may control an outer (e.g., subplant level) loop of the cascaded optimization. Asset allocator 402 may determine an optimal set of control decisions for each time step in the prediction window in order to optimize (e.g., maximize) the value of operating asset allocation system 400. Control decisions made by asset allocator 402 may include, for example, load setpoints for each of subplants 420, charge/discharge rates for each of storage 430, resource purchase amounts for each type of resource purchased from sources 410, and/or an amount of each resource sold to energy purchasers 504. In other words, the control decisions may define resource allocation at each time step. The control decisions made by asset allocator 402 are based on the statistical estimates of incentive event probabilities and revenue generation potential for various IBDR events as well as the load and rate predictions.

Low level optimizer 634 may control an inner (e.g., equipment level) loop of the cascaded optimization. Low level optimizer 634 may determine how to best run each subplant at the load setpoint determined by asset allocator 402. For example, low level optimizer 634 may determine on/off states and/or operating setpoints for various devices of the subplant equipment in order to optimize (e.g., minimize) the energy consumption of each subplant while meeting the resource allocation setpoint for the subplant. In some embodiments, low level optimizer 634 receives actual incentive events from incentive programs 602. Low level optimizer 634 may determine whether to participate in the incentive events based on the resource allocation set by asset allocator 402. For example, if insufficient resources have been allocated to a particular IBDR program by asset allocator 402 or if the allocated resources have already been used, low level optimizer 634 may determine that asset allocation system 400 will not participate in the IBDR program and may ignore the IBDR event. However, if the required resources have been allocated to the IBDR program and are available in storage 430, low level optimizer 634 may determine that system 400 will participate in the IBDR program in response to the IBDR event. The cascaded optimization process performed by demand response optimizer 630 is described in greater detail in U.S. patent application Ser. No. 15/247,885 filed Aug. 25, 2016, which is incorporated by reference herein in its entirety.

In some embodiments, low level optimizer 634 generates and provides subplant curves to asset allocator 402. Each subplant curve may indicate an amount of resource consumption by a particular subplant (e.g., electricity use measured in kW, water use measured in L/s, etc.) as a function of the subplant load. In some embodiments, low level optimizer 634 generates the subplant curves by running the low level optimization process for various combinations of subplant loads and weather conditions to generate multiple data points. Low level optimizer 634 may fit a curve to the data points to generate the subplant curves. In other embodiments, low level optimizer 634 provides the data points asset allocator 402 and asset allocator 402 generates the subplant curves using the data points. Asset allocator 402 may store the subplant curves in memory for use in the high level (i.e., asset allocation) optimization process.

Figure 13:
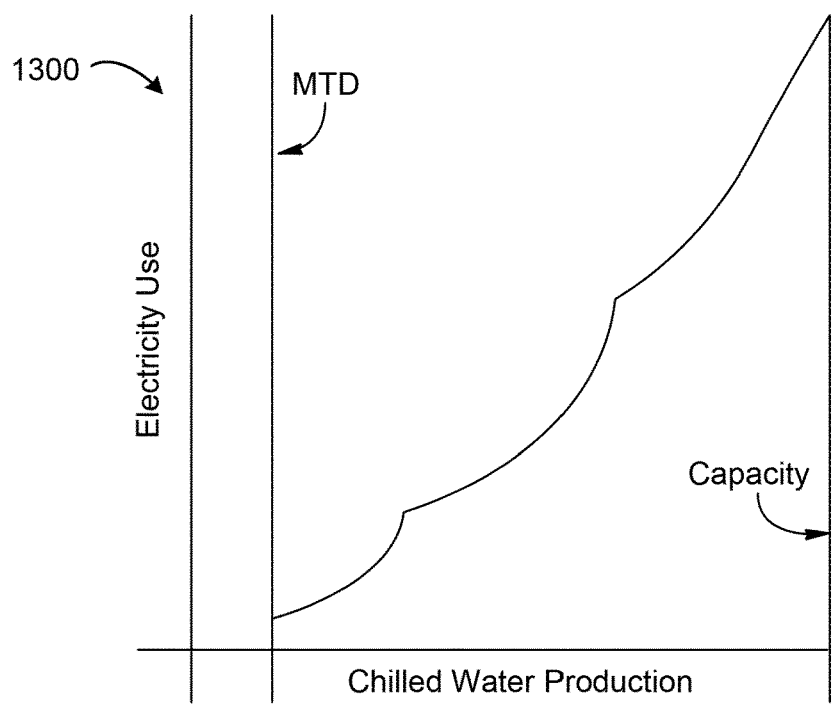
FIG. 13 is a graph of a subplant curve for a chiller subplant illustrating a relationship between chilled water production and electricity use, according to some embodiments.

In some embodiments, the subplant curves are generated by combining efficiency curves for individual devices of a subplant. A device efficiency curve may indicate the amount of resource consumption by the device as a function of load. The device efficiency curves may be provided by a device manufacturer or generated using experimental data. In some embodiments, the device efficiency curves are based on an initial efficiency curve provided by a device manufacturer and updated using experimental data. The device efficiency curves may be stored in equipment models 618. For some devices, the device efficiency curves may indicate that resource consumption is a U-shaped function of load. Accordingly, when multiple device efficiency curves are combined into a subplant curve for the entire subplant, the resultant subplant curve may be a wavy curve. The waves are caused by a single device loading up before it is more efficient to turn on another device to satisfy the subplant load. An example of such a subplant curve is shown in FIG. 13.

Still referring to FIG. 6, memory 610 is shown to include a subplant control module 628. Subplant control module 628 may store historical data regarding past operating statuses, past operating setpoints, and instructions for calculating and/or implementing control parameters for subplants 420 and storage 430. Subplant control module 628 may also receive, store, and/or transmit data regarding the conditions of individual devices of the subplant equipment, such as operating efficiency, equipment degradation, a date since last service, a lifespan parameter, a condition grade, or other device-specific data. Subplant control module 628 may receive data from subplants 420, storage 430, and/or BMS 606 via communications interface 636. Subplant control module 628 may also receive and store on/off statuses and operating setpoints from low level optimizer 634.

Data and processing results from demand response optimizer 630, subplant control module 628, or other modules of central plant controller 600 may be accessed by (or pushed to) monitoring and reporting applications 626. Monitoring and reporting applications 626 may be configured to generate real time "system health" dashboards that can be viewed and navigated by a user (e.g., a system engineer). For example, monitoring and reporting applications 626 may include a web-based monitoring application with several graphical user interface (GUI) elements (e.g., widgets, dashboard controls, windows, etc.) for displaying key performance indicators (KPI) or other information to users of a GUI. In addition, the GUI elements may summarize relative energy use and intensity across energy storage systems in different buildings (real or modeled), different campuses, or the like. Other GUI elements or reports may be generated and shown based on available data that allow users to assess performance across one or more energy storage systems from one screen. The user interface or report (or underlying data engine) may be configured to aggregate and categorize operating conditions by building, building type, equipment type, and the like. The GUI elements may include charts or histograms that allow the user to visually analyze the operating parameters and power consumption for the devices of the energy storage system.

Still referring to FIG. 6, central plant controller 600 may include one or more GUI servers, web services 612, or GUI engines 614 to support monitoring and reporting applications 626. In various embodiments, applications 626, web services 612, and GUI engine 614 may be provided as separate components outside of central plant controller 600 (e.g., as part of a smart building manager). Central plant controller 600 may be configured to maintain detailed historical databases (e.g., relational databases, XML databases, etc.) of relevant data and includes computer code modules that continuously, frequently, or infrequently query, aggregate, transform, search, or otherwise process the data maintained in the detailed databases. Central plant controller 600 may be configured to provide the results of any such processing to other databases, tables, XML files, or other data structures for further querying, calculation, or access by, for example, external monitoring and reporting applications.

Central plant controller 600 is shown to include configuration tools 616. Configuration tools 616 can allow a user to define (e.g., via graphical user interfaces, via prompt-driven "wizards," etc.) how central plant controller 600 should react to changing conditions in the energy storage subsystems. In an exemplary embodiment, configuration tools 616 allow a user to build and store condition-response scenarios that can cross multiple energy storage system devices, multiple building systems, and multiple enterprise control applications (e.g., work order management system applications, entity resource planning applications, etc.). For example, configuration tools 616 can provide the user with the ability to combine data (e.g., from subsystems, from event histories) using a variety of conditional logic. In varying exemplary embodiments, the conditional logic can range from simple logical operators between conditions (e.g., AND, OR, XOR, etc.) to pseudo-code constructs or complex programming language functions (allowing for more complex interactions, conditional statements, loops, etc.). Configuration tools 616 can present user interfaces for building such conditional logic. The user interfaces may allow users to define policies and responses graphically. In some embodiments, the user interfaces may allow a user to select a pre-stored or pre-constructed policy and adapt it or enable it for use with their system.

Planning Tool

Figure 7:
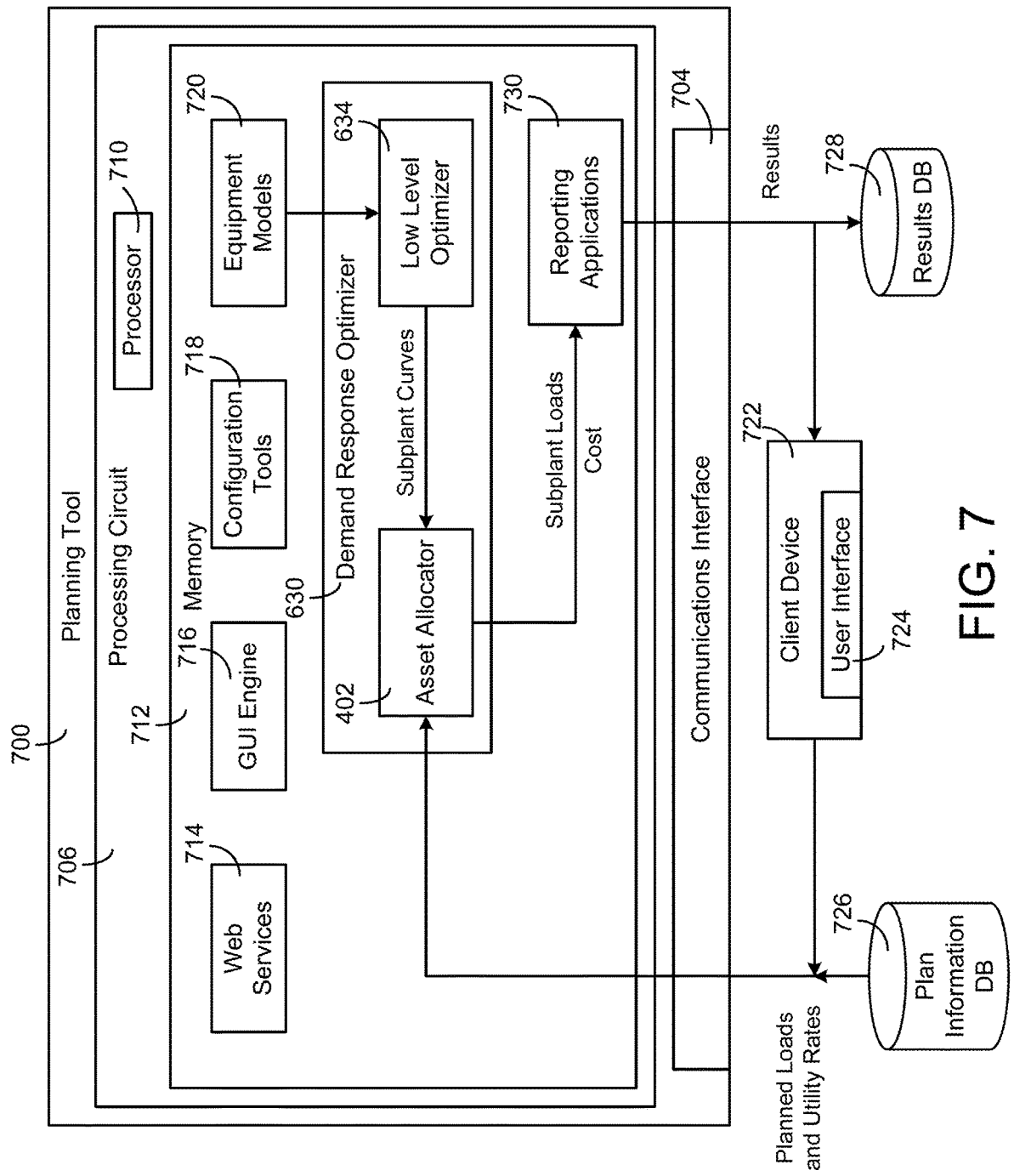
FIG. 7 is a block diagram of a planning tool in which the asset allocator of FIG. 4 can be implemented, according to some embodiments.

Referring now to FIG. 7, a block diagram of a planning tool 700 in which asset allocator 402 can be implemented is shown, according to an exemplary embodiment. Planning tool 700 may be configured to use demand response optimizer 630 to simulate the operation of a central plant over a predetermined time period (e.g., a day, a month, a week, a year, etc.) for planning, budgeting, and/or design considerations. When implemented in planning tool 700, demand response optimizer 630 may operate in a similar manner as described with reference to FIG. 6. For example, demand response optimizer 630 may use building loads and utility rates to determine an optimal resource allocation to minimize cost over a simulation period. However, planning tool 700 may not be responsible for real-time control of a building management system or central plant.

Planning tool 700 can be configured to determine the benefits of investing in a battery asset and the financial metrics associated with the investment. Such financial metrics can include, for example, the internal rate of return (IRR), net present value (NPV), and/or simple payback period (SPP). Planning tool 700 can also assist a user in determining the size of the battery which yields optimal financial metrics such as maximum NPV or a minimum SPP. In some embodiments, planning tool 700 allows a user to specify a battery size and automatically determines the benefits of the battery asset from participating in selected IBDR programs while performing PBDR. In some embodiments, planning tool 700 is configured to determine the battery size that minimizes SPP given the IBDR programs selected and the requirement of performing PBDR. In some embodiments, planning tool 700 is configured to determine the battery size that maximizes NPV given the IBDR programs selected and the requirement of performing PBDR.

In planning tool 700, asset allocator 402 may receive planned loads and utility rates for the entire simulation period. The planned loads and utility rates may be defined by input received from a user via a client device 722 (e.g., user-defined, user selected, etc.) and/or retrieved from a plan information database 726. Asset allocator 402 uses the planned loads and utility rates in conjunction with subplant curves from low level optimizer 634 to determine an optimal resource allocation (i.e., an optimal dispatch schedule) for a portion of the simulation period.

The portion of the simulation period over which asset allocator 402 optimizes the resource allocation may be defined by a prediction window ending at a time horizon. With each iteration of the optimization, the prediction window is shifted forward and the portion of the dispatch schedule no longer in the prediction window is accepted (e.g., stored or output as results of the simulation). Load and rate predictions may be predefined for the entire simulation and may not be subject to adjustments in each iteration. However, shifting the prediction window forward in time may introduce additional plan information (e.g., planned loads and/or utility rates) for the newly-added time slice at the end of the prediction window. The new plan information may not have a significant effect on the optimal dispatch schedule since only a small portion of the prediction window changes with each iteration.

In some embodiments, asset allocator 402 requests all of the subplant curves used in the simulation from low level optimizer 634 at the beginning of the simulation. Since the planned loads and environmental conditions are known for the entire simulation period, asset allocator 402 may retrieve all of the relevant subplant curves at the beginning of the simulation. In some embodiments, low level optimizer 634 generates functions that map subplant production to equipment level production and resource use when the subplant curves are provided to asset allocator 402. These subplant to equipment functions may be used to calculate the individual equipment production and resource use (e.g., in a post-processing module) based on the results of the simulation.

Still referring to FIG. 7, planning tool 700 is shown to include a communications interface 704 and a processing circuit 706. Communications interface 704 may include wired or wireless interfaces (e.g., jacks, antennas, transmitters, receivers, transceivers, wire terminals, etc.) for conducting data communications with various systems, devices, or networks. For example, communications interface 704 may include an Ethernet card and port for sending and receiving data via an Ethernet-based communications network and/or a WiFi transceiver for communicating via a wireless communications network. Communications interface 704 may be configured to communicate via local area networks or wide area networks (e.g., the Internet, a building WAN, etc.) and may use a variety of communications protocols (e.g., BACnet, IP, LON, etc.).

Communications interface 704 may be a network interface configured to facilitate electronic data communications between planning tool 700 and various external systems or devices (e.g., client device 722, results database 728, plan information database 726, etc.). For example, planning tool 700 may receive planned loads and utility rates from client device 722 and/or plan information database 726 via communications interface 704. Planning tool 700 may use communications interface 704 to output results of the simulation to client device 722 and/or to store the results in results database 728.

Still referring to FIG. 7, processing circuit 706 is shown to include a processor 710 and memory 712. Processor 710 may be a general purpose or specific purpose processor, an application specific integrated circuit (ASIC), one or more field programmable gate arrays (FPGAs), a group of processing components, or other suitable processing components. Processor 710 may be configured to execute computer code or instructions stored in memory 712 or received from other computer readable media (e.g., CDROM, network storage, a remote server, etc.).

Memory 712 may include one or more devices (e.g., memory units, memory devices, storage devices, etc.) for storing data and/or computer code for completing and/or facilitating the various processes described in the present disclosure. Memory 712 may include random access memory (RAM), read-only memory (ROM), hard drive storage, temporary storage, non-volatile memory, flash memory, optical memory, or any other suitable memory for storing software objects and/or computer instructions. Memory 712 may include database components, object code components, script components, or any other type of information structure for supporting the various activities and information structures described in the present disclosure. Memory 712 may be communicably connected to processor 710 via processing circuit 706 and may include computer code for executing (e.g., by processor 710) one or more processes described herein.

Still referring to FIG. 7, memory 712 is shown to include a GUI engine 716, web services 714, and configuration tools 718. In an exemplary embodiment, GUI engine 716 includes a graphical user interface component configured to provide graphical user interfaces to a user for selecting or defining plan information for the simulation (e.g., planned loads, utility rates, environmental conditions, etc.). Web services 714 may allow a user to interact with planning tool 700 via a web portal and/or from a remote system or device (e.g., an enterprise control application).

Configuration tools 718 can allow a user to define (e.g., via graphical user interfaces, via prompt-driven "wizards," etc.) various parameters of the simulation such as the number and type of subplants, the devices within each subplant, the subplant curves, device-specific efficiency curves, the duration of the simulation, the duration of the prediction window, the duration of each time step, and/or various other types of plan information related to the simulation. Configuration tools 718 can present user interfaces for building the simulation. The user interfaces may allow users to define simulation parameters graphically. In some embodiments, the user interfaces allow a user to select a pre-stored or pre-constructed simulated plant and/or plan information (e.g., from plan information database 726) and adapt it or enable it for use in the simulation.

Still referring to FIG. 7, memory 712 is shown to include demand response optimizer 630. Demand response optimizer 630 may use the planned loads and utility rates to determine an optimal resource allocation over a prediction window. The operation of demand response optimizer 630 may be the same or similar as previously described with reference to FIG. 6. With each iteration of the optimization process, demand response optimizer 630 may shift the prediction window forward and apply the optimal resource allocation for the portion of the simulation period no longer in the prediction window. Demand response optimizer 630 may use the new plan information at the end of the prediction window to perform the next iteration of the optimization process. Demand response optimizer 630 may output the applied resource allocation to reporting applications 730 for presentation to a client device 722 (e.g., via user interface 724) or storage in results database 728.

Still referring to FIG. 7, memory 712 is shown to include reporting applications 730. Reporting applications 730 may receive the optimized resource allocations from demand response optimizer 630 and, in some embodiments, costs associated with the optimized resource allocations. Reporting applications 730 may include a web-based reporting application with several graphical user interface (GUI) elements (e.g., widgets, dashboard controls, windows, etc.) for displaying key performance indicators (KPI) or other information to users of a GUI. In addition, the GUI elements may summarize relative energy use and intensity across various plants, subplants, or the like. Other GUI elements or reports may be generated and shown based on available data that allow users to assess the results of the simulation. The user interface or report (or underlying data engine) may be configured to aggregate and categorize resource allocation and the costs associated therewith and provide the results to a user via a GUI. The GUI elements may include charts or histograms that allow the user to visually analyze the results of the simulation. An exemplary output that may be generated by reporting applications 730 is shown in FIG. 8.

Figure 8:
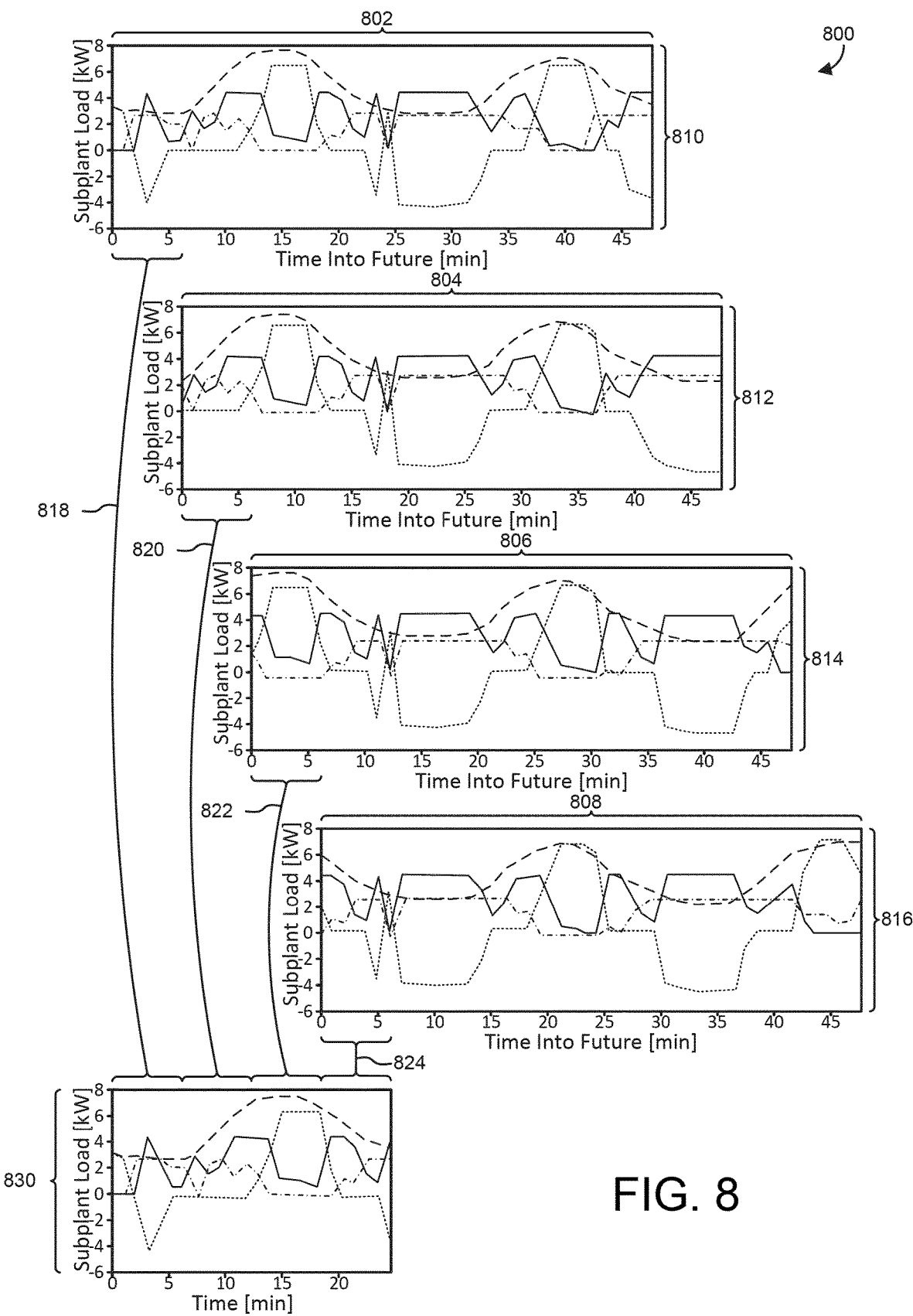
FIG. 8 is a flow diagram illustrating an optimization process which can be performed by the planning tool of FIG. 7, according to some embodiments.

Referring now to FIG. 8, several graphs 800 illustrating the operation of planning tool 700 are shown, according to an exemplary embodiment. With each iteration of the optimization process, planning tool 700 selects an optimization period (i.e., a portion of the simulation period) over which the optimization is performed. For example, planning tool 700 may select optimization period 802 for use in the first iteration. Once the optimal resource allocation 810 has been determined, planning tool 700 may select a portion 818 of resource allocation 810 to send to plant dispatch 830. Portion 818 may be the first b time steps of resource allocation 810. Planning tool 700 may shift the optimization period 802 forward in time, resulting in optimization period 804. The amount by which the prediction window is shifted may correspond to the duration of time steps b.

Planning tool 700 may repeat the optimization process for optimization period 804 to determine the optimal resource allocation 812. Planning tool 700 may select a portion 820 of resource allocation 812 to send to plant dispatch 830. Portion 820 may be the first b time steps of resource allocation 812. Planning tool 700 may then shift the prediction window forward in time, resulting in optimization period 806. This process may be repeated for each subsequent optimization period (e.g., optimization periods 806, 808, etc.) to generate updated resource allocations (e.g., resource allocations 814, 816, etc.) and to select portions of each resource allocation (e.g., portions 822, 824) to send to plant dispatch 830. Plant dispatch 830 includes the first b time steps 818-824 from each of optimization periods 802-808. Once the optimal resource allocation is compiled for the entire simulation period, the results may be sent to reporting applications 730, results database 728, and/or client device 722, as described with reference to FIG. 7.

Asset Allocator

Figure 9:
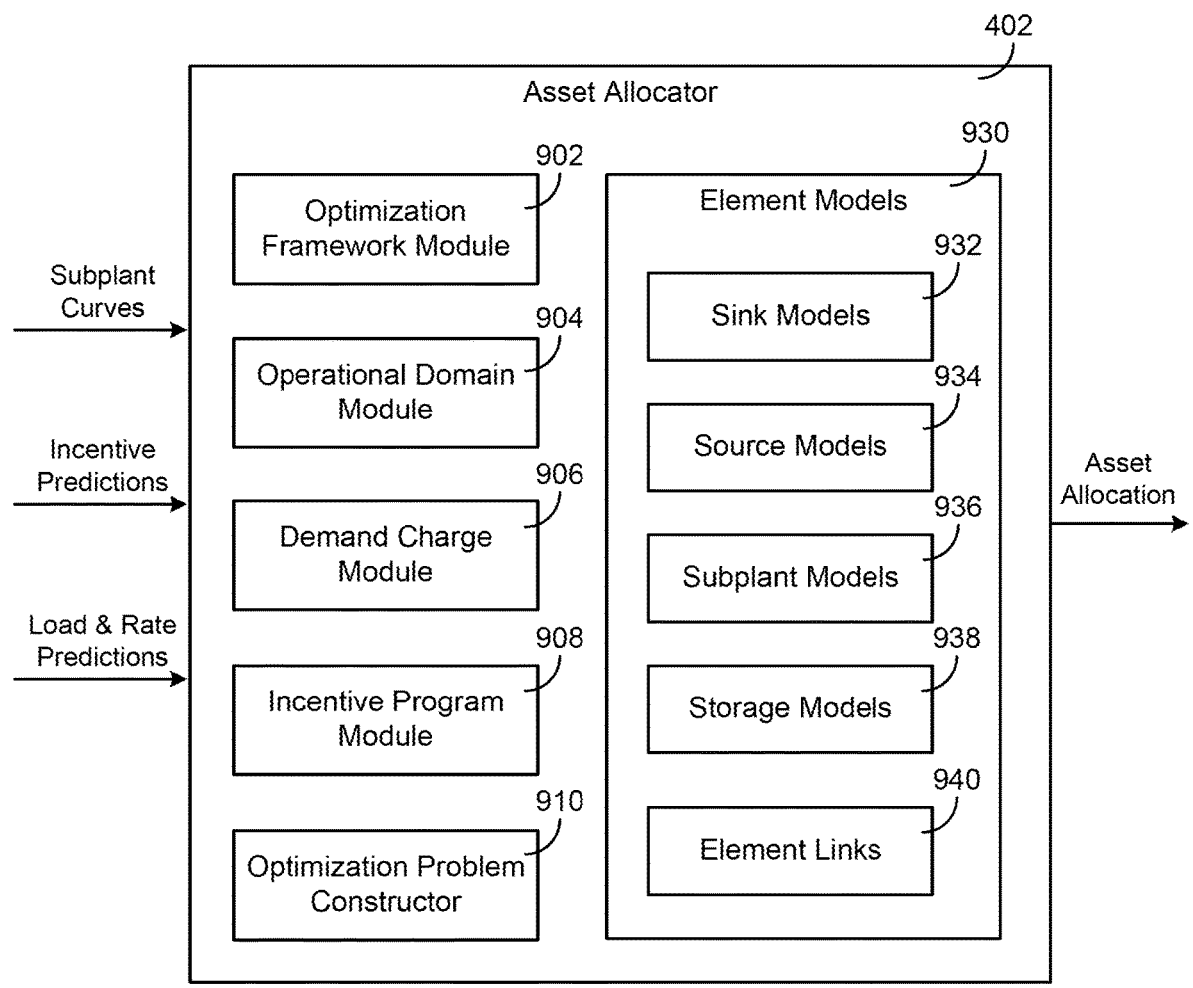
FIG. 9 is a block diagram illustrating the asset allocator of FIG. 4 in greater detail, according to some embodiments.

Referring now to FIG. 9, a block diagram illustrating asset allocator 402 in greater detail is shown, according to an exemplary embodiment. Asset allocator 402 may be configured to control the distribution, production, storage, and usage of resources in a central plant. As discussed above, asset allocator 402 can be configured to minimize the economic cost (or maximize the economic value) of operating a central plant over the duration of the optimization period. The economic cost may be defined by a cost function J(x) that expresses economic cost as a function of the control decisions made by asset allocator 402. The cost function J(x) may account for the cost of resources purchased from sources 410, as well as the revenue generated by selling resources to resource purchasers 441 or energy grid 442 or participating in incentive programs.

In some embodiments, asset allocator 402 performs an optimization process determine an optimal set of control decisions for each time step within an optimization period. The control decisions may include, for example, an optimal amount of each resource to purchase from sources 410, an optimal amount of each resource to produce or convert using subplants 420, an optimal amount of each resource to store or remove from storage 430, an optimal amount of each resource to sell to resources purchasers 441 or energy grid 440, and/or an optimal amount of each resource to provide to other sinks 440. In some embodiments, asset allocator 402 is configured to optimally dispatch all campus energy assets in order to meet the requested heating, cooling, and electrical loads of the campus for each time step within the optimization period.

Throughout this disclosure, asset allocator 402 is described as actively identifying or defining various items (e.g., sources 410, subplants 420, storage 430, sinks 440, operational domains, etc.). However, it should be understood that asset allocator 402 can also, or alternatively, receive such items as inputs. For example, the existence of such items can be defined by a user (e.g., via a user interface) or any other data source (e.g., another algorithm, an external system or process, etc.). Asset allocator 402 can be configured to identify which of these items have been defined or identified and can generate an appropriate cost function and optimization constraints based on the existence of these items. It should be understood that the acts of identifying or defining these items can include asset allocator 402 identifying, detecting, receiving, or otherwise obtaining a predefined item an input.

Optimization Framework

Asset allocator 402 is shown to include an optimization framework module 902. Optimization framework module 902 can be configured to define an optimization framework for the optimization problem solved by asset allocator 402. In some embodiments, optimization framework module 902 defines the optimization problem as a mixed integer linear program (MILP). The MILP framework provides several advantages over the linear programming framework used in previous systems. For example, the MILP framework can account for minimum turndowns on equipment, can ensure that the high level optimization problem computes a point on the subplant curve for heat recovery chillers, and can impose logical constraints on the optimization problem to compensate for poor mechanical design and/or design inefficiencies.

In some embodiments, the MILP created by optimization framework module 902 has the following form:

$$\min_{x,z} c_x^T x + c_z^T z$$

subject to the following constraints:

$$A_x x + A_z z \leq b$$

$$H_x x + H_z z = g$$

$$z = \text{integer}$$

where $x \in \mathbb{R}^{n_x}$ is a vector of the continuous decision variables, $z \in \mathbb{Z}^{n_z}$ is a vector of the integer decision variables, $c_x$ and $c_z$ are the respective cost vectors for the continuous decision variables and integer decision variables, $A_x$, $A_z$, and b are the matrices and vector that describe the inequality constraints, and $H_x$, $H_z$, and g are the matrices and vector that describe the equality constraints.

Optimization Problem Construction

Still referring to FIG. 9, asset allocator 402 is shown to include an optimization problem constructor 910. Optimization problem constructor 910 can be configured to construct the high level (i.e., asset allocation) optimization problem solved by asset allocator 402. In some embodiments, the high level optimization problem includes one or more of the elements of asset allocation system 400. For example, the optimization problem can include sinks 440, sources 410, subplants 420, and storage 430, as described with reference to FIG. 4. In some embodiments, the high level optimization problem includes airside units, which can be considered a type of energy storage in the mass of the building. The optimization problem may include site-specific constraints that can be added to compensate for mechanical design deficiencies.

In some embodiments, the optimization problem generated by optimization problem constructor 910 includes a set of links between sources 410, subplants 420, storage 430, sinks 440, or other elements of the optimization problem. For example, the high level optimization problem can be viewed as a directed graph, as shown in FIGS. 5A-5B. The nodes of the directed graph can include sources 410, subplants 420, storage 430, and sinks 440. The set of links can define the connections between the nodes, the cost of the connections between nodes (e.g., distribution costs), the efficiency of each connection, and the connections between site-specific constraints.

In some embodiments, the optimization problem generated by optimization problem constructor 910 includes an objective function. The objective function can include the sum of predicted utility usage costs over the horizon (i.e., the optimization period), the predicted demand charges, the total predicted incentive revenue over the prediction horizon, the sum of the predicted distribution costs, the sum of penalties on unmet and overmet loads over the prediction horizon, and/or the sum of the rate of change penalties over the prediction horizon (i.e., delta load penalties). All of these terms may add to the total cost, with the exception of the total predicted incentive revenue. The predicted incentive revenue may subtract from the total cost. For example, the objective function generated by optimization problem constructor 910 may have the following form:

$$J(x) \sum_{k=1}^{h} (\text{Source Usage Cost})_k + (\text{Total Demand Charges}) -$$

$$(\text{Total Incentives}) + \sum_{k=1}^{h} (\text{Distribution Cost})_k +$$

$$\sum_{k=1}^{h} (\text{Unmet/Overmet Load Penalties})_k + \sum_{k=1}^{h} (\text{Rate of Change Penalties})_k$$

where the index k denotes a time step in the optimization period and h is the total number of time steps in the optimization period.

In some embodiments, the optimization problem generated by optimization problem constructor 910 includes a set of constraints. The set of constraints can include resource balance constraints (e.g., hot water balance, chilled water balance, electricity balance, etc.), operational domain constraints for each of subplants 420, state of charge (SOC) and storage capacity constraints for each of storage 430, decision variable constraints (e.g., subplant capacity constraints, charge and discharge of storage constraints, and storage capacity constraints), demand/peak usage constraints, auxiliary constraints, and any site specific or commissioned constraints. In some embodiments, the operational domain constraints are generalized versions of the subplant curves. The operational domain constraints can be generated by operational domain module 904 (described in greater detail below). The decision variable constraints may be box constraints of the form $x_{lb} \leq x \leq x_{ub}$, where x is a decision variable and $x_{lb}$ and $x_{ub}$ are the lower and upper bound for the decision variable x.

The optimization problem generated by optimization problem constructor 910 can be considered a finite-horizon optimal control problem. The optimization problem may take the form:

$$\text{minimize } J(x)$$

subject to resource balances, operational domains for subplants 420 (e.g., subplant curves), constraints to predict the SOC of storage 430, storage capacity constraints, subplant/storage box constraints (e.g., capacity constraints and discharge/charge rate constraints), demand/peak usage constraints, auxiliary constraints for rate of change variables, auxiliary constraints for demand charges, and site specific constraints.

In some embodiments, optimization problem constructor 910 applies an inventory balance constraint to each resource. One side of the inventory balance constraint for a given resource may include the total amount of the resource purchased from all sources 410, the total amount of the resource produced by all of subplants 420, the total amount of the resource discharged from storage 430 (negative values indicate charging storage 430), and unmet load. The other side of the inventory balance for the resource may include the total amount of the resource requested/predicted (uncontrolled load), carryover from the previous time step, the total amount of the resource consumed by all subplants 420 and airside units, overmet load, and the total amount of the resource sold. For example, the inventory balance for a resource may have the form:

$$\sum_{i \in \{Sources\}} (\text{Purchased Resource})_i +$$

$$\sum_{j \in \{Subplants\}} (\text{Produced Resource})_j + \sum_{k \in \{Storage\}} (\text{Discharged Storage})_k +$$

$$\text{Unmet Load} = \text{Requested Load} + \text{Carryover}$$

$$+ \sum_{j \in \{Subplants\}} (\text{Consumed Resource})_j \sum_{l \in \{Airside\ Units\}} (\text{Consumed Resource})_l +$$

$$\text{Overmet Load} + \text{Resource Sold}$$

Optimization problem constructor 910 may require this resource balance to be satisfied for each resource at each time step of the optimization period. Together the unmet and overmet load capture the accumulation of a resource. Negative accumulation (unmet load) are distinguished from positive accumulation (overmet load) because typically, overmet loads are not included in the resource balance. Even though unmet and overmet loads are listed separately, at most one of the two may be non-zero. The amount of carryover may be the amount of unmet/overmet load from the previous time step (described in greater detail below). The requested load may be determined by load/rate predictor 622 and provided as an input to the high level optimization problem.

Throughout this disclosure, the high level/asset allocator optimization problem or high level/asset allocator problem refers to the general optimization problem constructed by optimization problem constructor 910. A high level problem instance refers to a realization of the high level problem provided the input data and parameters. The high level optimization/asset allocation algorithm refers to the entire set of steps needed to solve a high level problem instance (i.e., encapsulates both the set of mathematical operations and the implementation or software design required to setup and solve a high level problem instance. Finally, a high level problem element or high level element refers to any of the elements of the high level problem including sinks 440, sources 410, subplants 420, storage 430, or airside unit.

Element Models

Still referring to FIG. 9, asset allocator 402 is shown to include element models 930. Element models 930 may store definitions and/or models for various elements of the high level optimization problem. For example, element models 930 are shown to include sink models 932, source models 934, subplant models 936, storage models 938, and element links 940. In some embodiments, element models 930 include data objects that define various attributes or properties of sinks 440, sources 410, subplants 420, and storage 430 (e.g., using object-oriented programming).

For example, source models 934 may define the type of resource provided by each of sources 410, a cost of each resource, demand charges associated with the consumption of the resource, a maximum rate at which the resource can be purchased from each of sources 410, and other attributes of sources 410. Similarly, subplant models 936 may define the input resources of each subplant 420, the output resources of each subplant 420, relationships between the input and output variables of each subplant 420 (i.e., the operational domain of each subplant 420), and optimization constraints associated with each of subplants 420. Each of element models 930 are described in greater detail below.

Sink Models

Element models 930 are shown to include sink models 932. Sink models 932 may store models for each of sinks 440. As described above, sinks 440 may include resource consumers or requested loads. Some examples are the campus thermal loads and campus electricity usage. The predicted consumption of a sink 440 over the optimization period can be supplied as an input to asset allocator 401 and/or computed by load/rate predictor 622. Sink models 932 may store the predicted consumption over the optimization period for each of sinks 440. Sink models 932 may also store any unmet/overmet load for each of sinks 440, carryover from the previous time steps, and any incentives earned by supplying each of sinks 440 (e.g., for sinks such as an energy purchasers or an energy grid).

Carryover can be defined as the amount of unmet or overmet load for a particular resource from the previous time step. In some embodiments, asset allocator 402 determines the carryover by adding the entire unmet load for a particular resource in one time step to the requested load for the resource at the next time step. However, calculating the carryover in this manner may not always be appropriate since the carryover may grow over time. As an example, consider an unmet chilled water load. If there are several time steps where the chilled water load is not met, the buildings supplied by the load will heat up. Due to this increase in building temperature, the amount of chilled water load required to decrease the building temperature to the set-point is not a linearly increasing function of the sum of the unmet load over the past time steps because the building temperature will begin approaching the ambient temperature.

In some embodiments, asset allocator 402 adds a forgetting factor to the carryover. For example, asset allocator 402 can calculate the carryover for each time step using the following equation:

$$\text{carryover}_{j+1} = \gamma_j \cdot \text{unmet/overmet}_j$$

where unmet/overmet$_j$ is the amount of unmet and/or overmet load at time step j, carryover$_{j+1}$ is the carryover added to the right-hand side of the inventory balance at the next time step j+1, and $\gamma_j \in [0,1]$ is the forgetting factor. Selecting $\gamma_j=0$ corresponds to case where no unmet/overmet load is carried over to the next time step, whereas selecting $\gamma_j=1$ corresponds to case where all unmet/overmet load is carried over to the next time step. An intermediate selection of $\gamma_j$ (i.e., $0 \leq \gamma_j \leq 1$) corresponds to the case where some, but not all, of the unmet/overmet load is carried over. For the case of a chilled water system, the choice of $\gamma_j$ may depend on the plant itself and can be determined using the amount of unmet load that actually stored in the water (temperature would increase above the setpoint) when an unmet load occurs.

Source Models

Still referring to FIG. 9, element models 930 are shown to include source models 934. Source models 934 may store models for each of sources 410. As described above, sources 410 may include utilities or markets where resources may be purchased. Source models 934 may store a price per unit of a resource purchased from each of sources 410 (e.g., $/kWh of electricity, $/liter of water, etc.). This cost can be included as a direct cost associated with resource usage in the cost function. In some embodiments, source models 934 store costs associated with demand charges and demand constraints, incentive programs (e.g., frequency response and economic demand response) and/or sell back programs for one or more of sources 410.

In some embodiments, the cost function J(x) includes a demand charge based on peak electrical usage during a demand charge period (e.g., during a month). This demand charge may be based on the maximum rate of electricity usage at any time in the demand charge period. There are several other types of demand charges besides the anytime monthly demand charge for electricity including, for example, time-of-day monthly and yearlong ratchets. Some or all of these demand charges can be added to the cost function depending on the particular types of demand charges imposed by sources 410. In some embodiments, demand charges are defined as follows:

$$wc \max_{i \in T_{demand}} \{x_i\}$$

where $x_i$ represents the resource purchase at time step i of the optimization period, c>0 is the demand charge rate, w is a (potentially time-varying) weight applied to the demand charge term to address any discrepancies between the optimization period and the time window over which the demand charge is applied, and $T_{demand} \subseteq \{1, \ldots, h\}$ is the subinterval of the optimization period to which the demand charge is applied. Source models 934 can store values for some or all of the parameters that define the demand charges and the demand charge periods.

In some embodiments, asset allocator 402 accounts for demand charges within a linear programming framework by introducing an auxiliary continuous variable. This technique is described in greater detail with reference to demand charge module 906. While this type of term may readily be cast into a linear programming framework, it can be difficult to determine the weighting coefficient w when the demand charge period is different from the optimization period. Nevertheless, through a judicious choice of the two adjustable parameters for demand charges (i.e., the weighting coefficient w and the initial value of the auxiliary demand variable), other types of demand charges may be included in the high level optimization problem.

In some embodiments, source models 934 store parameters of various incentive programs offered by sources 410. For example, the source definition 934 for an electric utility may define a capability clearing price, a performance clearing price, a regulation award, or other parameters that define the benefits (e.g., potential revenue) of participating in a frequency regulation program. In some embodiments, source models 934 define a decision variable in the optimization problem that accounts for the capacity of a battery reserved for frequency regulation. This variable effectively reduces the capacity of the battery that is available for priced-based demand response. Depending on the complexity of the decision, source models 934 may also define a decision variable that indicates whether to participate in the incentive program. In asset allocator 402, storage capacity may be reserved for participation in incentive programs. Low level optimizer 634 can then be used to control the reserved capacity that is charged/discharged for the incentive program (e.g., frequency response control).

In some embodiments, source models 934 store pricing information for the resources sold by sources 410. The pricing information can include time-varying pricing information, progressive or regressive resource prices (e.g., prices that depend on the amount of the resource purchased), or other types of pricing structures. Progressive and regressive resource prices may readily be incorporated into the optimization problem by leveraging the set of computational operations introduced by the operational domain. In the case of either a progressive rate that is a discontinuous function of the usage or for any regressive rate, additional binary variables can be introduced into the optimization problem to properly describe both of these rates. For progressive rates that are continuous functions of the usage, no binary variables are needed because one may apply a similar technique as that used for imposing demand charges.

Figure 10:
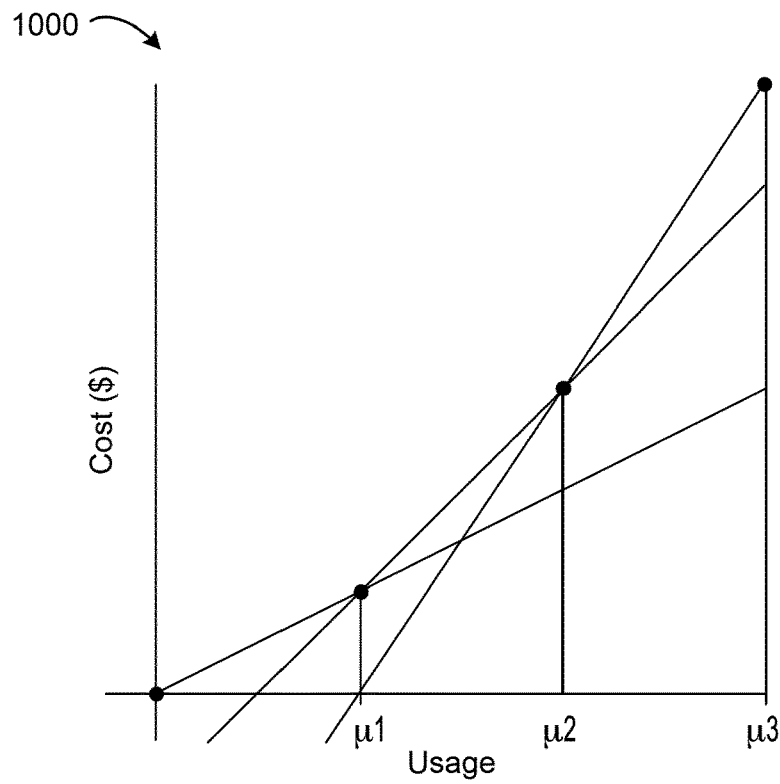
FIG. 10 is a graph of a progressive rate structure which can be imposed by some utilities, according to some embodiments.

Referring now to FIG. 10, a graph 1000 depicting a progressive rate structure for a resource is shown, according to an exemplary embodiment. The cost per unit of the resource purchased can be described by the following continuous function:

$$\text{Cost} = \begin{cases} p_1 u + b_1, & \text{if } u \in [0, u_1] \\ p_2 u + b_2, & \text{if } u \in [u_1, u_2] \\ p_3 u + b_3, & \text{if } u \in [u_2, u_3] \end{cases}$$

where $p_i$ is the price of the ith interval, $b_i$ is the offset of the ith interval, u is the amount of the resource purchased, and $p_i u_i + b_i = p_{i+1} u_i + b_i$ for i=1,2. Although the rate depicted in graph 1000 represents a cost, negative prices may be used to account for profits earned by selling back resources. Source models 934 can store values for some of all of these parameters in order to fully define the cost of resource purchases and/or the revenue generated from resource sales.

In the cost function J(x), the following term can be used to describe progressive rates:

$$\max_{i \in \{1,2,3\}} \{p_i u + b_i\}$$

Since the goal is to minimize cost, this term can be equivalently described in the optimization problem by introducing an auxiliary continuous variable C and the following constraints:

$$C \geq 0$$

$$p_1 u + b_1 \leq C$$

$$p_2 u + b_2 \leq C$$

$$p_2 u + b_2 \leq C$$

where C is the auxiliary variable that is equal to the cost of the resource. Source models 934 can define these constraints in order to enable progressive rate structures in the optimization problem.

In some embodiments, source models 934 stores definitions of any fixed costs associated with resource purchases from each of sources 410. These costs can be captured within the MILP framework. For example, let $v \in \{0,1\}$ represent whether a source 410 is being utilized (v=0 means the source 410 is not used and v=1 means the source 410 is used) and let $u \in [0, u_{max}]$ be the source usage where $u_{max}$ represents the maximum usage. If the maximum usage is not known, $u_{max}$ may be any arbitrarily large number that satisfies $u < u_{max}$. Then, the following two constraints ensure that the binary variable v is zero when u=1 and is one when u>0:

$$u - u_{max} v \leq 0$$

$$u \geq 0$$

Asset allocator 402 can add the term $c_{fixed} v$ to the cost function to account for fixed costs associated with each of sources 410, where $c_{fixed}$ is the fixed cost. Source models 934 can define these constraints and terms in order to account for fixed costs associated with sources 410.

Subplant Models

Referring again to FIG. 9, element models 930 are shown to include subplant models 936. Subplant models 936 may store models for each of subplants 420. As discussed above, subplants 420 are the main assets of a central plant. Subplants 420 can be configured to convert resource types, making it possible to balance requested loads from the building or campus using resources purchased from sources 410. This general definition allows for a diverse set of central plant configurations and equipment types as well as varying degrees of subplant modeling fidelity and resolution.

In some embodiments, subplant models 936 identify each of subplants 420 as well as the optimization variables associated with each subplant. The optimization variables of a subplant can include the resources consumed, the resources produced, intrinsic variables, and extrinsic variables. Intrinsic variables may be internal to the optimization formulation and can include any auxiliary variables used to formulate the optimization problem. Extrinsic variables may be variables that are shared among subplants (e.g., condenser water temperature).

In some embodiments, subplant models 936 describe the relationships between the optimization variables of each subplant. For example, subplant models 936 can include subplant curves that define the output resource production of a subplant as a function of one or more input resources provided to the subplant. In some embodiments, operational domains are used to describe the relationship between the subplant variables. Mathematically, an operational domain is a union of a collection of polytopes in an n-dimensional (real) space that describe the admissible set of variables of a high level element. Operational domains are described in greater detail below.

In some embodiments, subplant models 936 store subplant constraints for each of subplants 420. Subplant constraints may be written in the following general form:

$$A_{x,j}x_j + A_{z,j}z_j \leq b_j$$

$$H_{x,j}x_j + H_{z,j}z_j = g_j$$

$$x_{lb,j} \leq x_j \leq x_{ub,j}$$

$$z_{lb,j} \leq z_j \leq z_{ub,j}$$

$$z_j = \text{integer}$$

for all j where j is an index representing the jth subplant, $x_j$ denotes the continuous variables associated with the jth subplant (e.g., resource variables and auxiliary optimization variables), and $z_j$ denotes the integer variables associated with the jth subplant (e.g., auxiliary binary optimization variables). The vectors $x_{lb,j}$, $x_{ub,j}$, $z_{lb,j}$, and $z_{ub,j}$ represent the box (bound) constraints on the decision variables. The matrices $A_{x,j}$, $A_{z,j}$, $H_{x,j}$, and $H_{z,j}$ and the vectors $b_j$ and $g_j$ are associated with the inequality constraints and the equality constraints for the jth subplant.

In some embodiments, subplant models 936 store the input data used to generate the subplant constraints. Such input data may include sampled data points of the high level subplant curve/operational domain. For example, for chiller subplant 422, this data may include several points sampled from the subplant curve 1300 (shown in FIG. 13). When implemented as part of an online operational tool (shown in FIG. 6), the high level subplant operational domain can be sampled by querying low level optimizer 634 at several requested production amounts. When implemented as part of an offline planning tool (shown in FIG. 7), the sampled data may be user-specified efficiency and capacity data.

Storage Models

Referring again to FIG. 9, element models 930 are shown to include storage models 938. Storage models 938 may store models for each of storage 430. Storage models 938 can define the types of resources stored by each of storage 430, as well as storage constraints that limit the state-of-charge (e.g., maximum charge level) and/or the rates at which each storage 430 can be charged or discharged. In some embodiments, the current level or capacity of storage 430 is quantified by the state-of-charge (SOC), which can be denoted by $\phi$ where $\phi=0$ corresponds to empty and $\phi=1$ corresponds to full. To describe the SOC as a function of the charge rate or discharge rate, a dynamic model can be stored as part of storage models 938. The dynamic model may have the form:

$$\phi(k+1) = A\phi(k) + Bu(k)$$

where $\phi(k)$ is the predicted state of charge at time step k of the optimization period, u(k) is the charge/discharge rate at time step k, and A and B are coefficients that account for dissipation of energy from storage 430. In some embodiments, A and B are time-varying coefficients. Accordingly, the dynamic model may have the form:

$$\phi(k+1) = A(k)\phi(k) + B(k)u(k)$$

where A(k) and B(k) are coefficients that vary as a function of the time step k.

Asset allocator 402 can be configured to add constraints based on the operational domain of storage 430. In some embodiments, the constraints link decision variables adjacent in time as defined by the dynamic model. For example, the constraints may link the decision variables $\phi(k+1)$ at time step k+1 to the decision variables $\phi(k)$ and u(k) at time step k. In some embodiments, the constraints link the SOC of storage 430 to the charge/discharge rate. Some or all of these constraints may be defined by the dynamic model and may depend on the operational domain of storage 430.

In some embodiments, storage models 938 store optimization constraints for each of storage 430. Storage constraints may be written in the following general form:

$$A_{x,k}x_k + A_{z,k}z_k \leq b_k$$

$$H_{x,k}x_k + H_{z,k}z_k = g_k$$

$$x_{lb,k} \leq x_k \leq x_{ub,k}$$

$$z_{lb,k} \leq z_k \leq z_{ub,k}$$

$$z_k = \text{integer}$$

for all k where k is an index representing the kth storage device, $x_k$ denotes the continuous variables associated with the kth storage device (e.g., resource variables and auxiliary optimization variables), and $z_k$ denotes the integer variables associated with the kth storage device (e.g., auxiliary binary optimization variables). The vectors $x_{lb,k}$, $x_{ub,k}$, $z_{lb,k}$, and $z_{ub,k}$ represent the box (bound) constraints on the decision variables. The matrices $A_{x,k}$, $A_{z,k}$, $H_{x,k}$, and $H_{z,k}$ and the vectors $b_k$ and $g_k$ are associated with the inequality constraints and the equality constraints for the kth storage device.

The optimization constraints may ensure that the predicted SOC for each of storage 430 is maintained between a minimum SOC $Q_{min}$ and a maximum SOC $Q_{max}$. The optimization constraints may also ensure that the charge/discharge rate is maintained between a minimum charge rate $\dot{Q}_{min}$ and maximum charge rate $\dot{Q}_{max}$. In some embodiments, the optimization constraints include terminal constraints imposed on the SOC at the end of the optimization period. For example, the optimization constraints can ensure that one or more of storage 430 are full at the end of the optimization period (i.e., "tank forced full" constraints).

Figure 11:
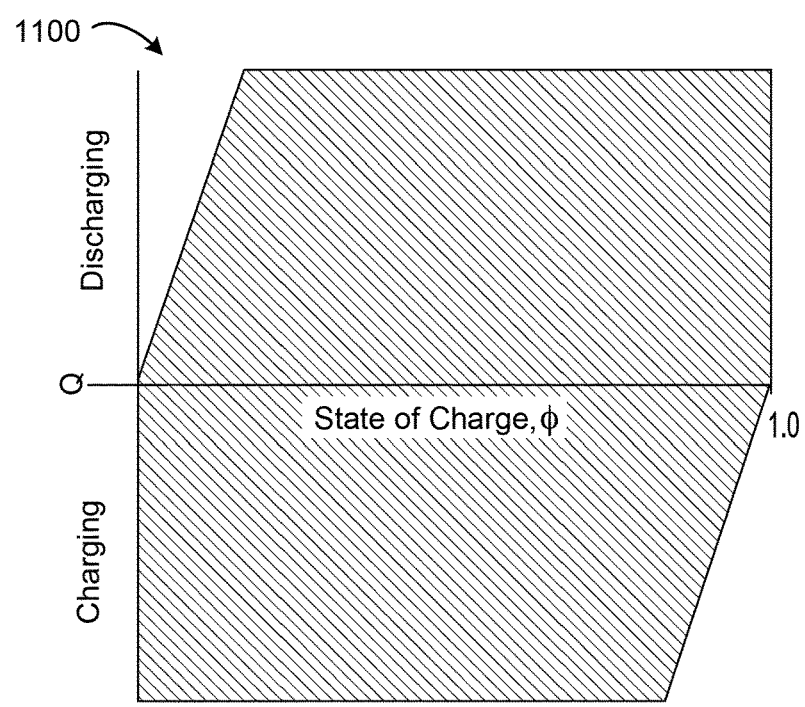
FIG. 11 is a graph of an operational domain for a storage device of a central plant, according to some embodiments.

In some embodiments, storage models 938 store mixed constraints for each of storage 430. Mixed constraints may be needed in the case that the operational domain of storage 430 is similar to that shown in FIG. 11. FIG. 11 is a graph 1100 of an example operational domain for a thermal energy storage tank or thermal energy storage subplant (e.g., TES subplants 431-432). Graph 1100 illustrates a scenario in which the discharge rate is limited to less than a maximum discharge rate at low SOCs, whereas the charge rate is limited to less than a maximum charge rate at high SOCs. In a thermal energy storage tank, the constraints on the discharge rate at low SOCs may be due to mixing between layers of the tank. For TES subplants 431-432 and the TES tanks that form TES subplants 431-432, the SOC represents the fraction of the current tank level or:

$$\phi = \frac{Q - Q_{min}}{Q_{max} - Q_{min}}$$

where Q is the current tank level, $Q_{min}$ is the minimum tank level, $Q_{max}$ is the maximum tank level, and $\phi \in [0,1]$ is the SOC. Since the maximum rate of discharge or charge may depend on the SOC at low or high SOC, SOC dependent bounds on the maximum rate of discharge or charge may be included.

In some embodiments, storage models 938 store SOC models for each of storage 430. The SOC model for a thermal energy storage tank may be an integrator model given by:

$$\phi(k+1) = \phi(k) - \delta t_s \frac{\dot{Q}(k)}{Q_{max} - Q_{min}}$$

where $\dot{Q}(k)$ is the charge/discharge rate and $\delta t_s$. Positive values of $\dot{Q}(k)$ represent discharging, whereas negative values of $\dot{Q}(k)$ represent charging. The mixed constraints depicted in FIG. 11 can be accounted for as follows:

$$a_{mixed}\phi(k) + b_{mixed} \leq \dot{Q}(k)$$

$$0 \leq \phi(k) \leq 1$$

$$-\dot{Q}_{charge,max} \leq \dot{Q}(k) \leq \dot{Q}_{discharge,max}$$

where $a_{mixed}$ and $b_{mixed}$ are vectors of the same dimension that describe any mixed linear inequality constraints (e.g., constraints that depend on both the SOC and the discharge/charge rate). The second constraint (i.e., $0 \leq \phi(k) \leq 1$) is the constraint on the SOC. The last constraint limits the rate of charging and discharging within bound.

In some embodiments, storage models 938 include models that treat the air within the building and/or the building mass as a form of energy storage. However, one of the key differentiators between an airside mass and storage 430 is that additional care must be taken to ensure feasibility of the optimization problem (e.g., soft constraining of the state constraints). Nevertheless, airside optimization units share many common features and mathematical operations as storage 430. In some embodiments, a state-space representation of airside dynamics can be used to describe the predicted evolution of airside optimization units (e.g., building mass). Such a model may have the form:

$$x(k+1) = Ax(k) + Bu(k)$$

where $x(k)$ is the airside optimization unit state vector, $u(k)$ is the airside optimization unit input vector, and $A$ and $B$ are the system matrices. In general, an airside optimization unit or the control volume that the dynamic model describes may represent a region (e.g., multiple HVAC zones served by the same air handling unit) or an aggregate of several regions (e.g., an entire building).

Element Links

Still referring to FIG. 9, element models 930 are shown to include element links 940. In some embodiments, element links 940 define the connections between sources 410, subplants 420, storage 430, and sinks 440. These links 940 are shown as lines connecting various elements in plant resource diagrams 500 and 550. For example, element links 940 may define which of sources 410 provide resources to each of subplants 420, which subplants 420 are connected to which storage 430, and which subplants 420 and/or storage 430 provide resources to each of sinks 440. Element links 940 may contain the data and methods needed to create and solve an instance of the high level optimization problem.

In some embodiments, element links 940 link sources 410, subplants 420, storage 430, and sinks 440 (i.e., the high level problem elements) using a netlist of connections between high level problem elements. The information provided by element links 940 may allow multiple subplants 420, storage 430, sinks 440, and sources of the same type to be defined. Rather than assuming that all elements contribute to and draw from a common pool of each resource, element links 940 can be used to specify the particular connections between elements. Accordingly, multiple resources of the same type can be defined such that a first subset of subplants 420 produce a first resource of a given type (e.g., Chilled Water A), whereas a second subset of subplants 420 produce a second resource of the same type (e.g., Chilled Water B). Such a configuration is shown in FIG. 5B. Advantageously, element links 940 can be used to build constraints that reflect the actual physical connections between equipment in a central plant.

In some embodiments, element links 940 are used to account for the distribution costs of resources between elements of asset allocation system 400 (e.g., from sources 410 to subplants 420, from subplants 420 to sinks 440, etc.) and/or the distribution efficiency of each connection. In some cases it may be necessary to include costs for delivering the resource along a connection, or an efficiency of the transportation (amount or percentage of resources received on the other side of the connection). Accounting for distribution costs and/or distribution efficiency may affect the result of the optimization in some situations. For example, consider a first chiller subplant 420 that is highly efficient and can provide a chilled water resource to sinks 440, but it costs significantly more (e.g., due to pumping costs etc.) to transport the resource from the first chiller subplant 420 rather than from a second chiller subplant 420. In that scenario, asset allocator 402 may determine that the first chiller subplant 420 should be used only if necessary. Additionally, energy could be lost during transportation along a particular connection (e.g., chilled water temperature may increase over a long pipe). This could be described as an efficiency of the connection.

The resource balance constraint can be modified to account for distribution efficiency as follows:

$$\sum_{sources} \alpha_{source,resource} purchase_{resource,time} +$$

$$\sum_{subplants} \alpha_{subplant,resource} produces(x_{internal,time}, x_{external,time}, v_{uncontrolled,time}) -$$

$$\sum_{subplants} \frac{1}{\alpha_{source,resource}} consumes(x_{internal,time}, x_{external,time}, v_{uncontrolled,time}) +$$

$$\sum_{storages} discharges_{resource}(x_{internal,time}, x_{external,time}) -$$

$$\frac{1}{\alpha_{sink,resource}} \sum_{sinks} requests_{resource} = 0 \ \forall \ resources, \ \forall \ time \in horizon$$

where the $\alpha$ terms are loss factors with values between zero and one.

The cost function can be modified to account for transportation costs as follows:

$$J(x) = \sum_{sources} \sum_{horizon} cost(purchase_{resource,time}, time)$$

$$+ \ldots + \sum_{connection} \lambda_{connection} resource_{connection}$$

where $\lambda_{connection}$ is the cost per unit resource transported along a particular connection and $resource_{connection}$ is the amount of the resource transported along the connection. Accordingly, the final term of the cost function accounts for transportation costs along each of the connections or links between elements in asset allocation system 400.

Demand Charges

Still referring to FIG. 9, asset allocator 402 is shown to include a demand charge module 906. Demand charge module 906 can be configured to modify the cost function J(x) and the optimization constraints to account for one or more demand charges. As previously described, demand charges are costs imposed by sources 410 based on the peak consumption of a resource from sources 410 during various demand charge periods (i.e., the peak amount of the resource purchased from the utility during any time step of the applicable demand charge period). For example, an electric utility may define one or more demand charge periods and may impose a separate demand charge based on the peak electric consumption during each demand charge period. Electric energy storage can help reduce peak consumption by storing electricity in a battery when energy consumption is low and discharging the stored electricity from the battery when energy consumption is high, thereby reducing peak electricity purchased from the utility during any time step of the demand charge period.

In some instances, one or more of the resources purchased from 410 are subject to a demand charge or multiple demand charges. There are many types of potential demand charges as there are different types of energy rate structures. The most common energy rate structures are constant pricing, time of use (TOU), and real time pricing (RTP). Each demand charge may be associated with a demand charge period during which the demand charge is active. Demand charge periods can overlap partially or completely with each other and/or with the optimization period. Demand charge periods can include relatively long periods (e.g., monthly, seasonal, annual, etc.) or relatively short periods (e.g., days, hours, etc.). Each of these periods can be divided into several sub-periods including off-peak, partial-peak, and/or on-peak. Some demand charge periods are continuous (e.g., beginning Jan. 1, 2017 and ending Jan. 31, 2017), whereas other demand charge periods are non-continuous (e.g., from 11:00 AM-1:00 PM each day of the month).

Over a given optimization period, some demand charges may be active during some time steps that occur within the optimization period and inactive during other time steps that occur during the optimization period. Some demand charges may be active over all the time steps that occur within the optimization period. Some demand charges may apply to some time steps that occur during the optimization period and other time steps that occur outside the optimization period (e.g., before or after the optimization period). In some embodiments, the durations of the demand charge periods are significantly different from the duration of the optimization period.

Advantageously, demand charge module 906 may be configured to account for demand charges in the high level optimization process performed by asset allocator 402. In some embodiments, demand charge module 906 incorporates demand charges into the optimization problem and the cost function J(x) using demand charge masks and demand charge rate weighting factors. Each demand charge mask may correspond to a particular demand charge and may indicate the time steps during which the corresponding demand charge is active and/or the time steps during which the demand charge is inactive. Each rate weighting factor may also correspond to a particular demand charge and may scale the corresponding demand charge rate to the time scale of the optimization period.

The demand charge term of the cost function J(x) can be expressed as:

$$J(x) = \ldots \sum_{s \in sources} \sum_{q \in demands} w_{demands,s,q} r_{demand,s,q} \max_{i \in demand_{s,q}} (purchase_{s,i}) \ldots$$

where the max( ) function selects the maximum amount of the resource purchased from source s during any time step i that occurs during the optimization period. However, the demand charge period associated with demand charge q may not cover all of the time steps that occur during the optimization period. In order to apply the demand charge q to only the time steps during which the demand charge q is active, demand charge module 906 can add a demand charge mask to the demand charge term as shown in the following equation:

$$J(x) = \\ \ldots \sum_{s \in sources} \sum_{q \in demands_s} w_{demand,s,q} r_{demand,s,q} \max_{i \in demand_{s,q}} (g_{s,q,i} purchase_{s,i}) \ldots$$

where $g_{s,q,i}$ is an element of the demand charge mask.

The demand charge mask may be a logical vector including an element $g_{s,q,i}$ for each time step i that occurs during the optimization period. Each element $g_{s,q,i}$ of the demand charge mask may include a binary value (e.g., a one or zero) that indicates whether the demand charge q for source s is active during the corresponding time step i of the optimization period. For example, the element $g_{s,q,i}$ may have a value of one (i.e., $g_{s,q,i}=1$) if demand charge q is active during time step i and a value of zero (i.e., $g_{s,q,i}=0$) if demand charge q is inactive during time step i. An example of a demand charge mask is shown in the following equation:

$$g_{s,q} = [0,0,0,1,1,1,1,0,0,0,1,1]^T$$

where $g_{s,q,1}$, $g_{s,q,2}$, $g_{s,q,3}$, $g_{s,q,8}$, $g_{s,q,9}$, and $g_{s,q,10}$ have values of zero, whereas $g_{s,q,4}$, $g_{s,q,5}$, $g_{s,q,6}$, $g_{s,q,7}$, $g_{s,q,11}$, and $g_{s,q,12}$ have values of one. This indicates that the demand charge q is inactive during time steps i=1, 2, 3, 8, 9, 10 (i.e., $g_{s,q,i}=0$ ∀i=1, 2, 3, 8, 9, 10) and active during time steps i=4, 5, 6, 7, 11, 12 (i.e., $g_{s,q,i}=1$ ∀i=4, 5, 6, 7, 11, 12). Accordingly, the term $g_{s,q,i}$purchase$_{s,i}$ within the max( ) function may have a value of zero for all time steps during which the demand charge q is inactive. This causes the max( ) function to select the maximum purchase from source s that occurs during only the time steps for which the demand charge q is active.

In some embodiments, demand charge module 906 calculates the weighting factor $w_{demand,s,q}$ for each demand charge q in the cost function J(x). The weighting factor $w_{demand,s,q}$ may be a ratio of the number of time steps the corresponding demand charge q is active during the optimization period to the number of time steps the corresponding demand charge q is active in the remaining demand charge period (if any) after the end of the optimization period. For example, demand charge module 906 can calculate the weighting factor $w_{demand,s,q}$ using the following equation:

$$w_{demand,s,q} = \frac{\sum_{i=k}^{k+h-1} g_{s,q,i}}{\sum_{i=k+h}^{period\_end} g_{s,q,i}}$$

where the numerator is the summation of the number of time steps the demand charge q is active in the optimization period (i.e., from time step k to time step k+h−1) and the denominator is the number of time steps the demand charge q is active in the portion of the demand charge period that occurs after the optimization period (i.e., from time step k+h to the end of the demand charge period).

The following example illustrates how demand charge module 906 can incorporate multiple demand charges into the cost function J(x). In this example, a single source of electricity (e.g., an electric grid) is considered with multiple demand charges applicable to the electricity source (i.e., q=1 . . . N, where N is the total number of demand charges). The system includes a battery asset which can be allocated over the optimization period by charging or discharging the battery during various time steps. Charging the battery increases the amount of electricity purchased from the electric grid, whereas discharging the battery decreases the amount of electricity purchased from the electric grid.

Demand charge module 906 can modify the cost function J(x) to account for the N demand charges as shown in the following equation:

$$J(x) = \ldots + w_{d_1} r_{d_1} \max_i (g_{1_i}(-P_{bat_i} + eLoad_i)) + \ldots + w_{d_q} r_{d_q} \max_i (g_{q_i}(-P_{bat_i} + eLoad_i)) + \ldots + w_{d_N} r_{d_N} \max_i (g_{N_i}(-P_{bat_i} + eLoad_i))$$

where the term $-P_{bat_i}+eLoad_i$ represents the total amount of electricity purchased from the electric grid during time step i (i.e., the total electric load $eLoad_i$ minus the power discharged from the battery $P_{bat_i}$). Each demand charge q=1 . . . N can be accounted for separately in the cost function J(x) by including a separate max( ) function for each of the N demand charges. The parameter $r_{d_q}$ indicates the demand charge rate associated with the qth demand charge (e.g., $/kW) and the weighting factor $w_{d_q}$ indicates the weight applied to the qth demand charge.

Demand charge module 906 can augment each max( ) function with an element $g_{q_i}$ of the demand charge mask for the corresponding demand charge. Each demand charge mask may be a logical vector of binary values which indicates whether the corresponding demand charge is active or inactive at each time step i of the optimization period. Accordingly, each max( ) function may select the maximum electricity purchase during only the time steps the corresponding demand charge is active. Each max( ) function can be multiplied by the corresponding demand charge rate $r_{d_q}$ and the corresponding demand charge weighting factor $w_{d_q}$ to determine the total demand charge resulting from the battery allocation $P_{bat}$ over the duration of the optimization period.

In some embodiments, demand charge module 906 linearizes the demand charge terms of the cost function J(x) by introducing an auxiliary variable $d_q$ for each demand charge q. In the case of the previous example, this will result in N auxiliary variables $d_1$ . . . $d_N$ beg introduced as decision variables in the cost function J(x). Demand charge module 906 can modify the cost function J(x) to include the linearized demand charge terms as shown in the following equation:

$$J(x) = \ldots + w_{d_1} r_{d_1} d_1 + \ldots + W_{d_q} r_{d_q} d_q + \ldots + W_{d_N} r_{d_N} d_N$$

Demand charge module 906 can impose the following constraints on the auxiliary demand charge variables $d_1$ . . . $d_N$ to ensure that each auxiliary demand charge variable represents the maximum amount of electricity purchased from the electric utility during the applicable demand charge period:

$$d_1 \geq g_{1_i}(-P_{bat_i} + eLoad_i) \ \forall i = k \ldots k+h-1, g_{1_i} \neq 0$$
$$d_1 \geq 0 \quad \vdots$$
$$d_q \geq g_{q_i}(-P_{bat_i} + eLoad_i) \ \forall i = k \ldots k+h-1, g_{1_i} \neq 0$$
$$d_q \geq 0 \quad \vdots$$
$$d_N \geq g_{N_i}(-P_{bat_i} + eLoad_i) \ \forall i = k \ldots k+h-1, g_{N_i} \neq 0$$
$$d_N \geq 0$$

In some embodiments, the number of constraints corresponding to each demand charge q is dependent on how many time steps the demand charge q is active during the optimization period. For example, the number of constraints for the demand charge q may be equal to the number of non-zero elements of the demand charge mask $g_q$. Furthermore, the value of the auxiliary demand charge variable $d_q$ at each iteration of the optimization may act as the lower bound of the value of the auxiliary demand charge variable $d_q$ at the following iteration.

Consider the following example of a multiple demand charge structure. In this example, an electric utility imposes three monthly demand charges. The first demand charge is an all-time monthly demand charge of 15.86 $/kWh which applies to all hours within the entire month. The second demand charge is an on-peak monthly demand charge of 1.56 $/kWh which applies each day from 12:00-18:00. The third demand charge is a partial-peak monthly demand charge of 0.53 $/kWh which applies each day from 9:00-12:00 and from 18:00-22:00.

For an optimization period of one day and a time step of one hour (i.e., i=1 . . . 24), demand charge module 906 may introduce three auxiliary demand charge variables. The first auxiliary demand charge variable $d_1$ corresponds to the all-time monthly demand charge; the second auxiliary demand charge variable $d_2$ corresponds to the on-peak monthly demand charge; and the third auxiliary demand charge variable $d_3$ corresponds to the partial-peak monthly demand charge. Demand charge module 906 can constrain each auxiliary demand charge variable to be greater than or equal to the maximum electricity purchase during the hours the corresponding demand charge is active, using the inequality constraints described above.

Demand charge module 906 can generate a demand charge mask $g_q$ for each of the three demand charges (i.e., q=1 . . . 3), where $g_q$ includes an element for each time step of the optimization period (i.e., $g_q = [g_{q_1} \ldots g_{q_{24}}]$). The three demand charge masks can be defined as follows:

$$g_{1_i} = 1 \ \forall i = 1 \ldots 24$$

$$g_{2_i} = 1 \ \forall i = 12 \ldots 18$$

$$g_{3_i} = 1 \ \forall i = 9 \ldots 12, 18 \ldots 22$$

with all other elements of the demand charge masks equal to zero. In this example, it is evident that more than one demand charge constraint will be active during the hours which overlap with multiple demand charge periods. Also, the weight of each demand charge over the optimization period can vary based on the number of hours the demand charge is active, as previously described.

In some embodiments, demand charge module 906 considers several different demand charge structures when incorporating multiple demand charges into the cost function J(x) and optimization constraints. Demand charge structures can vary from one utility to another, or the utility may offer several demand charge options. In order to incorporate the multiple demand charges within the optimization framework, a generally-applicable framework can be defined as previously described. Demand charge module 906 can translate any demand charge structure into this framework. For example, demand charge module 906 can characterize each demand charge by rates, demand charge period start, demand charge period end, and active hours. Advantageously, this allows demand charge module 906 to incorporate multiple demand charges in a generally-applicable format.

The following is another example of how demand charge module 906 can incorporate multiple demand charges into the cost function J(x). Consider, for example, monthly demand charges with all-time, on-peak, partial-peak, and off-peak. In this case, there are four demand charge structures, where each demand charge is characterized by twelve monthly rates, twelve demand charge period start (e.g., beginning of each month), twelve demand charge period end (e.g., end of each month), and hoursActive. The hoursActive is a logical vector where the hours over a year where the demand charge is active are set to one. When running the optimization over a given horizon, demand charge module 906 can implement the applicable demand charges using the hoursActive mask, the relevant period, and the corresponding rate.

In the case of an annual demand charge, demand charge module 906 can set the demand charge period start and period end to the beginning and end of a year. For the annual demand charge, demand charge module 906 can apply a single annual rate. The hoursActive demand charge mask can represent the hours during which the demand charge is active. For an annual demand charge, if there is an all-time, on-peak, partial-peak, and/or off-peak, this translates into at most four annual demand charges with the same period start and end, but different hoursActive and different rates.

In the case of a seasonal demand charge (e.g., a demand charge for which the maximum peak is determined over the indicated season period), demand charge module 906 can represent the demand charge as an annual demand charge. Demand charge module 906 can set the demand charge period start and end to the beginning and end of a year. Demand charge module 906 can set the hoursActive to one during the hours which belong to the season and to zero otherwise. For a seasonal demand charge, if there is an All-time, on-peak, partial, and/or off-peak, this translates into at most four seasonal demand charges with the same period start and end, but different hoursActive and different rates.

In the case of the average of the maximum of current month and the average of the maxima of the eleven previous months, demand charge module 906 can translate the demand charge structure into a monthly demand charge and an annual demand charge. The rate of the monthly demand charge may be half of the given monthly rate and the annual rate may be the sum of given monthly rates divided by two. These and other features of demand charge module 906 are described in greater detail in U.S. patent application Ser. No. 15/405,236 filed Jan. 12, 2017, the entire disclosure of which is incorporated by reference herein.

Incentive Programs

Referring again to FIG. 9, asset allocator 402 is shown to include an incentive program module 908. Incentive program module 908 may modify the optimization problem to account for revenue from participating in an incentive-based demand response (IBDR) program. IBDR programs may include any type of incentive-based program that provides revenue in exchange for resources (e.g., electric power) or a reduction in a demand for such resources. For example, asset allocation system 400 may provide electric power to an energy grid or an independent service operator as part of a frequency response program (e.g., PJM frequency response) or a synchronized reserve market. In a frequency response program, a participant contracts with an electrical supplier to maintain reserve power capacity that can be supplied or removed from an energy grid by tracking a supplied signal. The participant is paid by the amount of power capacity required to maintain in reserve. In other types of IBDR programs, asset allocation system 400 may reduce its demand for resources from a utility as part of a load shedding program. It is contemplated that asset allocation system 400 may participate in any number and/or type of IBDR programs.

In some embodiments, incentive program module 908 modifies the cost function J(x) to include revenue generated from participating in an economic load demand response (ELDR) program. ELDR is a type of IBDR program and similar to frequency regulation. In ELDR, the objective is to maximize the revenue generated by the program, while using the battery to participate in other programs and to perform demand management and energy cost reduction. To account for ELDR program participation, incentive program module 908 can modify the cost function J(x) to include the following term:

$$\min_{b_i, P_{bat_i}} \left( -\sum_{i=k}^{k+h-1} b_i r_{ELDR_i}(adjCBL_i - (eLoad_i - P_{bat_i})) \right)$$

where $b_i$ is a binary decision variable indicating whether to participate in the ELDR program during time step i, $r_{ELDR_i}$ is the ELDR incentive rate at which participation is compensated, and $adjCBL_i$ is the symmetric additive adjustment (SAA) on the baseline load. The previous expression can be rewritten as:

$$\min_{b_i, P_{bat_i}} \left( -\sum_{i=k}^{k+h-1} b_i r_{ELDR_i} \left( \sum_{l=1}^{4} \frac{e_{li}}{4} + \sum_{p=m-4}^{m-2} \frac{1}{3} \left( eLoad_p - P_{bat_p} - \sum_{l=1}^{4} \frac{e_{lp}}{4} \right) - (eLoad_i - P_{bat_i}) \right) \right)$$

where $e_{li}$ and $e_{lp}$ are the electric loads at the lth hour of the operating day.

In some embodiments, incentive program module 908 handles the integration of ELDR into the optimization problem as a bilinear problem with two multiplicative decision variables. In order to linearize the cost function J(x) and customize the ELDR problem to the optimization framework, several assumptions may be made. For example, incentive program module 908 can assume that ELDR participation is only in the real-time market, balancing operating reserve charges and make whole payments are ignored, day-ahead prices are used over the horizon, real-time prices are used in calculating the total revenue from ELDR after the decisions are made by the optimization algorithm, and the decision to participate in ELDR is made in advance and passed to the optimization algorithm based on which the battery asset is allocated.

In some embodiments, incentive program module 908 calculates the participation vector $b_i$ as follows:

$$b_i = \begin{cases} 1 & \forall i / r_{DA_i} \geq NBT_i \text{ and } i \in S \\ 0 & \text{otherwise} \end{cases}$$

where $r_{DA_i}$ is the hourly day-ahead price at the ith hour, $NBT_i$ is the net benefits test value corresponding to the month to which the corresponding hour belongs, and S is the set of nonevent days. Nonevent days can be determined for the year by choosing to participate every x number of days with the highest day-ahead prices out of y number of days for a given day type. This approach may ensure that there are nonevent days in the 45 days prior to a given event day when calculating the CBL for the event day.

Given these assumptions and the approach taken by incentive program module 908 to determine when to participate in ELDR, incentive program module 908 can adjust the cost function J(x) as follows:

$$J(x) = \sum_{i=k}^{k+h-1} r_e P_{bat_i} - \sum_{i=k}^{k+h-1} r_{FR_i} P_{FR_i} +$$

$$\sum_{i=k}^{k+h-1} r_{s_i} s_i + w_d r_d d - \sum_{i=k}^{k+h-1} b_i r_{DA_i} \left( \sum_{p=m-4}^{m-2} -\frac{1}{3} P_{bat_p} + P_{bat_i} \right)$$

where $b_i$ and m are known over a given horizon. The resulting term corresponding to ELDR shows that the rates at the ith participation hour are doubled and those corresponding to the SAA are lowered. This means it is expected that high level optimizer 632 will tend to charge the battery during the SAA hours and discharge the battery during the participation hours. Notably, even though a given hour is set to be an ELDR participation hour, high level optimizer 632 may not decide to allocate any of the battery asset during that hour. This is due to the fact that it may be more beneficial at that instant to participate in another incentive program or to perform demand management.

To build the high level optimization problem, optimization problem constructor 910 may query the number of decision variables and constraints that each subplant 420, source 410, storage 430, and site specific constraint adds to the problem. In some embodiments, optimization problem constructor 910 creates optimization variable objects for each variable of the high level problem to help manage the flow of data. After the variable objects are created, optimization problem constructor 910 may pre-allocate the optimization matrices and vectors for the problem. Element links 940 can then be used to fill in the optimization matrices and vectors by querying each component. The constraints associated with each subplant 420 can be filled into the larger problem-wide optimization matrix and vector. Storage constraints can be added, along with demand constraints, demand charges, load balance constraints, and site-specific constraints.

Extrinsic Variables

In some embodiments, asset allocator 402 is configured to optimize the use of extrinsic variables. Extrinsic variables can include controlled or uncontrolled variables that affect multiple subplants 420 (e.g., condenser water temperature, external conditions such as outside air temperature, etc.). In some embodiments, extrinsic variables affect the operational domain of multiple subplants 420. There are many methods that can be used to optimize the use of extrinsic variables. For example, consider a chiller subplant connected to a cooling tower subplant. The cooling tower subplant provides cooling for condenser water provided as an input to the chiller. Several scenarios outlining the use of extrinsic variables in this example are described below.

In a first scenario, both the chiller subplant and the tower subplant have operational domains that are not dependent on the condenser water temperatures. In this scenario, the condenser water temperature can be ignored (e.g., excluded from the set of optimization variables) since the neither of the operational domains are a function of the condenser water temperature.

In a second scenario, the chiller subplant has an operational domain that varies with the entering condenser water temperature. However, the cooling tower subplant has an operational domain that is not a function of the condenser water temperature. For example, the cooling tower subplant may have an operational domain that defines a relationship between fan power and water usage, independent from its leaving condenser water temperature or ambient air wet bulb temperature. In this case, the operational domain of the chiller subplant can be sliced (e.g., a cross section of the operational domain can be taken) at the condenser water temperature indicated at each point in the optimization period.

In a third scenario, the cooling tower subplant has an operational domain that depends on its leaving condenser water temperature. Both the entering condenser water temperature of the chiller subplant and the leaving condenser water temperature of the cooling tower subplant can be specified so the operational domain will be sliced at those particular values. In both the second scenario and the third scenario, asset allocator 402 may produce variables for the condenser water temperature. In the third scenario, asset allocator 402 may produce the variables for both the tower subplant and the chiller subplant. However, these variables will not become decision variables because they are simply specified directly In a fourth scenario, the condenser water temperature affects the operational domains of both the cooling tower subplant and the chiller subplant. Because the condenser water temperature is not specified, it may become an optimization variable that can be optimized by asset allocator 402. In this scenario, the optimization variable is produced when the first subplant (i.e., either the chiller subplant or the cooling tower subplant) reports its optimization size. When the second subplant is queried, no additional variable is produced. Instead, asset allocator 402 may recognize the shared optimization variable as the same variable from the connection netlist.

When asset allocator 402 asks for constraints from the individual subplants 420, subplants 420 may send those constraints using local indexing. Asset allocator 402 may then disperse these constraints by making new rows in the optimization matrix, but also distributing the column to the correct columns based on its own indexing for the entire optimization problem. In this way, extrinsic variables such as condenser water temperature can be incorporated into the optimization problem in an efficient and optimal manner.

Commissioned Constraints

Some constraints may arise due to mechanical problems after the energy facility has been built. These constraints are site specific and may not be incorporated into the main code for any of the subplants or the high level problem itself. Instead, constraints may be added without software update on site during the commissioning phase of the project. Furthermore, if these additional constraints are known prior to the plant build they could be added to the design tool run. Commissioned constraints can be held by asset allocator 402 and can be added constraints to any of the ports or connections of subplants 420. Constraints can be added for the consumption, production, or extrinsic variables of a subplant.

As an example implementation, two new complex type internals can be added to the problem. These internals can store an array of constraint objects that include a dictionary to describe inequality and equality constraints, times during which the constraints are active, and the elements of the horizon the constraints affect. In some embodiments, the dictionaries have keys containing strings such as (subplantUserName).(portInternalName) and values that represent the linear portion of the constraint for that element of the constraint matrix. A special "port name" could exist to reference whether the subplant is running. A special key can be used to specify the constant part of the constraint or the right hand side. A single dictionary can describe a single linear constraint.

Operational Domains

Figure 12:
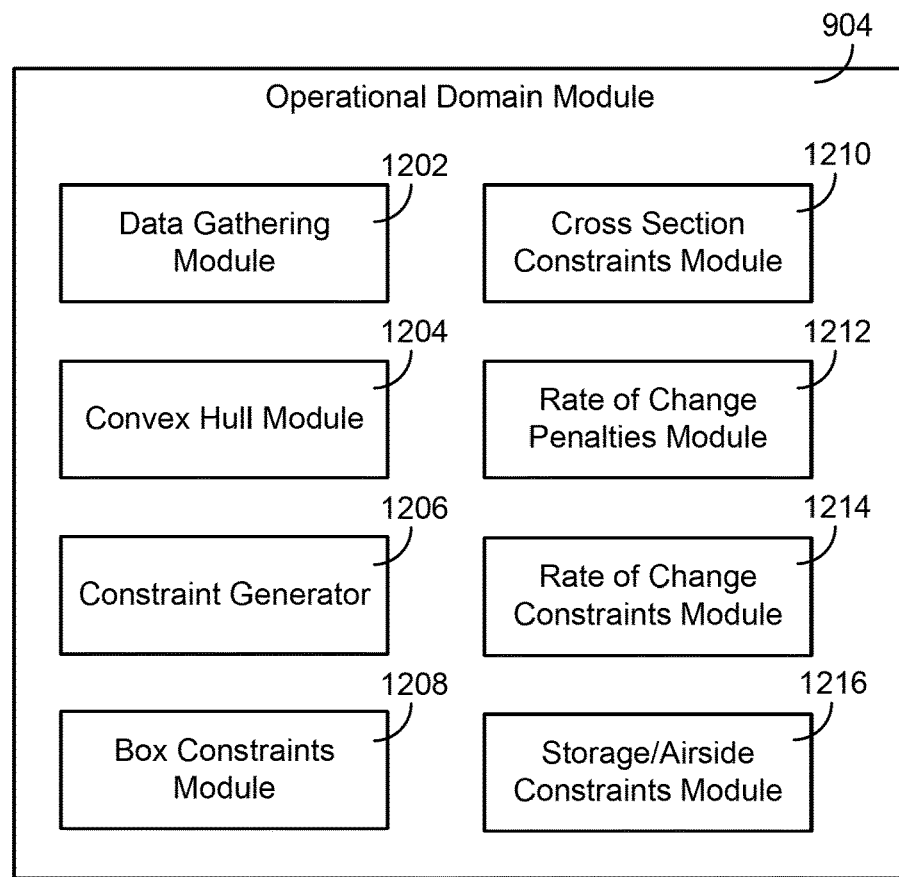
FIG. 12 is a block diagram illustrating the operational domain module of FIG. 9 in greater detail, according to some embodiments.

Referring now to FIGS. 9 and 12, asset allocator 402 is shown to include an operational domain module 904. Operational domain module 904 can be configured to generate and store operational domains for various elements of the high level optimization problem. For example, operational domain module 904 can create and store operational domains for one or more of sources 410, subplants 420, storage 430, and/or sinks 440. The operational domains for subplants 420 may describe the relationship between the resources, intrinsic variables, and extrinsic variables, and constraints for the rate of change variables (delta load variables). The operational domains for sources 410 may include the constraints necessary to impose any progressive/regressive rates (other than demand charges). The operational domain for storage 430 may include the bounds on the state of charge, bounds on the rate of charge/discharge, and any mixed constraints.

In some embodiments, the operational domain is the fundamental building block used by asset allocator 402 to describe the models (e.g., optimization constraints) of each high level element. The operational domain may describe the admissible values of variables (e.g., the inputs and the outputs of the model) as well as the relationships between variables. Mathematically, the operational domain is a union of a collection of polytopes in an n-dimensional real space. Thus, the variables must take values in one of the polytopes of the operational domain. The operational domains generated by operational domain module 904 can be used to define and impose constraints on the high level optimization problem.

Referring particularly to FIG. 12, a block diagram illustrating operational domain module 904 in greater detail is shown, according to an exemplary embodiment. Operational domain module 904 can be configured to construct an operational domain for one or more elements of asset allocation system 400. In some embodiments, operational domain module 904 converts sampled data points into a collection of convex regions making up the operational domain and then generates constraints based on the vertices of the convex regions. Being able to convert sampled data points into constraints gives asset allocator 402 much generality. This conversion methodology is referred to as the constraint generation process. The constraint generation process is illustrated through a simple chiller subplant example, described in greater detail below.

FIG. 13 illustrates a subplant curve 1300 for a chiller subplant. Subplant curve 1300 is an example of a typical chiller subplant curve relating the electricity usage of the chiller subplant with the chilled water production of the chiller subplant. Although only two variables are shown in subplant curve 1300, it should be understood that the constraint generation process also applies to high dimensional problems. For example, the constraint generation process can be extended to the case that the condenser water return temperature is included in the chiller subplant operational domain. When the condenser water return temperature is included, the electricity usage of the chiller subplant can be defined as a function of both the chilled water production and the condenser water return temperature. This results in a three-dimensional operational domain. The constraint generation process described here applies to two-dimensional problems as well as higher dimensional problems.

Figure 14:
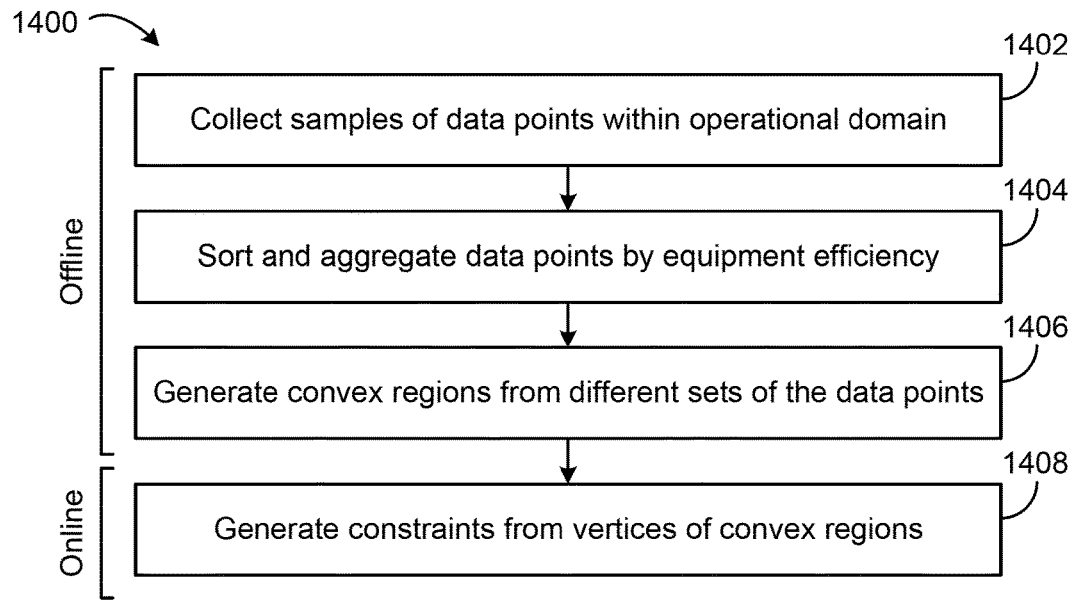
FIG. 14 is a flowchart of a process for generating optimization constraints based on samples of data points associated with an operational domain of a subplant, according to some embodiments.

Referring now to FIGS. 12 and 14, the components and functions of operational domain module 904 are described. FIG. 14 is a flowchart outlining the constraint generation process 1400 performed by operational domain module 904. Process 1400 is shown to include collecting samples of data points within the operational domain (step 1402). In some embodiments, step 1402 is performed by a data gathering module 1202 of operational domain module 904. Step 1402 can include sampling the operational domain (e.g., the high level subplant curve). For the operational tool (i.e., central plant controller 600), the data sampling may be performed by successively calling low level optimizer 634. For the planning tool 700, the data may be supplied by the user and asset allocator 402 may automatically construct the associated constraints.

In some embodiments, process 1400 includes sorting and aggregating data points by equipment efficiency (step 1404). Step 1404 can be performed when process 1400 is performed by planning tool 700. If the user specifies efficiency and capacity data on the equipment level (e.g., provides data for each chiller of the subplant), step 1404 can be performed to organize and aggregate the data by equipment efficiency.

Figure 15A:
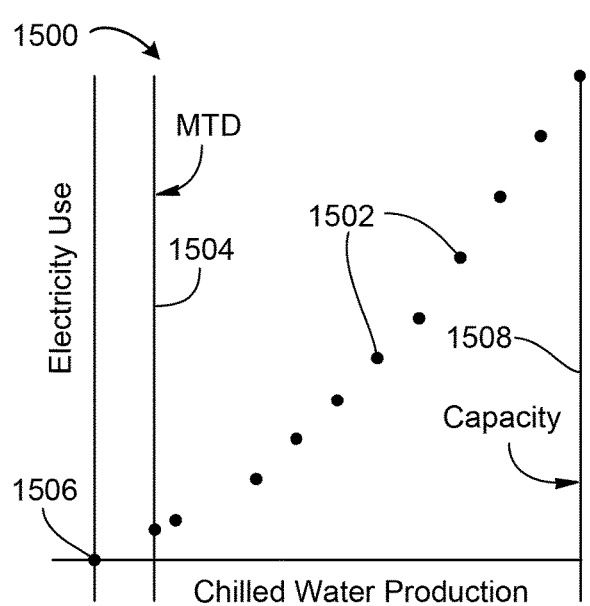
FIG. 15A is a graph illustrating a result of sampling the operational domain defined by the subplant curve of FIG. 13, according to some embodiments.

The result of steps 1402-1404 is shown in FIG. 15A. FIG. 15A is a plot 1500 of several data points 1502 collected in step 1402. Data points 1502 can be partitioned into two sets of points by a minimum turndown (MTD) threshold 1504. The first set of points includes a single point 1506 representing the performance of the chiller subplant when the chiller subplant is completely off (i.e., zero production and zero resource consumption). The second set of data points includes the points 1502 between the MTD threshold 1504 and the maximum capacity 1508 of the chiller subplant.

Process 1400 is shown to include generating convex regions from different sets of the data points (step 1406). In some embodiments, step 1406 is performed by a convex hull module 1204 of operational domain module 904. A set X is a "convex set" if for all points (x, y) in set X and for all $\theta \in [0,1]$, the point described by the linear combination $(1-\theta)x+\theta y$ also belongs in set X. A "convex hull" of a set of points is the smallest convex set that contains X. Convex hull module 1204 can be configured to generate convex regions from the sampled data by applying an n-dimensional convex hull algorithm to the data. In some embodiments, convex hull module 1204 uses the convex hull algorithm of Matlab (i.e., "convhulln"), which executes an n-dimensional convex hull algorithm. Convex hull module 1204 can identify the output of the convex hull algorithm as the vertices of the convex hull.

Figure 15B:
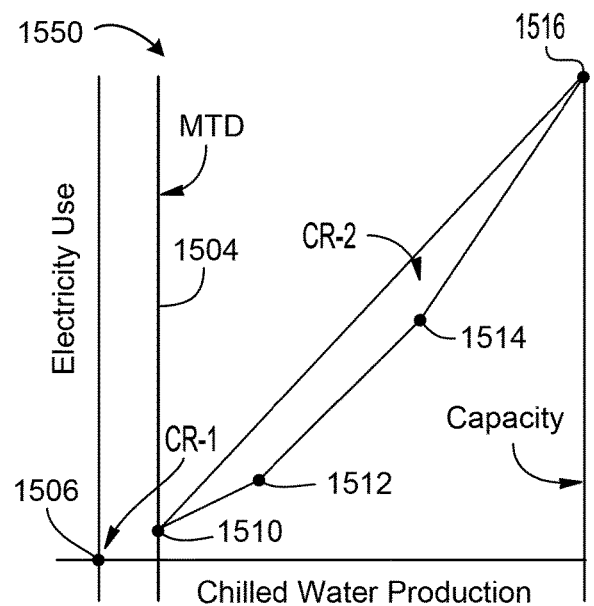
FIG. 15B is a graph illustrating a result of applying a convex hull algorithm to the sampled data points shown in FIG. 15A, according to some embodiments.

The result of step 1406 applied to the chiller subplant example is shown in FIG. 15B. FIG. 15B is a plot 1550 of two convex regions CR-1 and CR-2. Point 1506 is the output of the convex hull algorithm applied to the first set of points. Since only a single point 1506 exists in the first set, the first convex region CR-1 is the single point 1506. The points 1510, 1512, 1514, and 1516 are the output of the convex hull algorithm applied to the second set of points between the MTD threshold 1504 and the maximum capacity 1508. Points 1510-1516 define the vertices of the second convex region CR-2.

Figure 16:
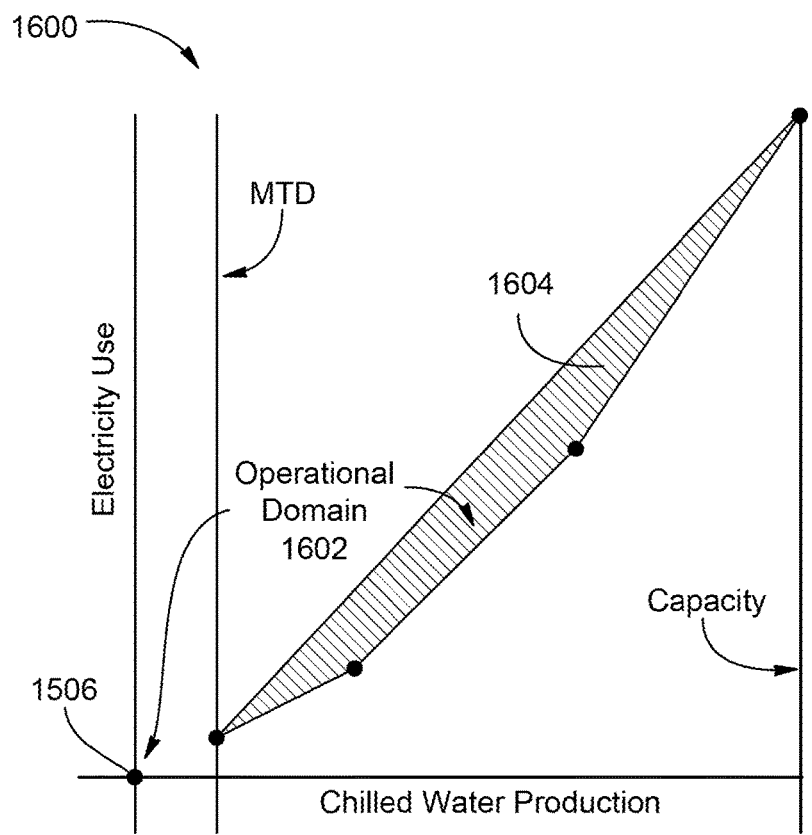
FIG. 16 is a graph of an operational domain for a chiller subplant which can be generated based on the sampled data points shown in FIG. 15A, according to some embodiments.

Process 1400 is shown to include generating constraints from vertices of the convex regions (step 1408). In some embodiments, step 1408 is performed by a constraint generator 1206 of operational domain module 904. The result of step 1408 applied to the chiller subplant example is shown in FIG. 16. FIG. 16 is a plot 1600 of the operational domain 1602 for the chiller subplant. Operational domain 1602 includes the set of points contained within both convex regions CR-1 and CR-2 shown in plot 1550. These points include the origin point 1506 as well as all of the points within area 1604.

Constraint generator 1206 can be configured to convert the operational domain 1602 and/or the set of vertices that define the operational domain 1602 into a set of constraints. Many methods exists to convert the vertices of the convex regions into optimization constraints. These methodologies produce different optimization formulations or different problem structures, but the solutions to these different formulations are equivalent. All methods effectively ensure that the computed variables (inputs and outputs) are within one of the convex regions of the operational domain. Nevertheless, the time required to solve the different formulations may vary significantly. The methodology described below has demonstrated better execution times in feasibility studies over other formulations.

MILP Formulation

In some embodiments, constraint generator 1206 uses a mixed integer linear programming (MILP) formulation to generate the optimization constraints. A few definitions are needed to present the MILP formulation. A subset P of $\mathbb{R}^d$ is called a convex polyhedron if it is the set of solutions to a finite system of linear inequalities (i.e., $P=\{x: a_j^T x \leq b_j, j=1 \ldots m\}$). Note that this definition also allows for linear equalities because an equality may be written as two inequalities. For example, $c_j x = d_j$ is equivalent to $[c_j, -c_j]^T x \leq [d_j, -d_j]^T$. A convex polytope is a bounded convex polyhedron. Because the capacity of any subplant is bounded, constraint generator 1206 may exclusively work with convex polytopes.

In some embodiments, the MILP formulation used by constraint generator 1206 to define the operational domain is the logarithmic disaggregated convex combination model (DLog). The advantage of the DLog model is that only a logarithmic number of binary variables with the number of convex regions need to be introduced into the optimization problem as opposed to a linear number of binary variables. Reducing the number of binary variables introduced into the problem is advantageous as the resulting problem is typically computationally easier to solve.

Constraint generator 1206 can use the DLog model to capture which convex region is active through a binary numbering of the convex regions. Each binary variable represents a digit in the binary numbering. For example, if an operational domain consists of four convex regions, the convex regions can be numbered zero through three, or in binary numbering 00 to 11. Two binary variables can used in the formulation: $y_1 \in (0,1)$ and $y_2 \in (0,1)$ where the first variable $y_1$ represents the first digit of the binary numbering and the second variable $y_2$ represents the second digit of the binary numbering. If $y_1=0$ and $y_2=0$, the zeroth convex region is active. Similarly, $y_1=1$ and $y_2=0$, the second convex region is active. In the DLog model, a point in any convex region is represented by a convex combination of the vertices of the polytope that describes the convex region.

In some embodiments, constraint generator 1206 formulates the DLog model as follows: let $\hat{\mathcal{P}}$ be the set of polytopes that describes the operational domain (i.e., $\hat{\mathcal{P}}$ represents the collection of convex regions that make up the operational domain). Let $P_i \in \hat{\mathcal{P}}$ ($i=1, \ldots, n_{CR}$) be the ith polytope which describes the ith convex region of the operational domain. Let $V(P_i)$ be the vertices of the ith polytope, and let $V(\hat{\mathcal{P}}):=\cup_{P \in \hat{\mathcal{P}}} V(P)$ be the vertices of all polytopes. In this formulation, an auxiliary continuous variable can be introduced for each vertex of each polytope of the operational domain, which is denoted by $\lambda_{P_i,v_j}$ where the subscripts denote that the continuous variable is for the jth vertex of the ith polytope. For this formulation, $\lceil \log_2 |\hat{\mathcal{P}}| \rceil$ binary variables are needed where the function $\lceil \cdot \rceil$ denotes the ceiling function (i.e., $\lceil x \rceil$ is the smallest integer not less than x. Constraint generator 1206 can define an injective function $B: \hat{\mathcal{P}} \rightarrow \{0,1\}^{\lceil \log_2 |\mathcal{P}| \rceil}$. The injective function may be interpreted as the binary numbering of the convex regions.

In some embodiments, the DLog formulation is given by:

$$\Sigma_{P \in \hat{\mathcal{P}}} \Sigma_{v \in V(P)} \lambda_{P,v} v = x$$

$$\lambda_{P,v} \geq 0, \forall P \in \hat{\mathcal{P}}, v \in V(P)$$

$$\Sigma_{P \in \hat{\mathcal{P}}} \Sigma_{v \in V(P)} \lambda_{P,v} = 1$$

$$\Sigma_{P \in \hat{\mathcal{P}}^+(B,l)} \Sigma_{v \in V(P)} \lambda_{P,v} \leq y_l, \forall l \in L(P)$$

$$\Sigma_{P \in \hat{\mathcal{P}}^0(B,l)} \Sigma_{v \in V(P)} \lambda_{P,v} \leq (1-y_l), \forall l \in L(P)$$

$$y_l \in \{0,1\}, \forall l \in L(P)$$

where $\hat{\mathcal{P}}^+(B, l):=\{P \in \hat{\mathcal{P}}: B(P)_l=1\}$, $\hat{\mathcal{P}}^0(B, l):=\{P \in \hat{\mathcal{P}}: B(P)_l=0\}$, and $L(\hat{\mathcal{P}}):=\{1, \ldots, \log_2 |\hat{\mathcal{P}}|\}$. If there are shared vertices between the convex regions, a fewer number of continuous variables may need to be introduced.

To understand the injective function and the sets $\hat{\mathcal{P}}^+(B, l)$ and $\hat{\mathcal{P}}^0(B, l)$, consider again the operational domain consisting of four convex regions. Again, binary numbering can be used to number the sets from 00 to 11, and two binary variables can be used to represent each digit of the binary set numbering. Then, the injective function maps any convex region, which is a polytope, to a unique set of binary variables. Thus, $B(P_0)=[0,0]^T$, $B(P_1)=[0,1]^T$, $B(P_2)=[1,0]^T$, and $B(P_3)=[1,1]^T$. Also, for example, the sets $\tilde{\ell}^+(B, 0):=\{P\in\tilde{\ell}: B(P)_0=1\}=P_2\cup P_3$ and $\tilde{\ell}^0(B, 0):=\{P\in\tilde{\ell}: B(P)_0=0\}=P_0\cup P_1$.

Box Constraints

Still referring to FIG. 12, operational domain module 904 is shown to include a box constraints module 1208. Box constraints module 1208 can be configured to adjust the operational domain for a subplant 420 in the event that a device of the subplant 420 is unavailable or will be unavailable (e.g., device offline, device removed for repairs or testing, etc.). Reconstructing the operational domain by resampling the resulting high level operational domain with low level optimizer 634 can be used as an alternative to the adjustment performed by box constraints module 1208. However, reconstructing the operational domain in this manner may be time consuming. The adjustment performed by box constraints module 1208 may be less time consuming and may allow operational domains to be updated quickly when devices are unavailable. Also, owing to computational restrictions, it may be useful to use a higher fidelity subplant model for the first part of the prediction horizon. Reducing the model fidelity effectively means merging multiple convex regions.

In some embodiments, box constraints module 1208 is configured to update the operational domain by updating the convex regions with additional box constraints. Generating the appropriate box constraints may include two primary steps: (1) determining the admissible operational interval(s) of the independent variable (e.g., the production of the subplant) and (2) generating box constraints that limit the independent variable to the admissible operational interval(s). Both of these steps are described in detail below.

In some embodiments, box constraints module 1208 determines the admissible operational interval (e.g., the subplant production) using an algorithm that constructs the union of intervals. Box constraints module 1208 may compute two convolutions. For example, let lb and ub be vectors with elements corresponding to the lower and upper bound of the independent variables of each available device within the subplant. Box constraints module 1208 can compute two convolutions to compute all possible combinations of lower and upper bounds with all the combinations of available devices on and off. The two convolutions can be defined as follows:

$$lb_{all,combos}{}^T = [0^{\mathbb{1}}]*[0 lb_T]$$

$$ub_{all,combos}{}^T = [0^{\mathbb{1}}]*[0 ub_T]$$

where $lb_{all,combos}$ and $ub_{all,combos}$ are vectors containing the elements with the lower and upper bounds with all combinations of the available devices on and off, $\mathbb{1}$ is a vector with all ones of the same dimension as lb and ub, and the operator * represents the convolution operator. Note that each element of $lb_{all,combos}$ and $ub_{all,combos}$ are subintervals of admissible operating ranges. In some embodiments, box constraints module 1208 computes the overall admissible operating range by computing the union of the subintervals.

To compute the union of the subintervals, box constraints module 1208 can define the vector v as follows:

$$v := [lb_{all,combos}{}^T, ub_{all,combos}{}^T]^T$$

and may sort the vector v from smallest to largest:

$$[t,p]=\text{sort}(v)$$

where t is a vector with sorted elements of v, p is a vector with the index position in v of each element in t. If $p_i \leq n$ where n is the dimension of $lb_{all,combos}$ and $ub_{all,combos}$, the ith element of t is a lower bound. However, if $p_i > n$, the ith element of t is an upper bound. Box constraints module 1208 may construct the union of the sub intervals by initializing a counter at zero and looping through each element of p starting with the first element. If the element corresponds to a lower bound, box constraints module 1208 may add one to the counter. However, if the element corresponds to an upper bound, box constraints module 1208 may subtract one from the counter. Once the counter is set to zero, box constraints module 1208 may determine that the end of the subinterval is reached. An example of this process is illustrated graphically in FIGS. 17A-17B.

Figure 17A:
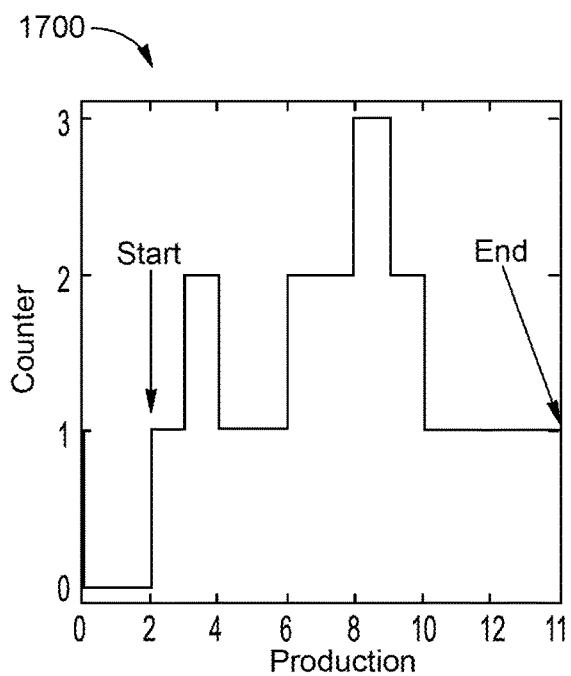
FIG. 17A is a graph illustrating a technique for identifying intervals of an operational domain for a subplant, which can be performed by the operational domain module of FIG. 12, according to some embodiments.
Figure 17B:
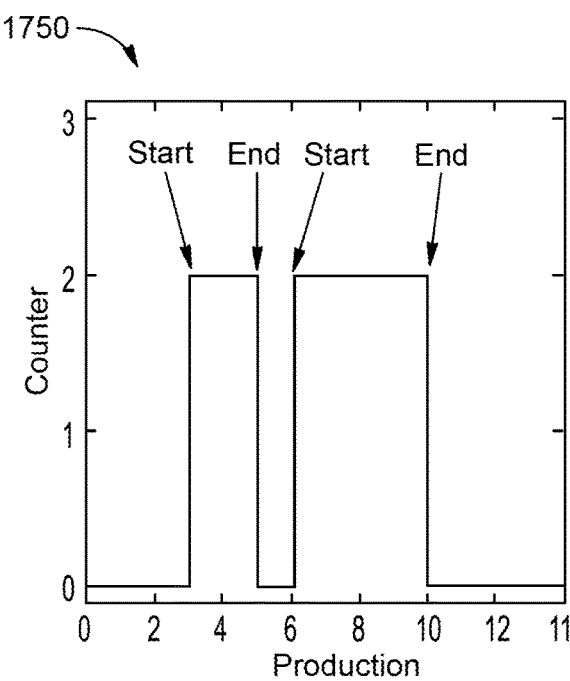
FIG. 17B is another graph illustrating the technique for identifying intervals of an operational domain for a subplant, which can be performed by the operational domain module of FIG. 12, according to some embodiments.

Referring now to FIGS. 17A-17B, a pair of graphs 1700 and 1750 illustrating the operational domain update procedure performed by box constraints module 1208 is shown, according to an exemplary embodiment. In this example, consider a subplant consisting of three devices where the independent variable is the production of the subplant. Let the first two devices have a minimum and maximum production of 3.0 and 5.0 units, respectively, and the third device has a minimum and maximum production of 2.0 and 4.0 units, respectively. The minimum production may be considered to be the minimum turndown of the device and the maximum production may be considered to be the device capacity. With all the devices available, the results of the two convolutions are:

$$lb_{all,combos}{}^T=[0.0,2.0,3.0,5.0,6.0,8.0]$$

$$ub_{all,combos}{}^T=[0.0,4.0,5.0,9.0,10.0,14.0]$$

The result of applying the counter algorithm to these convolutions with all the devices available is shown graphically in FIG. 17A. The start of an interval occurs when the counter becomes greater than 0 and the end of an interval occurs when the counter becomes 0. Thus, from FIG. 17A, the admissible production range of the subplant when all the devices are available is either 0 units if the subplant is off or any production from 2.0 to 14.0 units. In other words, the convex regions in the operational domain are (0) and another region including the interval from 2.0 to 14.0 units.

If one of the first two devices becomes unavailable, the subplant includes one device having a minimum and maximum production of 3.0 and 5.0 units, respectively, and another device having a minimum and maximum production of 2.0 and 4.0 units, respectively. Accordingly, the admissible production range of the subplant is from 2.0 to 9.0 units. This means that the second convex region needs to be updated so that it only contains the interval from 2.0 to 9.0 units.

If the third device becomes unavailable, the subplant includes two devices, both of which have a minimum and maximum production of 3.0 and 5.0 units, respectively. Therefore, the admissible range of production for the subplant is from 3.0 to 5.0 units and from 6.0 to 10.0 units. This result can be obtained using the convolution technique and counter method. For example, when the third device becomes unavailable, the two convolutions are (omitting repeated values):

$$lb_{all,combos}{}^T=[0.0,3.0,6.0]$$

$$ub_{all,combos}{}^T=[0.0,5.0,10.0]$$

The result of applying the counter algorithm to these convolutions with the third device unavailable is shown graphically in FIG. 17B. The start of an interval occurs when the counter becomes greater than 0 and the end of an interval occurs when the counter becomes 0. From FIG. 17B, the new admissible production range is from 3.0 to 5.0 units and from 6.0 to 10.0 units. Thus, if the third device is unavailable, there are three convex regions: {0}, the interval from 3.0 to 5.0 units, and the interval from 6.0 to 10.0 units. This means that the second convex region of the operational domain with all devices available needs to be split into two regions.

Once the admissible range of the independent variable (e.g., subplant production) has been determined, box constraints module 1208 can generate box constraints to ensure that the independent variable is maintained within the admissible range. Box constraints module 1208 can identify any convex regions of the original operational domain that have ranges of the independent variables outside the new admissible range. If any such convex ranges are identified, box constraints module 1208 can update the constraints that define these convex regions such that the resulting operational domain is inside the new admissible range for the independent variable. The later step can be accomplished by adding additional box constraints to the convex regions, which may be written in the general form $x_{lb} \leq x \leq x_{ub}$ where x is an optimization variable and $x_{lb}$ and $x_{ub}$ are the lower and upper bound, respectively, for the optimization variable x.

Figure 18A:
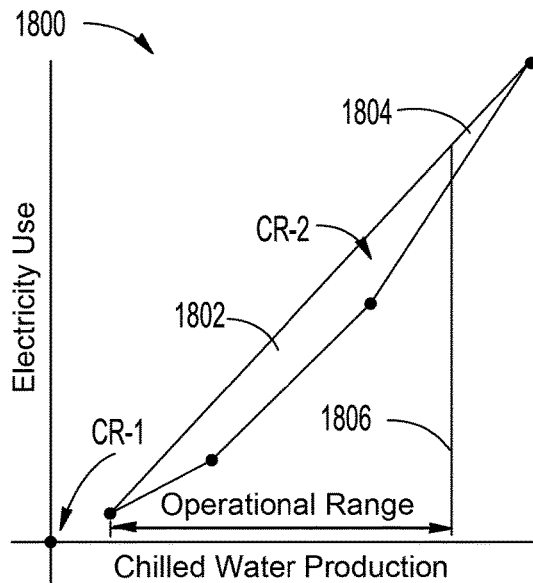
FIG. 18A is a graph of an operational domain for a chiller subplant with a portion that extends beyond the operational range of the subplant, according to some embodiments.
Figure 18B:
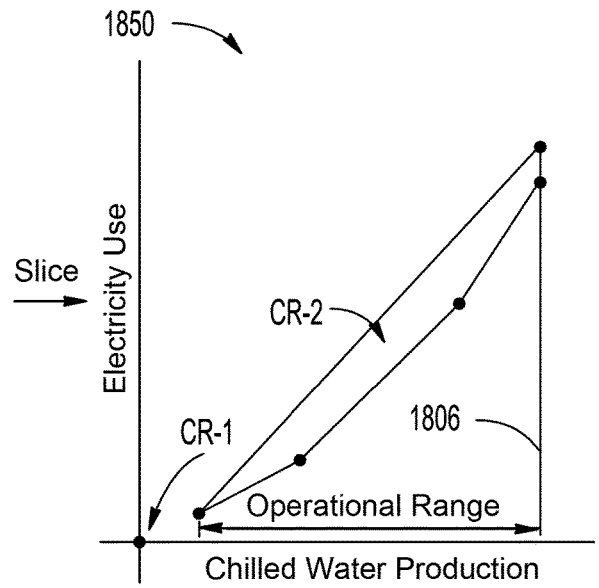
FIG. 18B is a graph of the operational domain shown in FIG. 18A after the operational domain has been sliced to remove the portion that extends beyond the operational range, according to some embodiments.

In some embodiments, box constraints module 1208 removes an end portion of a convex region from the operational domain. This is referred to as slicing the convex region and is shown graphically in FIGS. 18A-18B. For example, FIG. 18A is a graph 1800 of an operational domain which includes a convex region CR-2. A first part 1802 of the convex region CR-2 is within the operational range determined by box constraints module 1208. However, a second part 1804 of the convex region CR-2 is outside the operational range determined by box constraints module 1208. Box constraints module 1208 can remove the second part 1804 from the convex region CR-2 by imposing a box constraint that limits the independent variable (i.e., chilled water production) within the operational range. The slicing operation results in the modified convex region CR-2 shown in graph 1850.

Figure 19A:
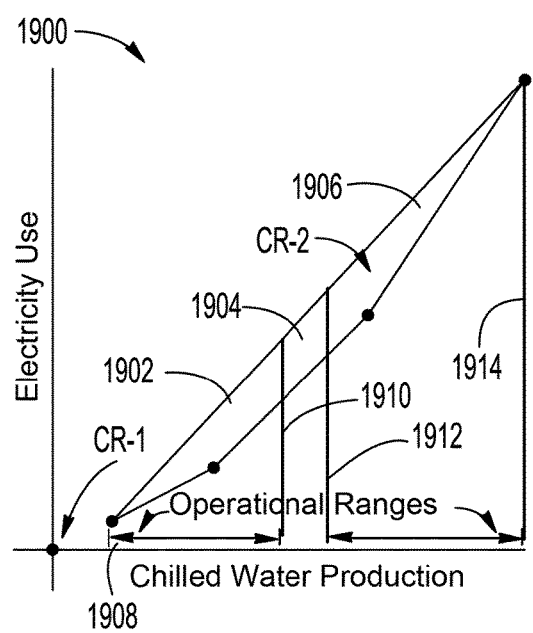
FIG. 19A is a graph of an operational domain for a chiller subplant with a middle portion that lies between two disjoined operational ranges of the subplant, according to some embodiments.
Figure 19B:
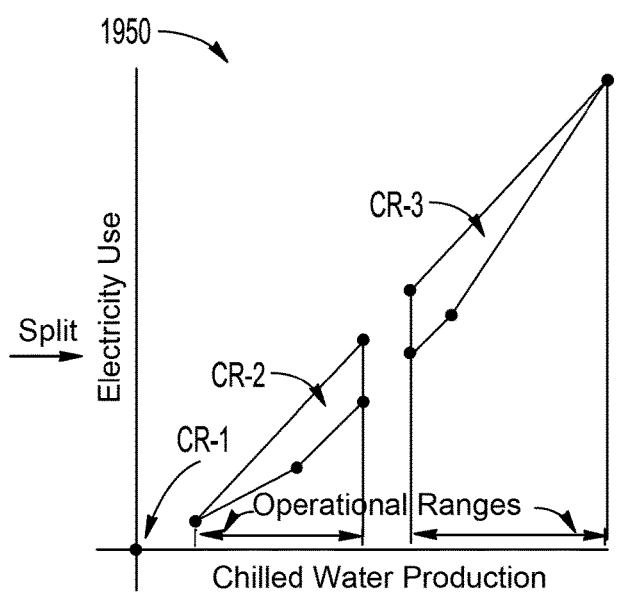
FIG. 19B is a graph of the operational domain shown in FIG. 19A after the operational domain has been split to remove the portion that lies between the two disjoined operational ranges, according to some embodiments.
Figure 20A:
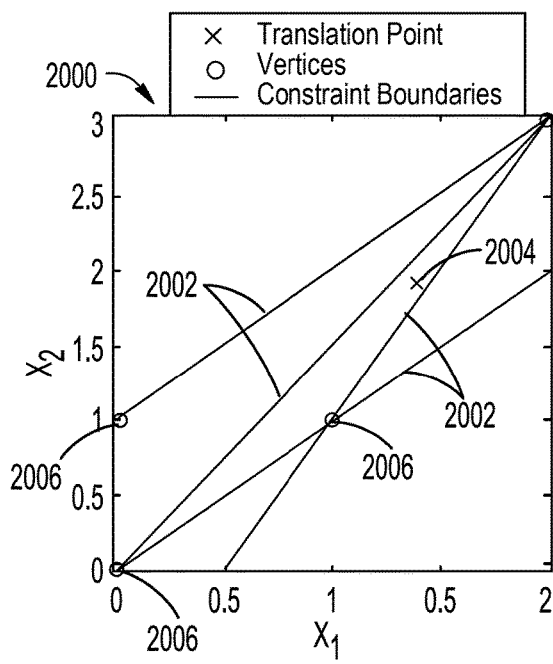
FIGS. 20A-20D are graphs illustrating a technique which can be used by the operational domain module of FIG. 12 to detect and remove redundant constraints, according to some embodiments.
Figure 20B:
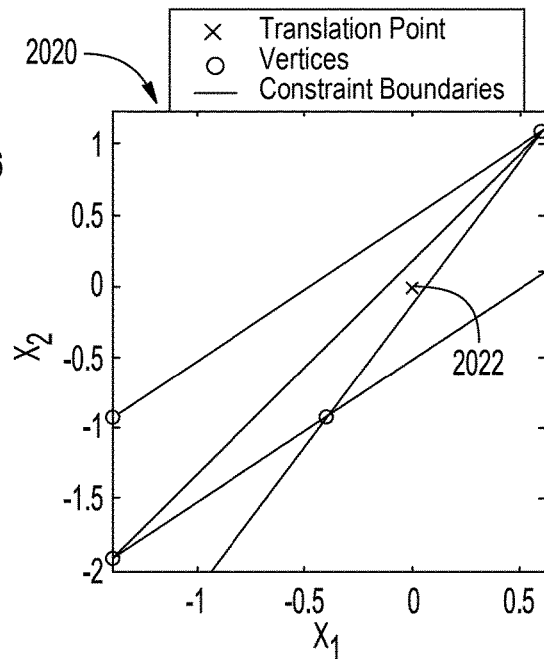
Figure 20C:
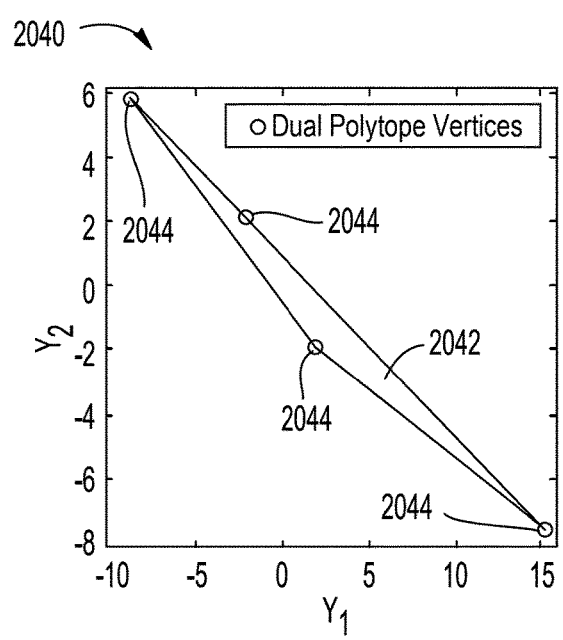
Figure 20D:
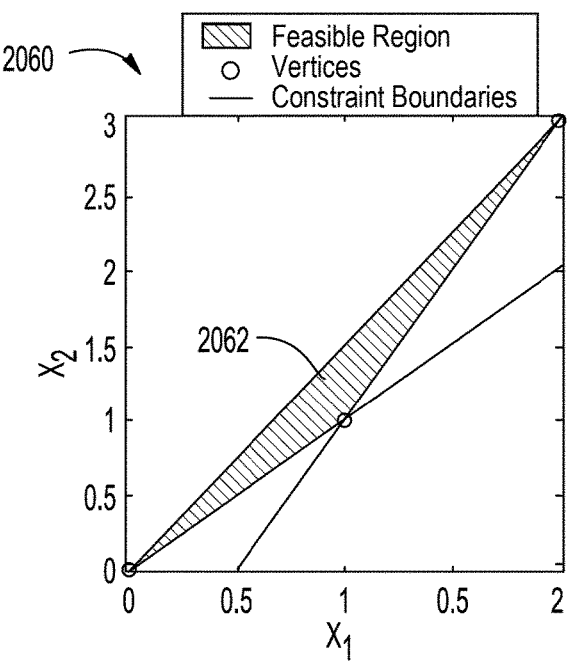

In some embodiments, box constraints module 1208 removes a middle portion of a convex region from the operational domain. This is referred to as splitting the convex region and is shown graphically in FIGS. 19A-19B. For example, FIG. 19A is a graph 1900 of an operational domain which includes a convex region CR-2. A first part 1902 of the convex region CR-2 is within the operational range between lower bound 1908 and upper bound 1910. Similarly, a third part 1906 of the convex region CR-2 is within the operational range between lower bound 1912 and upper bound 1914. However, a second part 1904 of the convex region CR-2 is outside the split operational range. Box constraints module 1208 can remove the second part 1904 from the convex region CR-2 by imposing two box constraints that limit the independent variable (i.e., chilled water production) within the operational ranges. The splitting operation results two smaller convex regions CR-2 and CR-3 shown in graph 1950.

In some embodiments, box constraints module 1208 removes a convex region entirely. This operation can be performed when a convex region lies entirely outside the admissible operating range. Removing an entire convex region can be accomplished by imposing a box constraint that limits the independent variable within the admissible operating range. In some embodiments, box constraints module 1208 merges two or more separate convex regions. The merging operation effectively reduces the model fidelity (described in greater detail below).

Box constraints module 1208 can automatically update the operational domain in response to a determination that one or more devices of the subplant are offline or otherwise unavailable for use. In some embodiments, a flag is set in the operational tool when a device becomes unavailable. Box constraints module 1208 can detect such an event and can queue the generation of an updated operational domain by querying the resulting high level subplant operational domain. In other words, the high level subplant operational domain for the subplant resulting from the collection of devices that remain available can be sampled and the operational domain can be constructed as described in process 1400. The generation of the updated operational domain may occur outside of the high level optimization algorithm in another computer process. Once the constraint generation process is complete, the operational domain data can be put into the data model and used in the optimization problem instead of the fast update method performed by box constraints module 1208.

Cross Section Constraints

Still referring to FIG. 12, operational domain module 904 is shown to include a cross section constraints module 1210. Cross section constraints module 1210 can be configured to modify the constraints on the high level optimization when one or more optimization variables are treated as fixed parameters. When the high level subplant operational domain includes additional parameters, the data sampled from the high level operational domain is of higher dimension than what is used in the optimization. For example, the chiller subplant operational domain may be three dimensional to include the electricity usage as a function of the chilled water production and the condenser water temperature. However, in the optimization problem, the condenser water temperature may be treated as a parameter.

The constraint generation process (described above) may be used with the higher dimensional sampled data of the subplant operational domain. This results in the following constraints being generated:

$$A_{x,j}x_j + A_{z,j}z_j + A_{y,j}y_j \leq b_j$$

$$H_{x,j}x_j + H_{z,j}z_j + H_{y,j}y_j = g_j$$

$$x_{lb,j} \leq x_j \leq x_{ub,j}$$

$$z_{lb,j} \leq z_j \leq z_{ub,j}$$

$$z_j = \text{integer}$$

where $x_j$ is a vector consisting of the continuous decision variables, $z_j$ is a vector consisting of the discrete decision variables, $y_j$ is a vector consisting of all the parameters, and $H_{y,j}$ and $A_{y,j}$ are the constraint matrices associated with the parameters. Cross section constraints module 1210 can be configured to modify the constraints such that the operational domain is limited to a cross section of the original operational domain. The cross section may include all of the points that have the same fixed value for the parameters.

In some embodiments, cross section constraints module 1210 retains the parameters in vector $y_j$ as decision variables in the optimization problem, bus uses equality constraints to ensure that they are set to their actual values. The resulting constraints used in the optimization problem are given by:

$$A_{x,j}x_j + A_{z,j}z_j + A_{y,j}y_j \leq b_j$$

$$H_{x,j}x_j + H_{z,j}z_j + H_{y,j}y_j = g_j$$

$$x_{lb,j} \leq x_j \leq x_{ub,j}$$

$$z_{lb,j} \leq z_j \leq z_{ub,j}$$

$$z_j = \text{integer}$$

where p is a vector of fixed values (e.g., measured or estimated parameter values).

In other embodiments, cross section constraints module 1210 substitutes values for the parameters before setting up and solving the optimization problem. This method reduces the dimension of the constraints and the optimization problem, which may be computationally desirable. Assuming that the parameters are either measured or estimated quantities (e.g., in the case of the condenser water temperature, the temperature may be measured), the parameter values may be substituted into the constraints. The resulting constraints used in the optimization problem are given by:

$$A_{x,j}x_j + A_{z,j}z_j \leq \overline{b}_j$$

$$H_{x,j}x_j + H_{z,j}z_j = \overline{g}_j$$

$$x_{lb,j} \leq x_j \leq x_{ub,j}$$

$$z_{lb,j} \leq z_j \leq z_{ub,j}$$

$$z_j = \text{integer}$$

where $\overline{b}_j = b_j - A_{y,j}p$ and $\overline{g}_j = g_j - H_{y,j}p$

In some embodiments, cross section constraints module 1210 is configured to detect and remove redundant constraints. It is possible that there are redundant constraints after taking a cross section of the constraints. Being computationally mindful, it is desirable to automatically detect and remove redundant constraints. Cross section constraints module 1210 can detect redundant constraints by computing the vertices of the corresponding dual polytope and computing the convex hull of the dual polytope vertices. Cross section constraints module 1210 can identify any vertices contained in the interior of the convex hull as redundant constraints.

The following example illustrates the automatic detection and removal of redundant constraints by cross section constraints module 1210. Consider a polytope described by the inequality constraints Ax≤b. In this example, only an individual polytope or convex region of the operational domain is considered, whereas the previous set of constraints describe the entire operational domain. Cross section constraints module 1210 can be configured to identify any point c that lies strictly on the interior of the polytope (i.e., such that Ac≤b). These points can be identified by least squares or computing the analytic center of the polytope. Cross section constraints module 1210 can then shift the polytope such that the origin is contained in the interior of the polytope. The shifted coordinates for the polytope can be defined as $\overline{x} = x - c$. After shifting the polytope, cross section constraints module 1210 can compute the vertices of the dual polytope. If the polytope is defined as the set P={x: Ax≤b}, then the dual polytope is the set P*={y: $y^Tx \leq 1$, $\forall x \in P$}. Cross section constraints module 1210 can then compute the convex hull of the dual polytope vertices. If a vertex of the dual polytope is not a vertex of the convex hull, cross section constraints module 1210 can identify the corresponding constraint as redundant and may remove the redundant constraint.

Referring now to FIGS. 20A-20D, several graphs 2000, 2020, 2040, and 2060 illustrating the redundant constraint detection and removal process are shown, according to an exemplary embodiment. Graph 2000 is shown to include the boundaries 2002 of several constraints computed after taking the cross section of higher dimensional constraints. The constraints bounded by boundaries 2002 are represented by the following inequalities:

$$x_1 - x_2 \leq -1$$

$$2x_1 - x_2 \leq 1$$

$$-3/2 x_1 + x_2 \leq 0$$

$$-x_1 + x_2 \leq 0$$

The operational domain is represented by a polytope with vertices 2006. Point 2004 can be identified as a point that lies strictly on the interior of the polytope.

Graph 2020 shows the result of shifting the polytope such that the origin is contained in the interior of the polytope. The polytope is shifted to a new coordinate system (i.e., $\overline{x}_1$ and $\overline{x}_2$) with the origin 2022 (i.e., $\overline{x}_1=0$ and $\overline{x}_2=0$) located within the polytope. Graph 2040 shows the result of computing the vertices 2044 of the dual polytope 2042, which may be defined by the set P*={y: $y^Tx \leq 1$, $\forall x \in P$}. Graph 2060 shows the result of computing the convex hull of the dual polytope vertices 2044 and removing any constraints that correspond to vertices 2044 of the dual polytope but not to vertices of the convex hull. In this example, the constraint $x_1 - x_2 \leq -1$ is removed, resulting in the feasible region 2062.

Figure 21A:
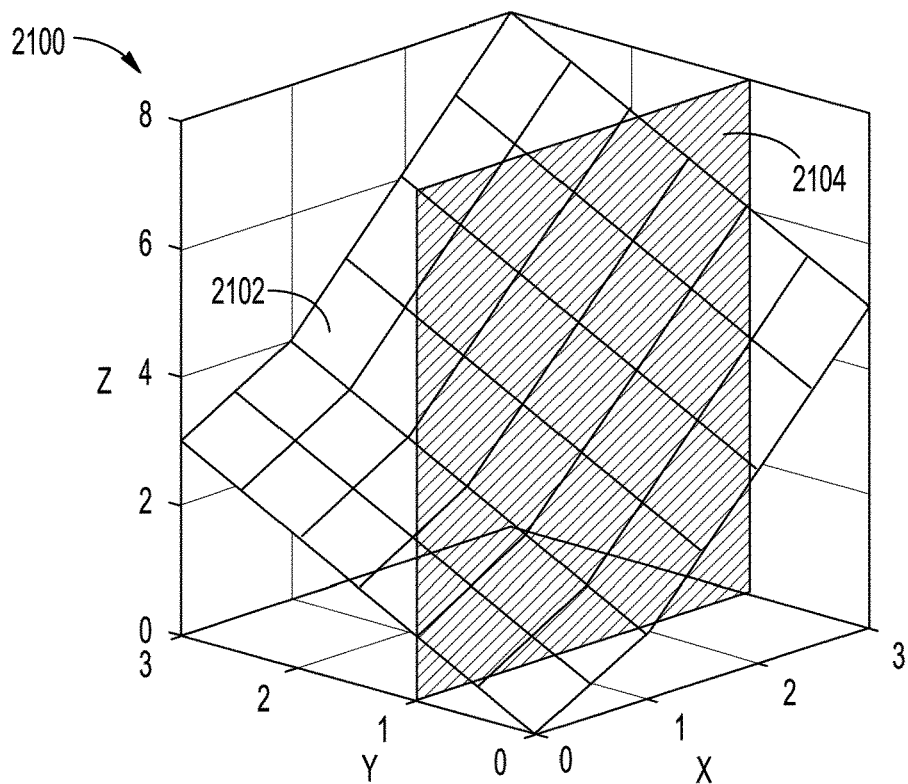
FIG. 21A is a graph of a three-dimensional operational domain with a cross-section defined by a fixed parameter, according to some embodiments.
Figure 21B:
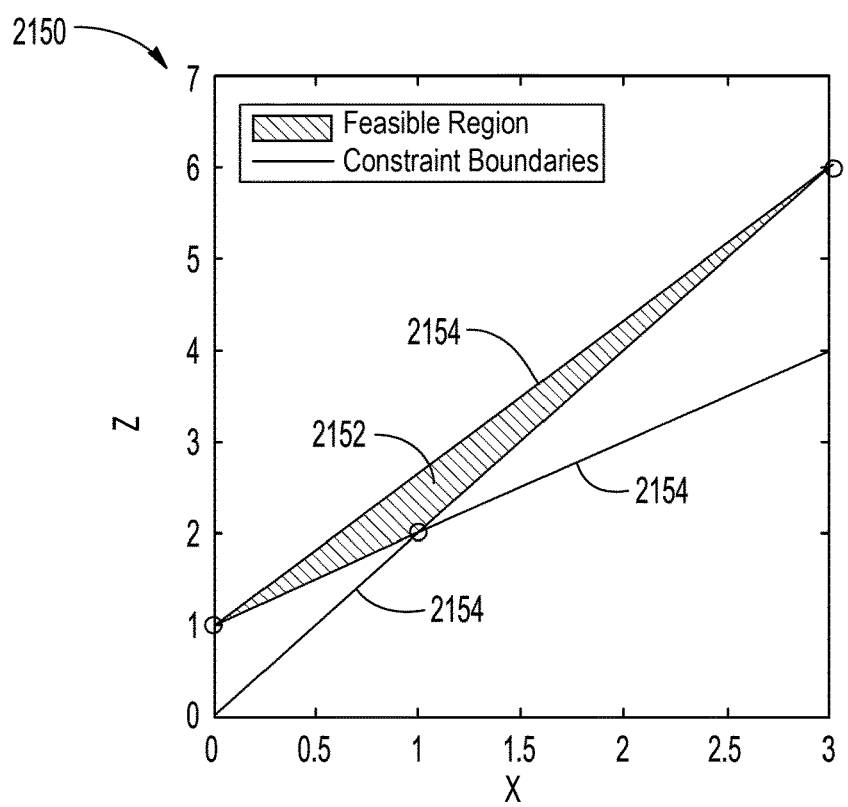
FIG. 21B is a graph of a two-dimensional operational domain which can be generated based on the cross-section shown in the graph of FIG. 21A, according to some embodiments.

Referring now to FIGS. 21A-21B, graphs 2100 and 2150 illustrating the cross section constraint generation process performed by cross section constraints module 1210 is shown, according to an exemplary embodiment. Graph 2100 is a three-dimensional graph having an x-axis, a y-axis, and a z-axis. Each of the variables x, y, and z may be treated as optimization variables in a high level optimization problem. Graph 2100 is shown to include a three-dimensional surface 2100 defined by the following equations:

$$z = \begin{cases} x + y, & \text{if } x \in [0, 1] \\ 2x + y - 1, & \text{if } x \in [1, 2] \end{cases}$$

for $x \in [0,2]$ and $y \in [0,3]$, where x is the subplant production, y is a parameter, and z is the amount of resources consumed.

A three-dimensional subplant operational domain is bounded surface 2102. The three-dimensional operational domain is described by the following set of constraints:

$$-\frac{5}{3x} - y + z \leq 0$$

$$-y \leq 0$$

$$y \leq 3$$

$$x + y - z \leq 0$$

$$2x + y - z \leq 1$$

The cross section constraint generation process can be applied to the three dimensional operational domain. When variable y is treated as a fixed parameter (i.e., y=1), the three-dimensional operational domain can be limited to the cross section 2104 along the plane y=1. Cross section constraints module 1210 can generate the following cross section constraints to represent the two-dimensional cross section of the original three-dimensional operational domain:

$$-\frac{5}{3x} + z \leq 1$$

$$x - z \leq -1$$

$$2x - z \leq 0$$

which are represented by boundaries 2154 in graph 2150. The resulting two-dimensional operational domain is shown as feasible region 2152 in graph 2150.

Rate of Change Penalties

Referring again to FIG. 12, operational domain module 904 is shown to include a rate of change penalties module 1212. Rate of change penalties module 1212 can be configured to modify the high level optimization problem to add rate of change penalties for one or more of the decision variables. Large changes in decision variable values between consecutive time steps may result in a solution that may not be physically implementable. Rate of change penalties prevent computing solutions with large changes in the decision variables between consecutive time steps. In some embodiments, the rate of change penalties have the form:

$$c_{\Delta x,k}|\Delta x_k| = c_{\Delta x,k}|x_k - x_{k-1}|$$

where $x_k$ denotes the value of the decision variable x at time step k, $x_{k-1}$ denotes the variable value at time step k−1, and $c_{\Delta x,k}$ is the penalty weight for the rate of change of the variable at the kth time step.

In some embodiments, rate of change penalties module 1212 introduces an auxiliary variable $\Delta x_k$ for $k \in \{1, \ldots, h\}$, which represents the rate of change of the decision variable x. This may allow asset allocator 402 to solve the high level optimization with the rate of change penalty using linear programming. Rate of change penalties module 1212 may add the following constraints to the optimization problem to ensure that the auxiliary variable is equal to the rate of change of x at each time step in the optimization period:

$$x_{k-1} - x_k \leq \Delta x_k$$

$$x_k - x_{k-1} \leq \Delta x_k$$

$$\Delta x_k \geq 0$$

for all $k \in \{1, \ldots, h\}$, where h is the number of time steps in the optimization period.

The inequality constraints associated with the rate of change penalties may have the following structure:

$$\begin{bmatrix} \ddots & \vdots & \vdots & \vdots & \vdots & \vdots & \vdots & \vdots & \iddots \\ \ldots & -1 & 0 & 0 & \ldots & -1 & 0 & 0 & \ldots \\ \ldots & 1 & 0 & 0 & \ldots & -1 & 0 & 0 & \ldots \\ \ldots & 1 & -1 & 0 & \ldots & 0 & -1 & 0 & \ldots \\ \ldots & -1 & 1 & 0 & \ldots & 0 & -1 & 0 & \ldots \\ \ldots & 0 & 1 & -1 & \ldots & 0 & 0 & -1 & \ldots \\ \ldots & 0 & -1 & 1 & \ldots & 0 & 0 & -1 & \ldots \\ \iddots & \vdots & \vdots & \vdots & \vdots & \vdots & \vdots & \vdots & \ddots \end{bmatrix} \begin{bmatrix} \vdots \\ x_1 \\ x_2 \\ x_3 \\ \vdots \\ \Delta x_1 \\ \Delta x_2 \\ \Delta x_3 \\ \vdots \end{bmatrix} \leq \begin{bmatrix} \vdots \\ -x_0 \\ x_0 \\ 0 \\ 0 \\ 0 \\ 0 \\ \vdots \end{bmatrix}$$

Rate of Change Constraints

Still referring to FIG. 12, operational domain module 904 is shown to include a rate of change constraints module 1214. A more strict method that prevents large changes in decision variable values between consecutive time steps is to impose (hard) rate of change constraints. For example, the following constraint can be used to constrain the rate of change $\Delta x_k$ between upper bounds $\Delta x_{ub,k}$ and lower bounds $\Delta x_{lb,k}$ $$\Delta x_{lb,k} \leq \Delta x_k \leq \Delta x_{ub,k}$$

where $\Delta x_k = x_k - x_{k-1}$, $\Delta x_{lb,k} < 0$, and $\Delta x_{ub,k} > 0$.

The inequality constraints associated with these rate of change constraints are given by the following structure:

$$\begin{bmatrix} \ddots & \vdots & \vdots & \vdots & \vdots & \vdots & \iddots \\ \ldots & -1 & 0 & 0 & \ldots & 0 & \ldots \\ \ldots & 1 & 0 & 0 & \ldots & 0 & \ldots \\ \ldots & 1 & -1 & 0 & \ldots & 0 & \ldots \\ \ldots & -1 & 1 & 0 & \ldots & 0 & \ldots \\ \ldots & 0 & 1 & -1 & \ldots & 0 & \ldots \\ \ldots & 0 & -1 & 1 & \ldots & 0 & \ldots \\ \ldots & \vdots & \vdots & \vdots & \ddots & \vdots & \ldots \\ \ldots & 0 & 0 & 0 & \ldots & -1 & \ldots \\ \ldots & 0 & 0 & 0 & \ldots & 1 & \ldots \\ \iddots & \vdots & \vdots & \vdots & \vdots & \vdots & \ddots \end{bmatrix} \begin{bmatrix} \vdots \\ x_1 \\ x_2 \\ x_3 \\ \vdots \\ x_h \\ \vdots \end{bmatrix} \leq \begin{bmatrix} \vdots \\ -\Delta x_{lb,k} - x_0 \\ \Delta x_{ub,k} + x_0 \\ -\Delta x_{lb,k} \\ \Delta x_{ub,k} \\ -\Delta x_{lb,k} \\ \Delta x_{ub,k} \\ \vdots \end{bmatrix}$$

Storage/Airside Constraints

Still referring to FIG. 12, operational domain module 904 is shown to include a storage/airside constraints module 1216. Storage/airside constraints module 1216 can be configured to modify the high level optimization problem to account for energy storage in the air or mass of the building. To predict the state of charge of such storage a dynamic model can be solved. Storage/airside constraints module 1216 can use a single shooting method or a multiple shooting method to embed the solution of a dynamic model within the optimization problem. Both the single shooting method and the multiple shooting method are described in detail below.

In the single shooting method, consider a general discrete-time linear dynamic model of the form:

$$x_{k+1} = Ax_k + Bu_k$$

where $x_k$ denotes the state (e.g., state of charge) at time k and $u_k$ denotes the input at time k. In general, both the state $x_k$ and input $u_k$ may be vectors. To solve the dynamic model over h time steps, storage/airside constraints module 1216 may identify the initial condition and an input trajectory/sequence. In an optimal control framework, the input trajectory can be determined by the optimization solver. Without loss of generality, the time interval over which the dynamic model is solved is taken to be the interval [0, h]. The initial condition is denoted by $x_0$.

The state $x_k$ and input $u_k$ can be constrained by the following box constraints:

$$x_{lb,k} \leq x_k \leq x_{ub,k}$$

$$u_{lb,k} \leq u_k \leq u_{ub,k}$$

for all k, where $x_{lb,k}$ is the lower bound on the state $x_k$, $x_{ub,k}$ is the upper bound on the state $x_k$, $u_{lb,k}$ is the lower bound on the input $u_k$, and $u_{ub,k}$ is the upper bound on the input $u_k$. In some embodiments, the bounds may be time-dependent.

In the single shooting method, only the input sequence may be included as a decision variable because the state $x_k$ at any given time step is a function of the initial condition $x_0$ and the input trajectory. This strategy has less decision variables in the optimization problem than the second method, which is presented below. The inequality constraints associated with the upper bound on the state $x_k$ may have the following structure:

$$\begin{bmatrix} \ddots & \vdots & \vdots & \vdots & \vdots & \vdots & \vdots \\ \cdots & B & 0 & 0 & \cdots & 0 & \cdots \\ \cdots & AB & B & 0 & \cdots & 0 & \cdots \\ \cdots & A^2B & AB & B & \cdots & 0 & \cdots \\ \cdots & \vdots & \vdots & \vdots & \ddots & \vdots & \cdots \\ \cdots & A^{h-1}B & A^{h-2}B & A^{h-3}B & \cdots & B & \cdots \\ \cdot^{\cdot^{\cdot}} & \vdots & \vdots & \vdots & \vdots & \vdots & \ddots \end{bmatrix} \begin{bmatrix} \vdots \\ u_0 \\ u_1 \\ u_2 \\ \vdots \\ u_{h-1} \\ \vdots \end{bmatrix} \leq \begin{bmatrix} \vdots \\ x_{ub,1} - Ax_0 \\ x_{ub,2} - A^2 x_0 \\ x_{ub,3} - A^3 x_0 \\ \vdots \\ x_{ub,h} - A^h x_0 \\ \vdots \end{bmatrix}$$

Similarly, the inequality constraints associated with the lower bound on the state $x_k$ may have the following structure:

$$\begin{bmatrix} \ddots & \vdots & \vdots & \vdots & \vdots & \vdots & \vdots \\ \cdots & -B & 0 & 0 & \cdots & 0 & \cdots \\ \cdots & -AB & -B & 0 & \cdots & 0 & \cdots \\ \cdots & -A^2B & -AB & -B & \cdots & 0 & \cdots \\ \cdots & \vdots & \vdots & \vdots & \ddots & \vdots & \cdots \\ \cdots & -A^{h-1}B & -A^{h-2}B & -A^{h-3}B & \cdots & -B & \cdots \\ \cdot^{\cdot^{\cdot}} & \vdots & \vdots & \vdots & \vdots & \vdots & \ddots \end{bmatrix} \begin{bmatrix} \vdots \\ u_0 \\ u_1 \\ u_2 \\ \vdots \\ u_{h-1} \\ \vdots \end{bmatrix} \leq \begin{bmatrix} \vdots \\ Ax_0 - x_{lb,1} \\ A^2 x_0 - x_{lb,2} \\ A^3 x_0 - x_{lb,3} \\ \vdots \\ A^h x_0 - x_{lb,h} \\ \vdots \end{bmatrix}$$

In some embodiments, more general constraints or mixed constraints may also be considered. These constraints may have the following form:

$$A_{ineq,x}(k) + A_{ineq,u} u(k) \leq b_{ineq}$$

The inequality constraint structure associated with the single shooting strategy and the mixed constraints may have the form:

$$\begin{bmatrix} \ddots & \vdots & \vdots & \vdots & \vdots & \vdots \\ \cdots & A_{ineq,u} & 0 & 0 & \cdots & 0 & \cdots \\ \cdots & A_{ineq,x}B + A_{ineq,u} & 0 & 0 & \cdots & 0 & \cdots \\ \cdots & A_{ineq,x}AB & A_{ineq,x}B + A_{ineq,u} & 0 & \cdots & 0 & \cdots \\ \cdots & A_{ineq,x}A^2B & A_{ineq,x}AB & A_{ineq,x}B + A_{ineq,u} & \cdots & 0 & \cdots \\ \cdots & \vdots & \vdots & \vdots & \ddots & \vdots & \cdots \\ \cdots & A_{ineq,x}A^{h-2}B & A_{ineq,x}A^{h-3}B & A_{ineq,x}A^{h-4}B & \cdots & A_{ineq,x}B + A_{ineq,u} & \cdots \\ \cdot^{\cdot^{\cdot}} & \vdots & \vdots & \vdots & \vdots & \vdots & \ddots \end{bmatrix}$$

$$\begin{bmatrix} \vdots \\ u_0 \\ u_1 \\ u_2 \\ \vdots \\ u_{h-1} \\ \vdots \end{bmatrix} \leq \begin{bmatrix} \vdots \\ b_{ineq} - A_{ineq,x} x(0) \\ b_{ineq} - A_{ineq,x} A x(0) \\ b_{ineq} - A_{ineq,x} A^2 x(0) \\ \vdots \\ b_{ineq} - A_{ineq,x} A^{h-1} x(0) \\ \vdots \end{bmatrix}$$

In the multiple shooting method, storage/airside constraints module 1216 may include the state sequence as a decision variable in the optimization problem. This results in an optimization problem with more decision variables than the single shooting method. However, the multiple shooting method typically has more desirable numerical properties, resulting in an easier problem to solve even though the resulting optimization problem has more decision variables than that of the single shooting method.

To ensure that the state and input trajectories (sequences) satisfy the model of $x_{k+1} = Ax_k + Bu_k$, the following equality constraints can be used:

$$\begin{bmatrix} \ddots & \vdots & \vdots & \vdots & \vdots & \vdots & \vdots & \vdots & \vdots & \vdots \\ \cdots & -I & 0 & \cdots & 0 & 0 & B & 0 & 0 & \cdots & 0 & \cdots \\ \cdots & A & -I & \cdots & 0 & 0 & 0 & B & 0 & \cdots & 0 & \cdots \\ \cdots & 0 & A & \cdots & 0 & 0 & 0 & 0 & B & \cdots & 0 & \cdots \\ \cdots & \vdots & \vdots & \ddots & -I & 0 & \vdots & \vdots & \ddots & \vdots & \cdots \\ \cdots & 0 & 0 & \cdots & A & -I & 0 & 0 & 0 & \cdots & B & \cdots \\ \cdot^{\cdot^{\cdot}} & \vdots & \vdots & \cdots & \vdots & \vdots & \vdots & \vdots & \vdots & \vdots & \ddots \end{bmatrix} \begin{bmatrix} \vdots \\ x_1 \\ \vdots \\ x_{h-1} \\ x_h \\ u_1 \\ \vdots \\ u_{h-1} \\ \vdots \end{bmatrix} \leq \begin{bmatrix} \vdots \\ -Ax_0 \\ 0 \\ 0 \\ \vdots \\ 0 \\ \vdots \end{bmatrix}$$

where I is an identity matrix of the same dimension as A. The bound constraints on the state $x_k$ and inputs $u_k$ can readily be included since the vector of decision variables may include both the state $x_k$ and inputs $u_k$.

Mixed constraints of the form $A_{ineq,x}(k) + A_{ineq,u} u(k) \leq b_{ineq}$ can also be used in the multiple shooting method. These mixed constraints result in the following structure:

$$\begin{bmatrix} \ddots & \vdots & \vdots & \vdots & \vdots & \vdots & \vdots & \vdots \\ \cdots & 0 & \cdots & 0 & 0 & A_{ineq,u} & 0 & \cdots & 0 & \cdots \\ \cdots & A_{ineq,x} & \cdots & 0 & 0 & 0 & A_{ineq,u} & \cdots & 0 & \cdots \\ \cdots & \vdots & \ddots & \vdots & \vdots & \vdots & \vdots & \ddots & 0 & \cdots \\ \cdots & 0 & \cdots & A_{ineq,x} & 0 & 0 & 0 & \cdots & A_{ineq,u} & \cdots \\ \cdot^{\cdot^{\cdot}} & \vdots & \cdots & \vdots & \vdots & \vdots & \vdots & \vdots & \vdots & \ddots \end{bmatrix}$$

$$\begin{bmatrix} \vdots \\ x_1 \\ \vdots \\ x_{h-1} \\ x_h \\ u_1 \\ \vdots \\ u_{h-1} \\ \vdots \end{bmatrix} \leq \begin{bmatrix} \vdots \\ b_{ineq} - A_{ineq,x} x(0) \\ b_{ineq} \\ \vdots \\ b_{ineq} \\ \vdots \end{bmatrix}$$

Utilizing CAD/BIM Files for MPC Problem Formulation

Overview

Referring generally to FIGS. 22-27, systems and methods for extracting/determining information based computer aided design (CAD) files and/or building information modeling (BIM) files are shown, according to some embodiments. A CAD/BIM file can be used to identify information describing a building, spaces within the building (e.g., zones of the building), and/or other components of the building (e.g., building equipment, building materials used in the building, etc.). For example, a CAD/BIM file can contain information such as building orientation, sizes of zones in the building, locations of building equipment, thermal dynamics of zones, etc. This information can be used in defining optimization problems in model predictive control (MPC), automatic refrigerant charging control, and/or other related controls. However, the CAD/BIM files may lack information regarding various building properties (e.g., additional information on building equipment, additional building layout information, thermal properties of the building, etc.) that can be helpful for determining how to properly operate control systems and/or be helpful for other applications (e.g., data mining, reliability studies, etc.). For example, a CAD/BIM file may not contain information regarding piping length or piping diameter which can be useful for operating a variable refrigerant flow (VRF) system. To determine missing building property information, information included in the CAD/BIM file can be utilized. As such, the present disclosure details how building properties regarding a building can be identified and calculated based on information included in CAD/BIM files.

Utilizing the CAD/BIM files can be useful for reducing computational complexity of other applications. Particularly, identifying information contained in the CAD/BIM files and generating building property data based on the identified information can eliminate a need to perform a system identification. In some embodiments, performing a system identification is necessary for MPC to generate appropriate control decisions that maintain occupant comfort in a building and optimize (e.g., reduce) costs. Without the information based on the CAD/BIM file, system identification may be necessary to determine various aspects of a building (e.g., thermal properties of the buildings, zone groupings, what building equipment can be operated, etc.). System identification can be computationally intensive and can take significant amounts of time to perform. However, by utilizing the CAD/BIM file to determine information that would otherwise need to be determined by system identification, the need for system identification can be eliminated, thereby resulting in performance improvements for MPC.

Controller for Analyzing CAD/BIM Files

Figure 22:
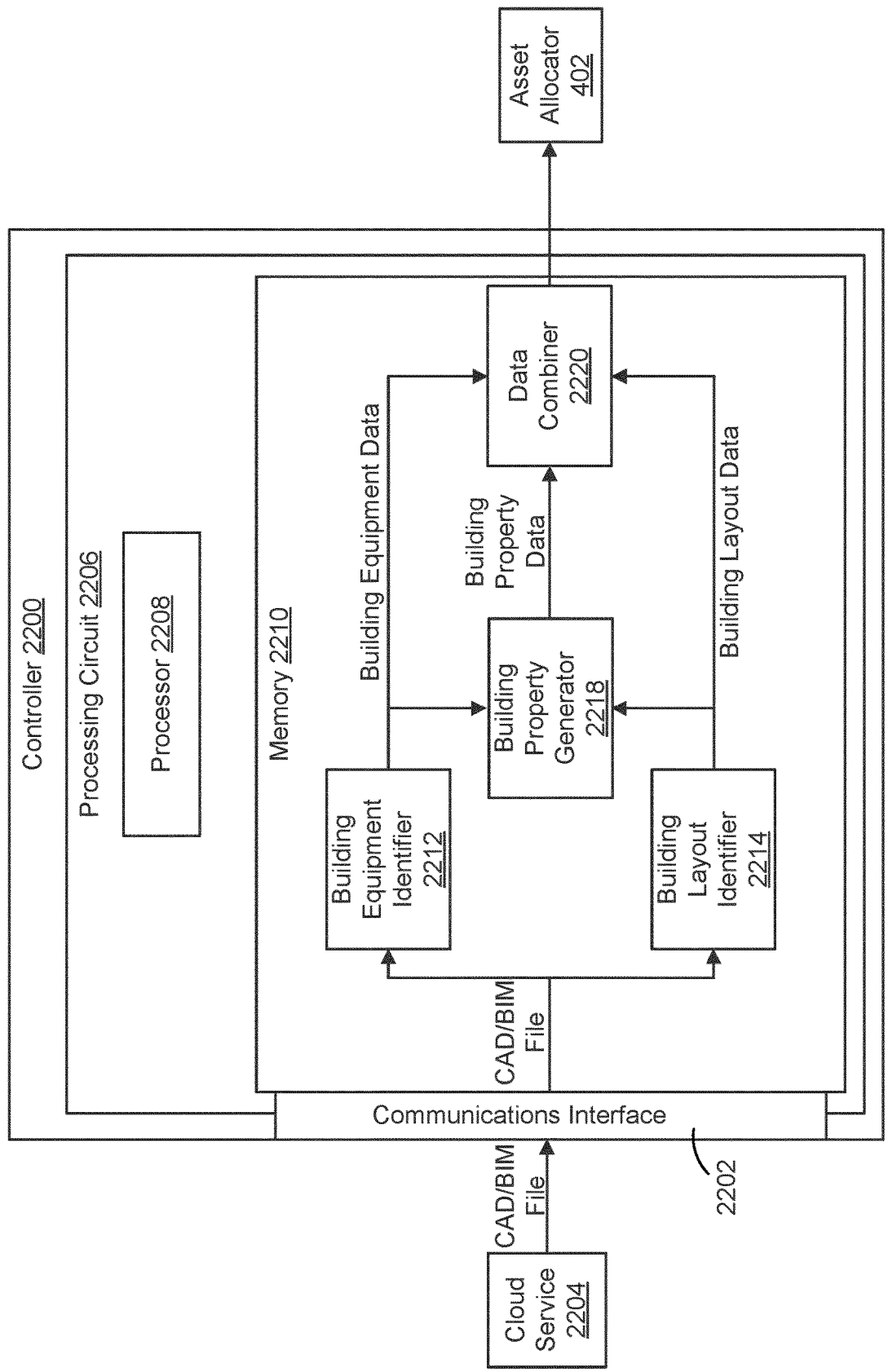
FIG. 22 is a block diagram of a controller including a building property generator for extracting information from CAD/BIM files, according to some embodiments.

Referring now to FIG. 22, a controller 2200 for extracting and parsing information from CAD/BIM files is shown, according to some embodiments. Controller 2200 is shown to receive a CAD/BIM file from a cloud service 2204. Cloud service 2204 can be hosted by any cloud provider capable of communicating with controller 2200. In some embodiments, controller 2200 is a part of cloud service 2204. In some embodiments, controller 2200 is not a part of cloud service 2204. If controller 2200 is not a part of cloud service 2204, controller 2200 can be configured to communicate with cloud service 2204 over various data transferring mediums. In some embodiments, the CAD/BIM file is received from another device/system instead of cloud service 2204. For example, the CAD/BIM file may be received by a user uploading the CAD/BIM file to controller 2200, from a local database storing the CAD/BIM file, etc.

Results of operations performed by controller 2200 can be useful in a variety of applications. For example, the results can be used to determine thermal resistance between zones. The results can be also be used, for example, to determine an initial zone grouping of the building, predict a heat load of heat-generating building equipment based on locations of the building equipment, and/or determine a hierarchy definition for MPC. As another example, the results can be used in an automatic refrigerant charging problem to determine a volume of refrigerant needed based on piping information. As another example, the results can be used to determine an automatic address setting and/or determine a thermodynamic inertia of a refrigerant cycle.

Controller 2200 is shown to include a communications interface 2202 and a processing circuit 2206. Communications interface 2202 may include wired or wireless interfaces (e.g., jacks, antennas, transmitters, receivers, transceivers, wire terminals, etc.) for conducting data communications with various systems, devices, or networks. For example, communications interface 2202 may include an Ethernet card and port for sending and receiving data via an Ethernet-based communications network and/or a WiFi transceiver for communicating via a wireless communications network. Communications interface 2202 may be configured to communicate via local area networks or wide area networks (e.g., the Internet, a building WAN, etc.) and may use a variety of communications protocols (e.g., BACnet, IP, LON, etc.).

Communications interface 2202 may be a network interface configured to facilitate electronic data communications between controller 2200 and various external systems or devices (e.g., cloud service 2204, asset allocator 402, etc.). For example, controller 2200 may receive a CAD/BIM file from cloud service 2204 indicating a building design of a building via communications interface 2202.

Still referring to FIG. 22, processing circuit 2206 is shown to include a processor 2208 and memory 2210. Processor 2208 may be a general purpose or specific purpose processor, an application specific integrated circuit (ASIC), one or more field programmable gate arrays (FPGAs), a group of processing components, or other suitable processing components. Processor 2208 may be configured to execute computer code or instructions stored in memory 2210 or received from other computer readable media (e.g., CDROM, network storage, a remote server, etc.).

Memory 2210 may include one or more devices (e.g., memory units, memory devices, storage devices, etc.) for storing data and/or computer code for completing and/or facilitating the various processes described in the present disclosure. Memory 2210 may include random access memory (RAM), read-only memory (ROM), hard drive storage, temporary storage, non-volatile memory, flash memory, optical memory, or any other suitable memory for storing software objects and/or computer instructions. Memory 2210 may include database components, object code components, script components, or any other type of information structure for supporting the various activities and information structures described in the present disclosure. Memory 2210 may be communicably connected to processor 2208 via processing circuit 2206 and may include computer code for executing (e.g., by processor 2208) one or more processes described herein.

Memory 2210 is shown to include a building equipment identifier 2212 and a building layout identifier 2214. Each identifier of identifiers 2212-2214 can receive the CAD/BIM file communicated to controller 2200. Each identifier of identifiers 2212-2214 can be configured to identify certain information included in the CAD/BIM file by parsing the CAD/BIM file. In some embodiments, one or more components of memory 2210 are a part of a combined component. For example, building equipment identifier 2212 and building layout identifier 2214 may be a singular component in memory 2210. However, each component of memory 2210 is shown independently for ease of explanation.

Building equipment identifier 2212 can be configured to identify building equipment by parsing the CAD/BIM file. For example, the CAD/BIM file may include an indoor unit (IDU) of a variable refrigerant flow (VRF) system corresponding to an actual device of the building. By identifying the building equipment of the CAD/BIM file, a control problem (e.g., an MPC problem) can utilize the identified building equipment to determine how to operate building devices of the building equipment to affect a variable state or condition of the building. The building equipment identified by building equipment identifier 2212 can also be used for formulating an optimization problem such as the optimization problem formulated by asset allocator 402 as described in greater detail above. By identifying the building equipment present in the building, control processes to maintain occupant comfort in the building can begin sooner and users may not be required to manually enter information regarding the building equipment for the building equipment to be considered when performing the control processes.

In some embodiments, building equipment identifier 2212 can determine/identify specific information regarding each building device of the building equipment included in the CAD/BIM file. For example, building equipment identifier 2212 may be able to determine information such as model numbers of building devices, brands of building devices, how much energy the building equipment consumes to affect a variable state or condition of a space in the building by a certain amount, etc. If information regarding a specific model of a building device is available, building equipment identifier 2212 may search for additional information regarding the building device. For example, based on a model number of a building device, building equipment identifier 2212 may search the Internet, a building equipment database including information regarding various building devices, etc. for information regarding the building device. If specific information of a building device is not available (e.g., no model number is listed, no brand is listed, etc.) from the CAD/BIM file, building equipment identifier 2212 may utilize a standard model of the building device until specifics of the building device are determined/identified. For example, if a heater of a heating, ventilation, or air conditioning (HVAC) system is included in the CAD/BIM file but no further information is extracted, building equipment identifier 2212 may utilize a standard model of a heater that includes information such as how much energy heaters consume on average, how long heaters take to adjust a temperature in a space of a building by a certain amount, etc. In this way, even if specific information regarding some building equipment is not available from the CAD/BIM file, the building equipment can nonetheless be modeled for use in building control.

In some embodiments, building equipment identifier 2212 identifies locations of the building equipment in the building included in the CAD/BIM file. For example, building equipment identifier 2212 may determine from the CAD/BIM file that an IDU of a VRF system is located in the center of a specific conference room on a third floor of the building. Based on the location of the IDU, additional information regarding how the IDU affects conditions of the specific conference room can be determined by a building property generator 2218 as described in greater detail below. In some embodiments, determinations regarding locations of building equipment in the building are made by building layout identifier 2214.

In some embodiments, building equipment identifier 2212 can identify actual physical connections between building devices. For example, the CAD/BIM file may include a model representing air ducts in the building described by the CAD/BIM file. As such, based on the CAD/BIM file, building equipment identifier 2212 can identify connections between the air ducts and various building equipment. As a more specific example, if the CAD/BIM file indicates the building has a first AHU with air ducts leading to a first zone and a second AHU with air ducts leading to a second zone, building equipment identifier 2212 can determine that the first AHU can operate to affect conditions of the first zone whereas the second AHU can operate to affect conditions of the second zone based on the air ducts. In the specific example, physical connections between the AHUs and the air ducts can be used to determine which AHU(s) affect specific areas of the building and how the AHUs are related to each other. More generally, identification of physical connections between building devices performed by building equipment identifier 2212 can be useful for determining relationships between building devices and how building devices affect conditions within the building.

Memory 2210 is also shown to include building layout identifier 2214. Building layout identifier 2214 can be configured to determine information regarding how the building indicated by the CAD/BIM file is arranged by parsing the CAD/BIM file. For example, building layout identifier 2214 can determine information such as an orientation of the building, locations of spaces (e.g., rooms, hallways, etc.) in the building, a size of said spaces, etc. based on the CAD/BIM file. By determining a layout of the building from the CAD/BIM file, a control process can more easily identify spaces in the building that require conditions to be controlled and/or how the layout of the building may result to changes to environmental conditions of the building. For example, building layout identifier 2214 can identify a direction (e.g., north, south, east, west, etc.) of spaces in the building. Depending on a direction a space is facing, information such as incoming solar radiation can be calculated by building property generator 2218.

As described above, building layout identifier 2214 may be able to determine locations of the building equipment identified by building equipment identifier 2212 in the building. By determining locations of the building equipment in the building, the building equipment can be associated with certain spaces of the building for use in control processes and/or other applications. For example, if a temperature of a space A is required to be increased, a control process (e.g., MPC) may determine how building equipment in space A can be operated to increase the temperature. The control process may disregard building equipment associated with other spaces in the building if determining how to affect the temperature of space A.

Still referring to FIG. 22, building property generator 2218 is shown to receive building equipment data from building equipment identifier 2212 and building layout data from building layout identifier 2214. Building property generator 2218 can be configured to generate building property data regarding the building based on the building equipment data and the building layout data that may be useful for performing control processes and/or other activities. As the CAD/BIM file may be created for purposes to describe how the building is structured and/or designed, the CAD/BIM file may not directly indicate information that can be useful for operation of the building such as, for example, thermal properties of the system, efficiency of building equipment, etc. As such, building property generator 2218 can determine information useful for operation of the building not directly indicated by the CAD/BIM file.

Based on data received from identifiers 2212 and 2214, building property generator 2218 can generate additional building property data describing the building. For example, building property generator 2218 can utilize the building equipment data and the building layout data to calculate how environmental conditions (e.g., temperature, humidity, air quality, lighting, etc.) of the building may vary and/or how the building equipment can be operated to affect said environmental conditions. Some examples of data that building property generator 2218 can generate are explained in greater detail below with reference to FIG. 23. It should be noted that each example is for illustrative purposes. The information determined by building property generator 2218 may include less, the same, or more building property data than as described below. In some embodiments, building property generator 2218 is configured to generate/calculate as much data regarding the building based on the CAD/BIM file as possible. In some embodiments, building property generator 2218 determines what data is required for performing specific activities (e.g., MPC, determining initial zone groupings, automatic address setting, etc.) and only generates/calculates the required data for each activity.

Building property generator 2218 can be utilized to automatically generate any building property data that may be useful in various applications (e.g., MPC, data mining, reliability studies, etc.). In some embodiments, building property generator 2218 flags information that cannot be determined based on the building equipment data and/or the building layout data. The flagged information can be communicated to another system/controller for further inspection and/or can be sent to a user to manually enter the missing building properties. Flagging information may ensure that building properties useful for the various applications can be gathered (e.g., manually) even if building property generator 2218 is not able to generate said information. For example, if the CAD/BIM file does not directly indicate a model number of an IDU, building property generator 2218 may not be able to determine circuiting of the IDU. Building property generator 2218 can flag the model number as missing such that a user can manually enter the model number. If the model number is entered by the user, building property generator 2218 can calculate the circuiting of the IDU. In this way, an amount of data collected that is useful to the various applications can be maximized, thereby improving results of each of the various applications. In some embodiments, if building property generator 2218 determines some information cannot be determined based on the building equipment data and/or the building layout data, building property generator 2218 may trigger a system identification experiment to acquire any missing information. In some embodiments, the system identification experiment is triggered as a result of flagging information as missing and providing the flagged information to asset allocator 402. In some embodiments, building property generator 2218 directly notifies asset allocator 402 to perform the system identification experiment. In some embodiments, building property generator 2218 performs the system identification experiment. In some embodiments, system identification experiments that can be triggered by building property generator 2218 are described in greater detail in U.S. patent application Ser. No. 16/513,054 filed Jul. 16, 2019, the entirety of which is incorporated by reference herein.

Memory 2210 is also shown to include a data combiner 2220. Data combiner 2220 is shown to receive the building equipment data from building equipment identifier 2212, the building layout data from building layout identifier 2214, and building property data from building property generator 2218. In some embodiments, data combiner 2220 generates a combined data set including all the received data (i.e., the building equipment data, the building layout data, and the building property data). In some embodiments, data combiner 2220 determines what received data is relevant to include in the combine data set for various applications. For example, data combiner 2220 may determine what information is relevant for formulating an optimization problem for use in MWC for the building indicated by the CAD/BIM file. Some information provided by building equipment identifier 2212, building layout identifier 2214, and/or building property generator 2218 may not be necessary for formulation of the optimization problem. As such, data combiner 2220 can eliminate the unnecessary information so that it is not considered during formulation of the optimization problem. By reducing an amount of information considered during optimization problem formulation, processing requirements for the formulation are decreased, thereby allowing the formulation to be performed by less computationally powerful devices.

In some embodiments, the combined data set includes a thermal model of the building and/or a space therein (e.g., a zone). The thermal model can be generated using thermal properties determined based on the CAD/BIM file. Thermal properties can include any information indicated by the CAD/BIM file describing how the building is affected by various thermal dynamics. For example, the thermal properties may include an insulation factor of windows and walls indicating how heat is stored in a space of the building. Said insulation factor can be used to predict information such as a thermal capacity of a space, a resistance of the space based on a material of the walls (e.g., wood, cement, drywall, etc.), etc. As another example, the thermal properties can include how operation of building equipment affects temperature and/or other environmental conditions of the building. Particularly, the thermal properties can be used to predict a temperature in a space of the building based on how building equipment is operated (e.g., based on an operating setpoint of the building equipment). To generate the thermal model, a component of memory 2210 (e.g., data combiner 2220 or building property generator 2218) can determine how thermal characteristics (e.g., temperature) of the building are affected based on the thermal properties. For example, the thermal model can capture how operation of building equipment can increase/decrease temperature of the building and how much changes in external temperatures affect the building. The thermal model can also capture information such as, for example, how weather changes, electronics, people, insulation, etc. affect thermal characteristics (e.g., temperature) of the building.

The thermal model can be utilized to predict environmental changes of the building based on known inputs. The inputs can include information such as, for example, weather conditions, effects of building equipment operation, airflow information within the building, heat emitted by people and/or electronics, etc. For example, if the thermal model is a mathematical model, the thermal model can predict temperature changes of the building based on various inputs such as external temperature, a number of occupants in the building, etc. The thermal model can be particularly useful to asset allocator 402 to properly model how characteristics of the building change over time based on various conditions.

In some embodiments, data combiner 2220 generates one or more zone models for zones of the building. A zone model can model thermal dynamics (e.g., similar to and/or the same as the thermal models described above) and/or any other dynamics of a zone. Zone models generated by data combiner 2220 can describe control relationships between building equipment (e.g., building equipment indicated by the building equipment data provided by building equipment identifier 2212) and variable states or conditions (e.g., environmental conditions) of a building. As described herein, a control relationship can define how building equipment can operate to affect some variable state or condition of a building. More particularly, a control relationship may describe how one or more building devices can operate to affect one or more environmental conditions of the building and how operation of the one or more building devices may affect other building devices. For example, a control relationship may describe how a chiller can operate to cool a zone by providing chilled fluid to an AHU such that the AHU can provide cooled air to the zone using the chilled fluid.

In some embodiments, zone models are considered causal relationship models. In this case, a zone model can define each building device, each space, and/or any other aspect/component of a building as an object. Based on the defined objects, a zone model can further define links between the objects and annotate types of relationships between each object. In some embodiments, the zone model is provided as a directed graph between objects such that edges of the directed graph can indicate the links and nodes of the directed graph can indicate the objects. For example, the zone model may define a first object (i.e., node) for a chiller, a second object for an AHU, and a third object for a zone. In this case, a relationship may be defined between the first object and the second object indicating that the chiller "provides chilled fluid to" the AHU. Another relationship may be defined between the second and third objects indicating that the AHU "provides cooled air to" the zone. In the example, control relationships are thus defined between the chiller, the AHU, and the zone. Specifically, a particular control relationship may describe that the chiller can be controlled to cool the zone by providing chilled fluid to the AHU.

In some embodiments, data combiner 2220 can use connections between devices (e.g., as indicated by the building equipment data provided by building equipment identifier 2212) to determine resource balance constraints. A resource balance constraint can be helpful in defining control relationships by defining how resources (e.g., electricity, water, etc.) are utilized and balance by various building devices. For example, if data combiner 2220 determines that a first chiller and a second chiller are connected to a single AHU based on the building equipment data, a resource balance constraint may be defined for the single AHU such that a total input to the single AHU is equal to an output of the first chiller plus an output of the second chiller. Such resource balance constraints can ensure that control relationships accurately reflect how building equipment operates to affect conditions within the building.

As another example of a zone model, data combiner 2220 may determine values of model parameters for a zone model describing thermal dynamics of a zone such that the zone model can be defined by the following differential equations:

$$C_{ia}\dot{T}_{ia} = \frac{1}{R_{mi}}(T_m - T_{ia}) + \frac{1}{R_{oi}}(T_{oa} - T_{ia}) + \dot{Q}_{HVAC} + \dot{Q}_{other}$$

$$C_m\dot{T}_m = \frac{1}{R_{mi}}(T_{ia} - T_m)$$

where $T_{ia}$ is an indoor air temperature, $T_{oa}$ is an outdoor air temperature, $T_m$ is a lumped thermal mass temperature, $C_m$ is a lumped mass thermal capacitance, $C_{ia}$ is an indoor air thermal capacitance, $R_{mi}$ is an indoor air thermal mass thermal resistance, $R_{oi}$ is a thermal resistance between indoor air and outdoor air, $\dot{Q}_{HVAC}$ is a sensible heat provided to/removed from a building space from an HVAC system (e.g., including HVAC equipment 210), and $\dot{Q}_{other}$ is an internal heat load/gains. $\dot{Q}_{other}$ can result from sources of heat disturbances such as, for example, solar radiation, occupancy, and/or electrical equipment.

Inputs to the above example zone model can include $\dot{Q}_{HVAC}$ which can be measured and controlled, $T_{oa}$ which can be measured but not controlled, and $\dot{Q}_{other}$ which may not be measured or controlled. States of the building thermal model can include a measured state of $T_{ia}$ and an unmeasured state of $T_m$. An output of the thermal model can include $T_{ia}$ as a measured output. In some embodiments, data combiner 2220 can determine/estimate the resistances and capacitances (i.e., $C_{ia}$, $C_m$, $R_{mi}$, $R_{oi}$) based on the building equipment data, the building property data, and/or the building layout data. By utilizing the information in the CAD/BIM file, data combiner 2220 can reduce and/or eliminate a need for time-consuming and computationally expensive experiments to determine values of the model parameters (e.g., as performed by asset allocator 402).

Data combiner 2220 is shown to provide the combined data set to asset allocator 402. Based on the combined data set, asset allocator 402 can perform MPC for the building indicated by the CAD/BIM file. Particularly, asset allocator 402 may construct an optimization problem based on information included in the combined data set (e.g., the one or more zone models). In this way, building equipment can be operated based on information determined/identified based on the CAD/BIM file. Specifically, building equipment may be operated respective of control relationships defined in zone models provided by data combiner 2220. In some embodiments, controller 2200 is a part of asset allocator 402. As such, asset allocator 402 may include some and/or all of the functionality of controller 2200.

In some embodiments, asset allocator 402 generates constraints on the optimization problem based on the combined data set and/or any data therein. A constraint on the optimization problem can ensure that a solution to the optimization problem adheres to certain bounds. Constraints can force solutions to the optimization problem to be reflective of various limitations of the building. The limitations can include economic, physical, or other limitations that the building should operate within. In some embodiments, the constraints are generated based on relationships between building equipment identified by building equipment identifier 2212 and thermal properties of the building. Said relationships can be determined by building property generator 2218 by estimating how the building equipment can affect environmental conditions of the building. For example, a constraint requiring a temperature of a space to always be above a certain temperature may be determined based on a relationship between thermal properties indicating average heat loss through the space and building equipment that can operate to provide heat to the space. The constraint may increase costs over a time period due to additional operation of building equipment, but can ensure the space is kept comfortable even due to excess heat loss.

In some embodiments, asset allocator 402 performs a system identification experiment to gather additional data if asset allocator 402 determines information is missing (e.g., based on flags set by building property generator 2218). The system identification experiment can be performed to acquire any missing information that cannot be obtained based on the CAD/BIM file. Defining the missing information can be helpful in ensuring that control relationships defined by data combiner 2220 are accurate. Accuracy of control relationships may be critical for correctly operating building equipment to affect variable states or conditions of the building.

In some embodiments, data combiner 2220 provides the combined data set to a different system/controller. For example, data combiner 2220 can provide the combined data set to a database hosted on a cloud server for later access. As another example, data combiner 2220 can provide the combined data set to a data mining system for determining optimal building layouts that minimize power consumption for heating/cooling buildings. It should be understood that data combiner 2220 can provide the combined data as needed to various devices, systems, controllers, etc. for various applications.

In some embodiments, data combiner 2220, generates control signals based on received data and provides the control signals directly to building equipment (e.g., subplants 420) and/or to a system that manages building equipment (e.g., BMS 606). In this way, data combiner 2220 may be able to operate building equipment directly based on data determined based on the CAD/BIM file. For example, data combiner 2220 may utilize building equipment data and building layout data to directly predict how the building equipment of a zone will affect conditions in the zone respective of a layout of the zone. In this way, data combiner 2220 may include some and/or all of the functionality of asset allocator 402, according to some embodiments.

In some embodiments, data combiner 2220 uses various models identified and/or generated by components of controller 2200 to perform a model-based operation for building equipment. For example, data combiner 2220 may utilize the zone models described above to perform the model-based operation. A model-based operation can include any type of operation that uses a model as input. For example, model-based operations may include fault detection operations, diagnostic operations, search operations, analysis operations, control operations, etc. As a specific example, with regard to a model-based operation for operating building equipment, data combiner 2220 can use the zone models to determine how to best operate the building equipment. In some embodiments, model-based operations for operating building equipment are performed by asset allocator 402. In this case, data combiner 2220 may provide the zone models (or some other models) to asset allocator 402 to perform the model-based operations. As another example, with regard to a model-based operation for fault detection, data combiner 2220 (or some other component/device) may utilize the zone models to determine what information to monitor that may be indicative of faults. In this case, the zone models can be analyzed to determine, for example, how building equipment interacts to determine what feedback may be indicative of equipment faults. As should be appreciated, data combiner 2220, asset allocator 402, and/or other components/devices can utilize models identified/generated based on CAD/BIM files to perform model-based operations for building equipment.

Building Property Generator

Figure 23:
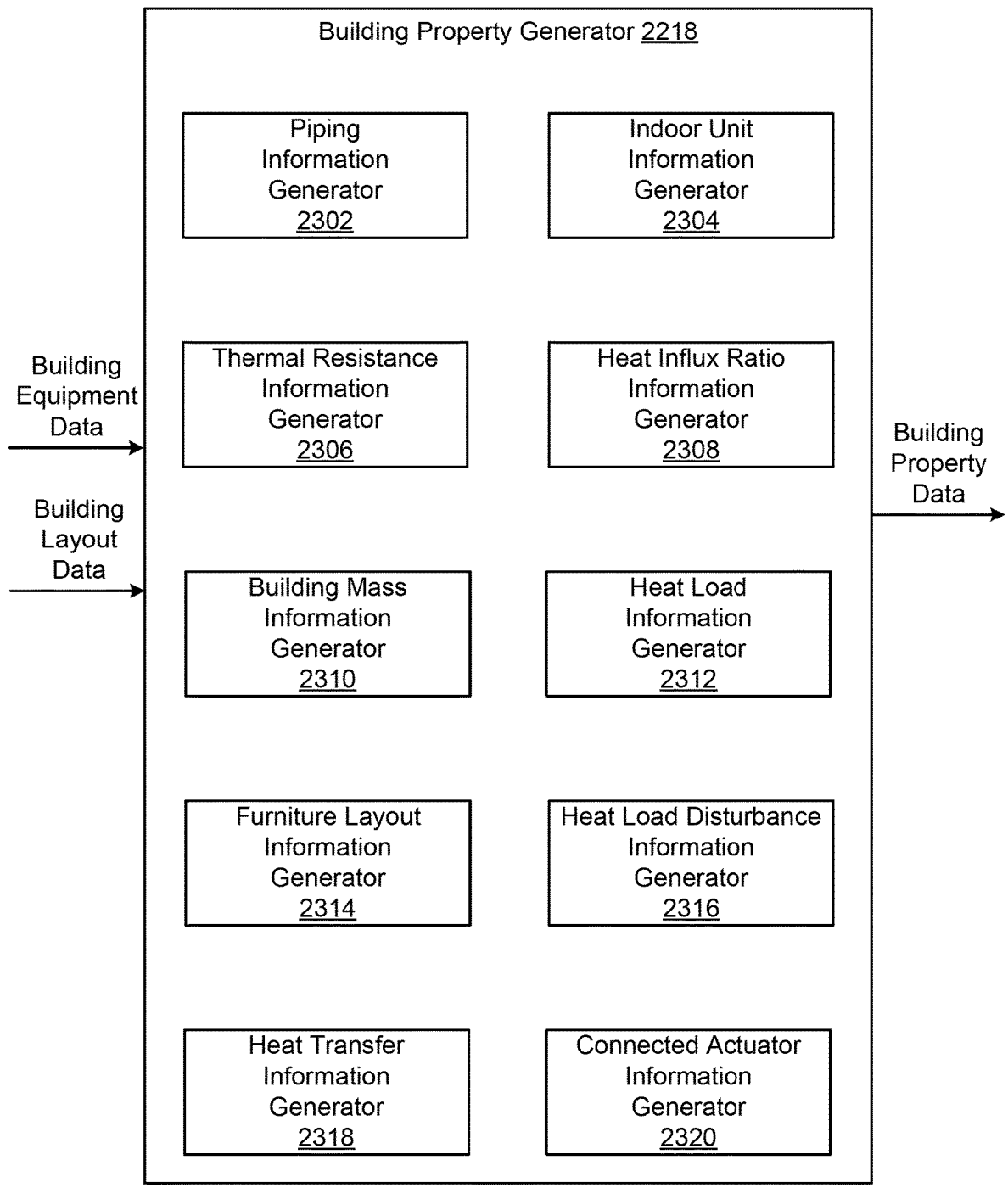
FIG. 23 is a block diagram of the building property generator of FIG. 22 in greater detail, according to some embodiments.

Referring now to FIG. 23, building property generator 2218 is shown in greater detail, according to some embodiments. As described above, building property generator 2218 can generate building property data based on data received from identifiers 2212 and 2214. Based on the received data, building property generator 2218 can calculate/determine any information applicable to various processes (e.g., MPC, automatic refrigerant charging, etc.) to include in the building property data provided to data combiner 2220. In some embodiments, some components of building property generator 2218 are a single component. However, each component is shown individually for ease of explanation. It should be appreciated that building property generator 2218 may include fewer, the same, or more components than as shown in FIG. 23. Depending on what information is useful for associated processes, building property generator 2218 can include corresponding components to determine/calculate said information.

In some embodiments, building property generator 2218 includes a piping information generator 2302 to calculate information regarding piping of the building based on information in the CAD/BIM file to include in building property data. For example, piping information generator 2302 can calculate a pipe length of each pipe segment of a pipe, an inner pipe diameter, an outer pipe diameter, and a local and/or an overall piping elevation. To determine the pipe length of each pipe segment, piping information generator 2302 can, for example, determine a distance between building devices identified by the building equipment data. As another example, to determine the inner and outer pipe diameters, piping information generator 2302 may determine a volume of liquid that is required for operation of the building equipment. As the volume of liquid required for the building equipment increases, the inner and outer pipe diameter calculated by piping information generator 2302 may increase. The local piping elevation can be calculated by piping information generator 2302 using a ceiling height of a space of the building as indicated by the building layout data plus/minus an offset. Piping information generator 2302 may add the add/subtract the offset depending on if piping information generator 2302 estimates the piping will be above or below the ceiling. Likewise, the overall piping elevation can be determined based on an estimated height of the piping above ground level. The piping information determined by piping information generator 2302 can be utilized in control processes to, for example, estimate an amount of a resource that can be provided to a building device, an amount of force (and thereby an amount of power) required to drive resources through the piping, and a type of piping that should be ordered if replacement of the piping is necessary. The piping information may also be useful in determining a thermodynamic inertia of a refrigeration cycle based on the length of the piping.

In some embodiments, building property generator 2218 includes an indoor unit information generator 2304 to calculate information regarding indoor units (IDUs) of a VRF system of the building based on information in the CAD/BIM file to include in building property data. For example, indoor unit information generator 2304 can calculate circuiting of the IDUs, a location of the IDUs in the building, and/or an initial grouping of the IDUs in an unobstructed common space. As the IDUs may be identified in the building equipment data provided by building equipment identifier 2212, indoor unit information generator 2304 may be able to determine circuiting of each IDU based on a serial number of each IDU, a standard model of an IDU, etc. The circuiting can be useful for determining how each IDU can be operated, how much power each IDU may consume, etc. Likewise, the location of each IDU and the initial grouping of IDUs may be calculated by indoor unit information generator 2304 based on the building layout data. For example, the initial grouping of IDUs may be calculated by indoor unit information generator 2304 based on a relative location of each IDU to the every other IDU and/or based on what zones of the building each IDU can affect. IDU information can be utilized, for example, during an MPC process to determine what IDUs can be operated to affect a temperature of a zone at a lowest cost.

In some embodiments, building property generator 2218 includes a thermal resistance information generator 2306 to calculate information regarding a thermal resistance of walls surrounding a zone of the building based on information in the CAD/BIM file to include in building property data. For the zone, the CAD/BIM file may indicate, for example, a thickness of each wall surrounding the zone, a material of each wall (e.g., wood, metal, drywall, cloth, etc.), material within the walls (e.g., a type of insulation), materials of other components or parts of the zone. Based on said information, thermal resistance information generator 2306 may determine a thermal resistance of each wall. For example, a wall containing a large amount of insulation and that is made of metal may have a higher thermal resistance than a wall containing no insulation and that is made of wood. Likewise, a large and thin wall may be calculated by thermal resistance information generator 2306 to provide less thermal resistance as compared to a small and thick wall. Calculating the thermal resistance of walls surrounding the zone can be useful, for example, to estimate an amount of time the zone may be able to resist a heat flow to sustain a particular temperature in the zone. In some embodiments, thermal resistance information generator 2306 and/or another component of building property generator 2218 can determine/predict a capacitance value of a zone and/or a building based on building information.

In some embodiments, building property generator 2218 includes a heat influx ratio information generator 2308 to calculate information regarding a heat influx ratio related to an orientation of the building and a corresponding zone based on information in the CAD/BIM file to include in building property data. For example, the building layout data may identify a direction (e.g., north, south, northwest, etc.) in which the corresponding zone is oriented. Using the orientation of the corresponding zone, heat influx ratio information generator 2308 can calculate the heat influx ratio of the corresponding zone. For example, heat influx ratio information generator 2308 may calculate that the corresponding zone has a high heat influx ratio if the corresponding zone is oriented in a direction of the sun at midday as compared to if the corresponding zone is oriented away from the sun. The heat influx ratio calculated for the corresponding zone can be utilized, for example, to determine whether a heater is required to raise a temperature of the corresponding zone over a time period as a high influx ratio may indicate the temperature is increased naturally over the time period.

In some embodiments, building property generator 2218 includes a building mass information generator 2310 to calculate information regarding a thermal mass of the building based on information in the CAD/BIM file to include in building property data. For example, the building layout data may indicate that a majority of the building is made of a lightweight material (e.g., wood). Based on the knowledge that the building is primarily made of the lightweight material, building mass information generator 2310 can determine that the building has a low thermal mass. Based on the thermal mass of the building, MWC can more accurately determine how much building equipment should be operated in order to maintain comfortable temperatures for occupants.

In some embodiments, building property generator 2218 includes a furniture layout information generator 2314 to calculate information regarding a layout of furniture in a zone of the building based on information in the CAD/BIM file to include in building property data. For example, the building layout data may indicate that the zone has a large amount of chairs and desks. Based on this information, furniture layout information generator 2314 may determine that the zone requires occupant comfort to be maintained as occupants are expected to commonly be in the zone due to the large amount of chairs and desks. However, if the building layout data indicates the zone does not have any furniture commonly used by occupants (e.g., no chairs, no desks, etc.), furniture layout information generator 2314 may determine that the zone does not require occupant comfort to be maintained as occupants are not expected to commonly be in the zone. This information can be useful for MPC as some zones may be determined to not require occupant comfort to be maintained, thereby optimizing (e.g., reducing) costs related to operating building equipment.

In some embodiments, building property generator 2218 includes a heat load disturbance information generator 2316 to calculate an initial estimation of a heat load disturbance in a zone of the building based on information in the CAD/BIM file to include in building property data. The heat load disturbance can be caused by various heat sources affecting the zone. For example, the heat load disturbance can be caused by solar radiation of the sun, body heat emitted by occupants, heat emitted by electronic devices, etc. As such, heat load disturbance information generator 2316 can utilize information identified in the building equipment data and/or the building layout data to calculate the initial estimation of the heat load disturbance. For example, if the building equipment data indicates a large amount of electronic devices are in the zone, heat load disturbance information generator 2316 may calculate a higher value of the heat load disturbance due to heat emitted from the electronic devices. Likewise, if the zone faces the sun, heat load disturbance information generator 2316 may calculate a higher value of the heat load disturbance due to solar radiation. The initial estimation of the heat load disturbance can be utilized, for example, in performing MPC in order to capture sources of heat other than building equipment that may affect occupant comfort in the zone.

In some embodiments, building property generator 2218 includes a heat transfer information generator 2318 to calculate a radiative heat transfer potential based on dimensions of windows included in the CAD/BIM file to include if generating building property data. The radiative heat transfer potential can indicate how much heat may transfer between an area of the building the windows are in and an external area. Heat transfer information generator 2318 may utilize the height, width, and depth of the windows as indicated by the building layout information to determine information such as, for example, a thermal conductivity of the windows, a thermal resistance of the windows, etc. Using the determined information, heat transfer information generator 2318 can calculate the radiative heat transfer potential of the windows. As the height and width of a window increases, the calculated radiative heat transfer potential of the window may also increase. The radiative heat transfer potential of the windows can be useful, for example, in MPC to further calculate the heat disturbance affecting the building.

In some embodiments, building property generator 2218 includes a connected actuator information generator 2320 to determine an availability of other connected actuators to include if generating building property data. The other connected actuators can include, for example, shading equipment, fresh air supply ventilators, etc. In some embodiments, the other connected actuators are not included in the identified building equipment or the identified building layout. However, knowledge of each connected actuator in the building can be useful for various applications. For example, connected actuator information generator 2320 may utilize windows indicated by the identified building layout to determine if shading equipment is present. Connected actuator information generator 2320 may determine that shading equipment exists for each window in the building. As another example, connected actuator information generator 2320 may determine locations of fresh air supply ventilators that can be operated based on vents indicated by the identified building layout. Determining the availability of the other connected actuators can be useful for various applications. For example, MPC may be able to determine shading equipment can be operated to affect a temperature in a zone of the building and optimize (e.g., reduce) costs. Operating the shading equipment may be relatively inexpensive in comparison to operating a heater or air conditioner to affect the temperature in the zone.

Example CAD/BIM File Information

Figure 24:
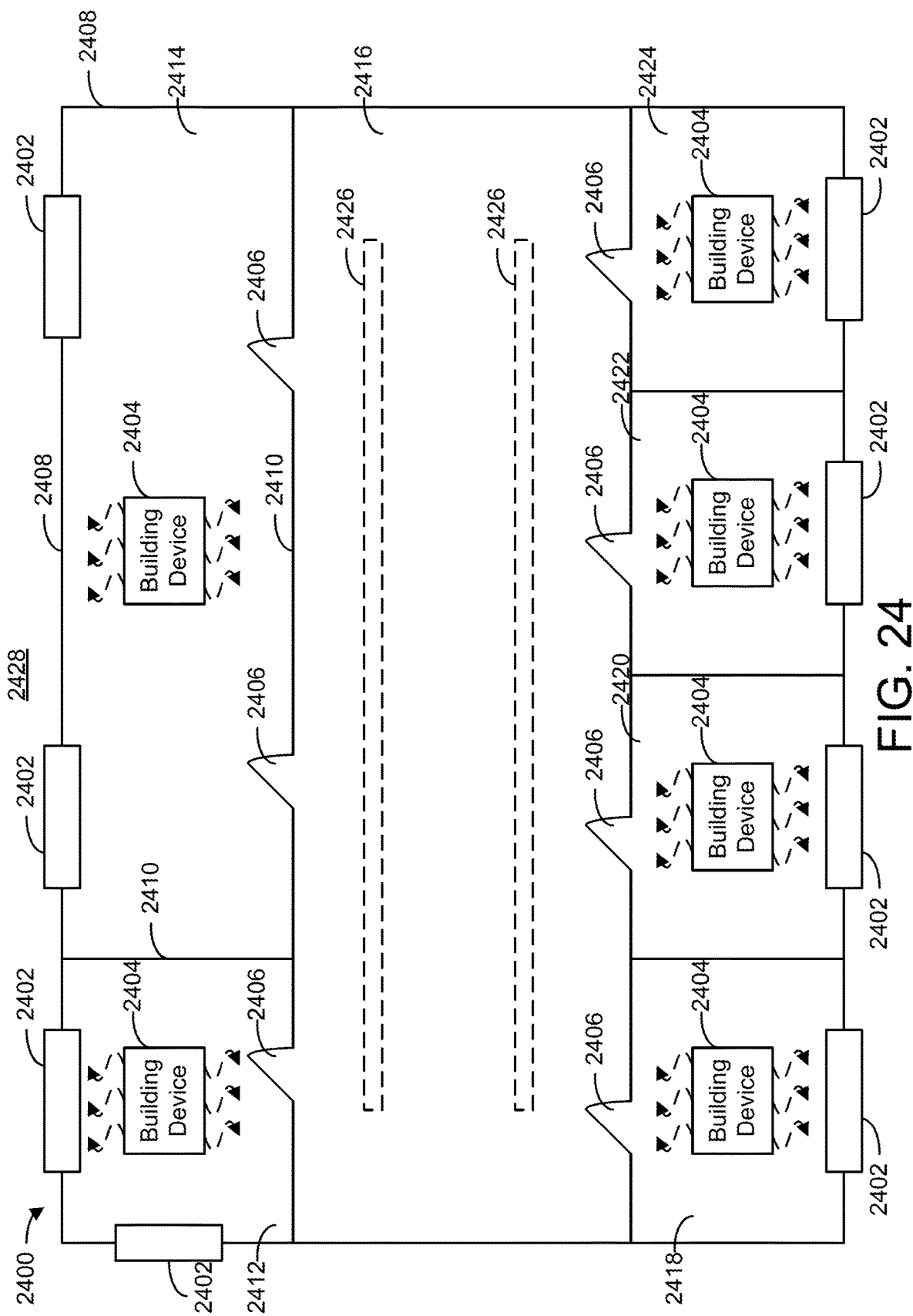
FIG. 24 is a block diagram of a zone of a building that can be represented by a CAD/BIM file, according to some embodiments.

Referring now to FIG. 24, a zone 2400 of a building that can be represented by a CAD/BIM file is shown, according to some embodiments. Zone 2400 is shown to include various devices and components that may be identified by identifiers 2212-2214 as described with reference to FIG. 22 and/or may be calculated by building property generator 2218. Based on information collected regarding zone 2400, a control process (e.g., MPC) can determine how to properly maintain occupant comfort in zone 2400 while optimizing (e.g., minimizing) costs. The information collected regarding zone 2400 can also be utilized for other various purposes such as reliability studying, data mining, etc.

Zone 2400 is shown to include spaces 2412-2424. Each space of spaces 2412-2424 can be included in the CAD/BIM file directly or may be determined by building property generator 2218 based on other information included in the CAD/BIM file. For example, if spaces 2412-2424 are not indicated directly by the CAD/BIM file, building property generator 2218 may utilize walls included in the CAD/BIM file to determine individual spaces in zone 2400. Specifically, zone 2400 is shown to include two exterior walls 2408 and two interior walls 2410. Exterior walls 2408 and interior walls 2410 can be used by building property generator 2218 to determine space 2414. Each wall and/or other barriers included in a CAD/BIM file can be utilized to determine more specific spaces of the building. By determining spaces 2412-2424, each space of spaces 2412-2424 can be individually controlled to maintain occupant comfort. As such, each of spaces 2412-2424 can be optimized to maintain occupant comfort while optimizing (e.g., reducing) costs.

Zone 2400 is also shown to include windows 2402. In some embodiments, windows 2402 facilitate a heat exchange with an external space 2428. External space 2428 may be the outdoors, another zone of the building, etc. Due to windows 2402, a heat load disturbance caused by external heat from external space 2428 may affect zone 2400. For example, if external space 2428 is the outdoors, sunlight may enter through windows 2402 and increase a temperature of zone 2400 and/or of spaces 2412-2424. If the CAD/BIM file describing zone 2400 indicates a type of window that windows 2402 are, building property generator 2218 may be able to determine how much heat is expected to be exchanged between external space 2428 and zone 2400 via windows 2402. If the type of window is not identified, building property generator 2218 may utilize a standard window model to estimate an amount of heat expected to be exchanged via windows 2402.

Zone 2400 is also shown to include doors 2406. Similar to windows 2402, doors 2406 can facilitate a heat exchange between spaces 2412-2424. Depending on a type of door (e.g., wood, metal, plastic, etc.), size, geometry (e.g., thickness), etc., a different amount of heat may be exchanged between spaces 2412-2424. By determining how much heat is expected to be exchanged through doors 2406, a control process can estimate how conditions may vary within each space of spaces 2412-2424. For example, as space 2414 is shown to include two doors 2406, building property generator 2218 may determine space 2414 will lose a large amount of heat to space 2416. The determination that space 2414 will lose heat can be utilized when performing a control process to ensure occupant comfort is maintained by not allowing space 2414 to become too cold.

Zone 2400 is also shown to include building devices 2404. Each building device 2404 can be configured to affect a variable state or condition of zone 2400 and/or of a space of spaces 2412-2424 that each building device 2404 is located in. Building devices 2404 can include, for example, heating, ventilation, or air conditioning (HVAC) equipment, VRF equipment, etc. Each space of spaces 2412-2424 can include one or more building devices 2404. In some embodiments, building equipment identifier 2212 determines each building device 2404 in zone 2400. Depending on an amount of information regarding building devices 2404 included in the CAD/BIM file, building property generator 2218 can determine specific information regarding each building device 2404 such as, for example, how much energy each building device 2404 consumes in a time period, what conditions (e.g., temperature, humidity, air quality, etc.) each building device 2404 can affect, etc. Based on this information, a control process can determine what building devices 2404 to operate to maintain occupant comfort in each space of spaces 2412-2424.

Space 2416 is shown to include piping 2426. In some embodiments, certain components of zone 2400 such as piping 2426 are not explicitly indicated by the CAD/BIM file, but may useful to determine (e.g., for MPC). If piping 2426 is not included in the CAD/BIM file, building property generator 2218 can utilize other information included in the CAD/BIM file to determine how piping 2426 is integrated in zone 2400. For example, building property generator 2218 may utilize dimensions (e.g., width and height) of space 2416 to determine a length of piping 2426. As another example, if some building devices 2404 are known to require resources (e.g., water, refrigerant, etc.) from piping 2426, building property generator 2218 may determine the length of piping 2426 based on what building devices 2404 require the resources. Further, building property generator 2218 may be able to determine a diameter of piping 2426 based on the building devices 2404 requiring resources. Depending on an amount of resources required by building devices 2404, building property generator 2218 can determine a diameter of piping 2426. As the amount of resources required by building devices 2404 increases, the diameter of piping 2426 may be determined to increase as well to allow for more resources to be provided to building devices 2404.

Based on information identified/generated from the CAD/BIM file describing zone 2400, building property generator 2218 can also generate additional building property data applicable to control processes as described above. For example, building property generator 2218 may generate additional building property data regarding zone 2400 such as circuiting of IDUs, a thermal resistance of walls (e.g., interior walls 2410 and exterior walls 2408), a heat influx ratio of zone 2400, etc. In some embodiments, building property generator 2218 is configured to generate any information indicated as necessary by asset allocator 402.

Figure 25:
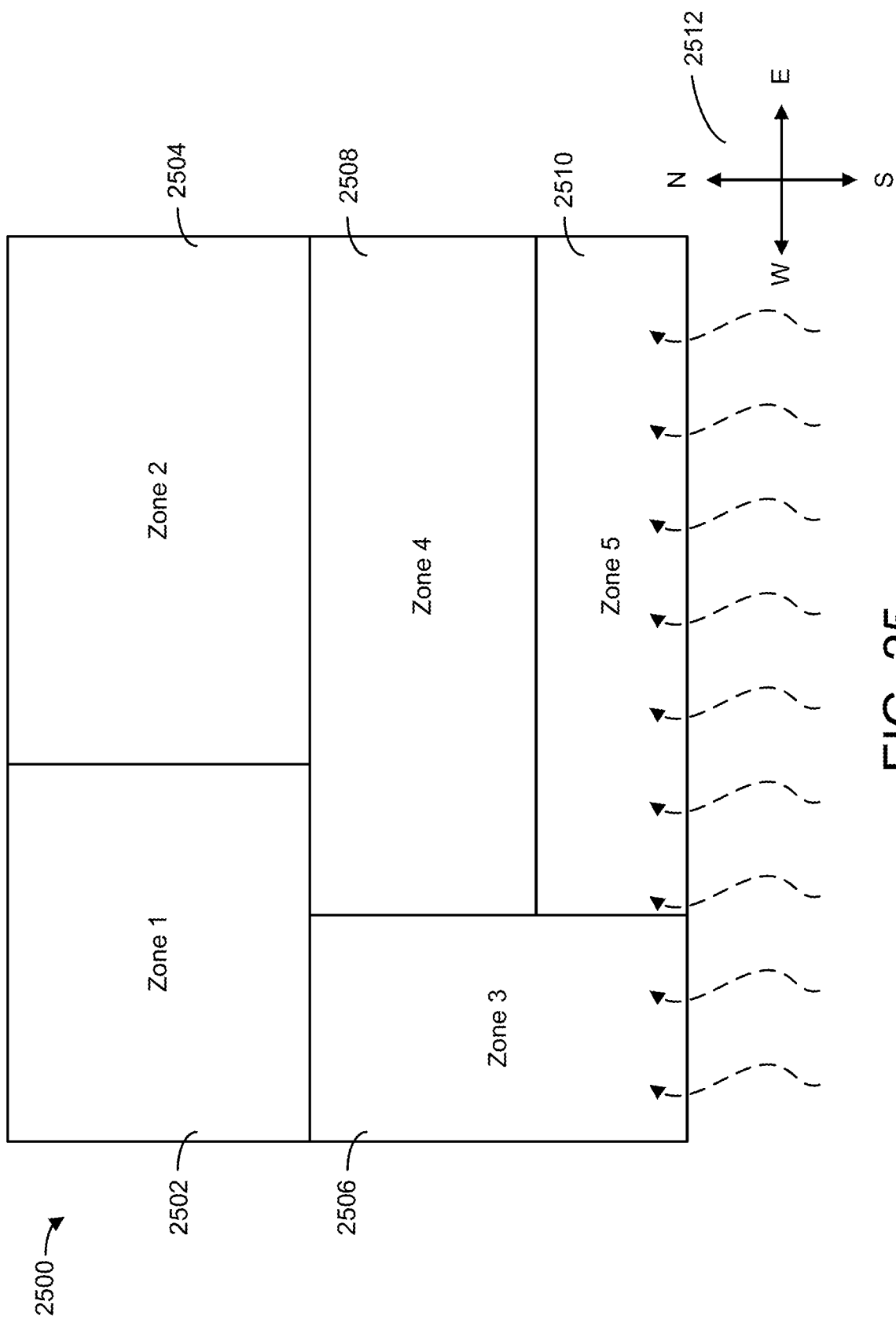
FIG. 25 is a block diagram of a zone group of a building represented by a CAD/BIM file, according to some embodiments.

Referring now to FIG. 25, a zone group 2500 of a building represented by a CAD/BIM file is shown, according to some embodiments. Zone group 2500 is shown to include a first zone 2502, a second zone 2504, a third zone 2506, a fourth zone 2508, and a fifth zone 2510. In some embodiments, zones 2502-2510 are included in the CAD/BIM file. As the CAD/BIM file may only illustrate a layout of the building (e.g., building 10), zones and/or zone groups may not be directly indicated. However, zone and/or zone group information can be useful for performing control processes by simplifying optimization problems. For example, if performing MPC, asset allocator 402 may consider zones 2502-2510 collectively as zone group 2500 to determine comfort constraints. By considering zones 2502-2510 collectively as zone group 2500, MWC can be computationally easier for asset allocator 402 to solve. Even if zone group 2500 is not utilized by asset allocator 402 to perform MPC, utilizing each zone of zones 2502-2510 may still be computationally easier for asset allocator 402 to perform MPC in comparison to considering each individual space within each zone.

In some embodiments, building property generator 2218 defines zone group 2500 to include zones 2502-2510 based on various information included in the CAD/BIM file. For example, building property generator 2218 may utilize building layout data determined and provided by building layout identifier 2214 to calculate zones of zone group 2500. The building layout data can indicate, for example, areas of the building near a southern side of the building as indicated by a compass 2512. Based on the building layout data, building property generator 2218 can determine areas sharing similar characteristics to define zone groups.

Based on zone groupings determined by building property generator 2218, building property generator 2218 can determine characteristics of each zone group for use in control processes (e.g., MPC) and/or other applications. For example, building property generator 2218 may calculate that zone group 2500 experiences a high heat load disturbance due to sunlight entering from the south. In some embodiments, building property generator 2218 estimates the heat load disturbance based on other information identified/calculated based on the CAD/BIM file. For example, building property generator 2218 may utilize information such as a number of windows, a thickness of walls, a zone of the area defined by zone group 2500, etc. to estimate the head load disturbance affecting zone group 2500 and/or zones 2502-2510. As more information regarding zone group 2500 and/or zones 2502-2510 is provided to asset allocator 402, asset allocator 402 can determine more optimal solutions to an optimization problem to maintain occupant comfort while optimizing (e.g., reducing) costs.

Figure 26:
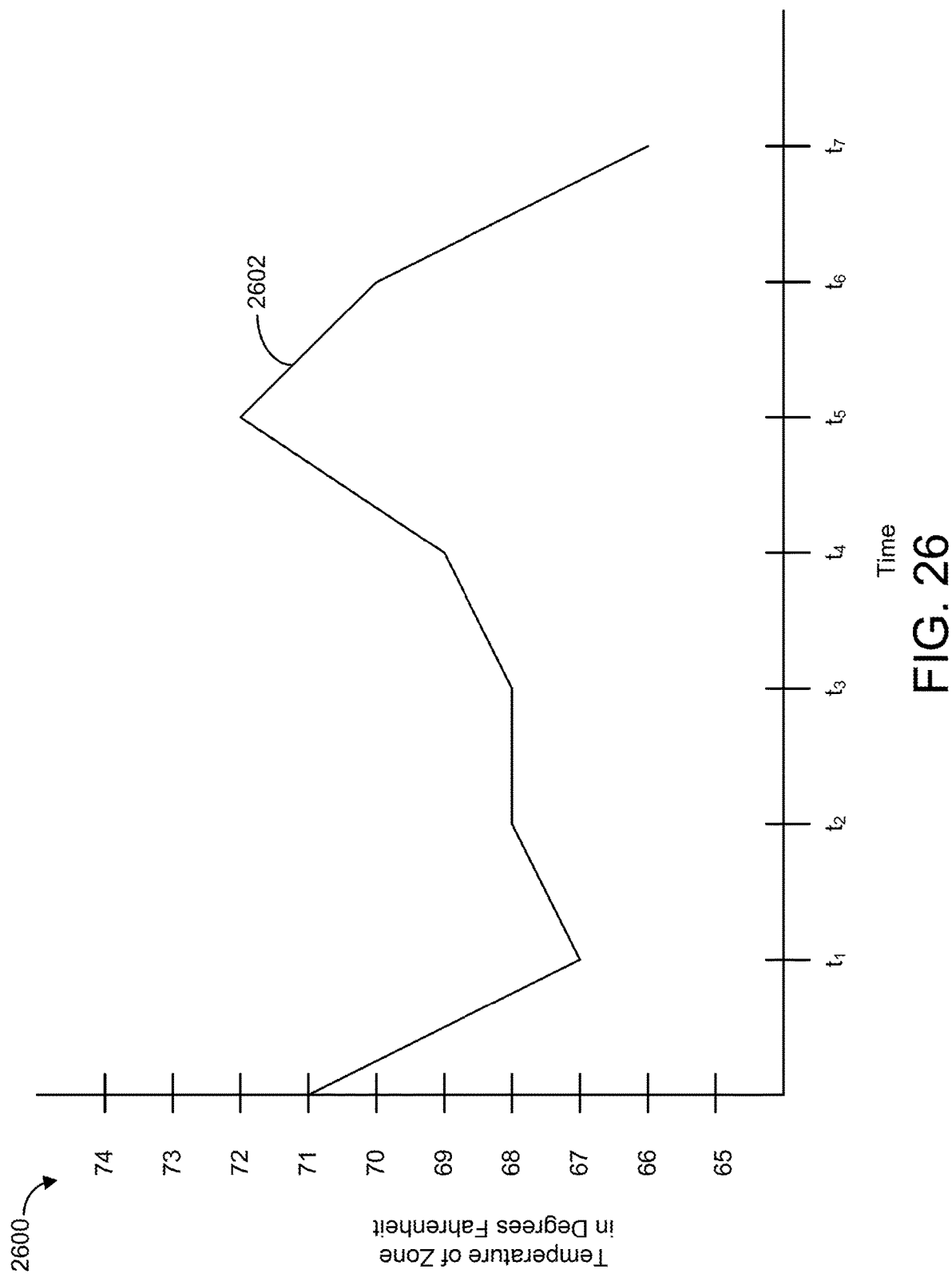
FIG. 26 is a graph of a graph illustrating an estimated temperature of a zone over a time period, according to some embodiments.

Referring now to FIG. 26, a graph 2600 illustrating an estimated temperature of a zone over a time period is shown, according to some embodiments. Graph 2600 is shown to include a series 2602. In some embodiments, series 2602 illustrates the estimated temperature of the zone (e.g., zone 2400) at various times steps $t_1$-$t_7$ during the time period (e.g., an hour, a day, etc.). Series 2602 can be calculated by building property generator 2218 to estimate how the temperature of the zone naturally changes over the time period (i.e., without operation of building devices) based on information of a CAD/BIM file. Series 2602 can be useful to asset allocator 402 if performing MPC, as natural temperature fluctuations of the zone can be accounted for to ensure occupant comfort is maintained and costs are optimized (e.g., reduced).

At each time step, series 2602 indicates an estimated temperature of the zone. For example, at time step $t_3$, series 2602 is shown to indicate that the estimated temperature of the zone is 68° F. Based on the estimated temperature of the zone, asset allocator 402 can determine how building equipment should be operated to account for the natural temperature fluctuations of the zone.

As described above, series 2602 can be estimated by building property generator 2218 based on information identified/g from the CAD/BIM file regarding the zone. For example, if the zone is indicated by the CAD/BIM file to be facing away from the sun, a heat load disturbance of the zone due to solar effects may less than if the zone were facing the sun. To determine series 2602, building property generator 2218 may account for information such as, for example, a radiative heat transfer of windows/walls of the zone, a thermal resistance of each wall surrounding the zone, a heat influx ratio of the zone, etc. In some embodiments, building property generator 2218 estimates how the zone may react based on various conditions (e.g., weather conditions) affecting the zone. As building property generator 2218 considers more condition combinations affecting the zone, asset allocator 402 can receive more information regarding how the zone may react given various conditions. For example, building property generator 2218 can estimate how conditions of the zone change in response to sunny weather, cloudy weather, various outdoor temperatures, various outdoor humidity values, etc. In effect, asset allocator 402 can learn from the various condition combinations to more accurately solve an optimization problem.

Figure 27:
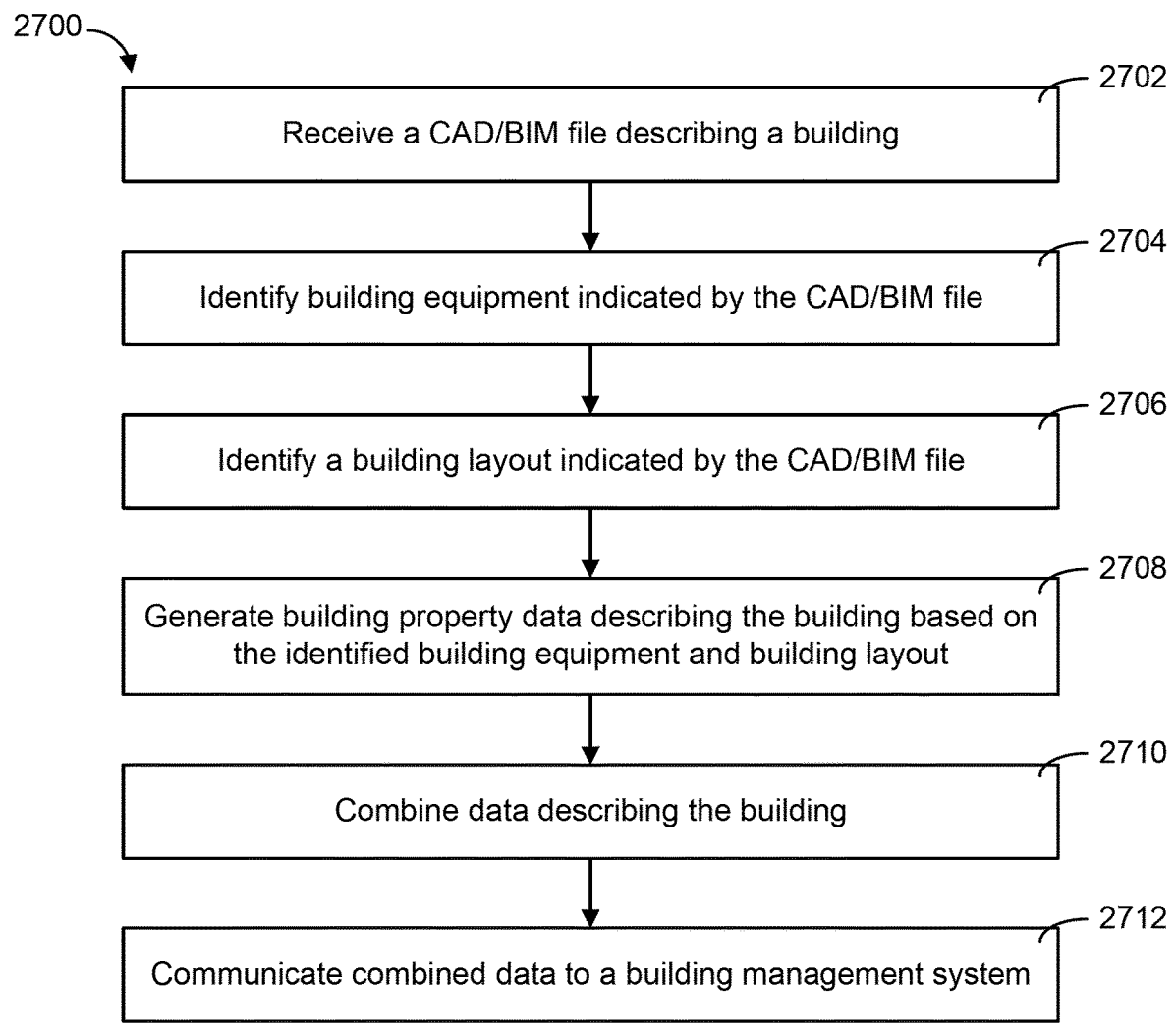
FIG. 27 is a flow diagram of a process for determining building information of a building based on a CAD/BIM file, according to some embodiments.

Process for Using a CAD/BIM File for MPC Problem Formulation and Other Applications Referring now to FIG. 27, a process 2700 for determining building information of a building based on a CAD/BIM file is shown, according to some embodiments. The building information determining in process 2700 can be useful for a variety of applications such as MPC, automatic refrigerant charging, determining initial zone groupings of the building, etc. For example, an MWC process can utilize building equipment information determined based on the CAD/BIM file to determine what building devices to operate in order to maintain comfortable conditions (e.g., temperature, humidity, lighting, etc.) for occupants. As another example, piping information included in the building information can be used to calculate a volume of refrigerant required to sustain a VRF system. Performing process 2700 may reduce and/or eliminate a need for performing system identification (a computationally intensive process) on the building if the building information can be determined by parsing the CAD/BIM file. Even if system identification is still performed, the building information determined by performing process 2700 can be used to supplement information determined through the system identification. In some embodiments, some and/or all steps of process 2700 are performed by controller 2200.

Process 2700 is shown to include receiving a CAD/BIM file describing a building (step 2702), according to some embodiments. The CAD/BIM file can be received from any source capable of communicating the CAD/BIM file. For example, the CAD/BIM file can be received from a cloud service, a user device, a database, etc. The CAD/BIM file can include information describing the building such as, for example, building equipment, a layout of the building, etc. In some embodiments, step 2702 is performed by controller 2200.

Process 2700 is shown to include identifying building equipment indicated by the CAD/BIM file (step 2704), according to some embodiments. The building equipment can include building devices each capable of affecting a variable state or condition of the building. For example, a building device of the building equipment may be a heater of an HVAC system operable to affect a temperature in a space of the building. In some embodiments, the building equipment identified included in the CAD/BIM file includes information that can be used in step 2704 to determine specifics of the building equipment. For example, a building device of the building equipment may indicate a serial number that can be utilized in step 2704 to determine a model specific to the building device. In some embodiments, the building equipment included in the CAD/BIM file includes generic information regarding the building equipment. If the CAD/BIM file only indicates generic information regarding the building equipment, step 2704 can utilize a standard model of each building device of the building equipment to still capture dynamics of the building. For example, a building device of the building equipment may only be identified as an indoor unit of a VRF system. In this case, a standard model of indoor units can be utilized to determine dynamics of the building. In some embodiments, the building equipment identified in step 2704 includes information regarding locations of the building equipment in the building. In some embodiments, step 2704 is performed by building equipment identifier 2212.

Process 2700 is shown to include identifying a building layout indicated by the CAD/BIM file (step 2706), according to some embodiments. The building layout identified in step 2706 can be used to determine information such as, for example, dimensions of zones in the building, locations of building equipment, a height of the building, etc. Understanding the layout of the building may be necessary in order to calculate information necessary for control processes as described below in step 2708. In some embodiments, the building layout identified in step 2706 is what is defined in the CAD/BIM file. In some embodiments, the building layout identified in step 2706 includes information not directly available in the CAD/BIM file, but that can be estimated from other aspects of the CAD/BIM file. For example, the CAD/BIM file may indicate the height of the building, but not individual rooms in the building. However, based on the height of the building, step 2706 can determine/ estimate heights of individual rooms to include in the identified building layout. In some embodiments, step 2706 is performed by building layout identifier 2214.

Process 2700 is shown to include generating building property data describing the building based on the identified building equipment and building layout (step 2708), according to some embodiments. Generating building property data may be critical for a control process (e.g., MPC) to perform correctly. As the CAD/BIM file may be designed to illustrate a structure of the building, certain dynamics/ information of the building may not be directly captured in the CAD/BIM file. As such, step 2708 can generate necessary building property data based on the building equipment and the building layout. For example, the CAD/BIM file may not indicate an estimated heat disturbance in a particular zone due to sunlight entering through windows of the particular zone. In step 2708, the estimated heat disturbance can nonetheless be calculated and included in the generated building property data. For example, the estimated heat disturbance entering the particular zone may be calculated using locations and dimensions of windows in the particular zone indicated by the building layout. Based on the locations and dimensions of the windows, an average amount of sunlight entering the particular zone can be calculated at different times over a day and for varying outdoor conditions (e.g., varying levels of cloud cover). As another example, step 2708 may include calculating an efficiency value of a building device based on the building equipment identified in step 2704. If the identified building equipment indicates a type of the building device (e.g., a heater, an IDU, a light, etc.), an amount of energy required by the building device to affect an associated variable state or condition of the zone can be calculated in step 2704. In some embodiments, step 2708 is performed by building property generator 2218.

Process 2700 is shown to include combining data describing the building (step 2710), according to some embodiments. In step 2710, a combined data set can be generated including any and/or all information identified/generated in steps 2704-2708. Combination of the data may be beneficial for use in control processes and/or other applications such as reliability studies, data mining, etc. In some embodiments, step 2710 includes generating a thermal model based on thermal properties of the building. The thermal model can be included in the combined data set and can be used to estimate how temperature and/or other conditions of the space are affected by environmental changes. In some embodiments, step 2710 includes generating other models (e.g., zone models) that can be used in various model-based operations. In some embodiments, step 2710 includes discarding any information determined to not be beneficial for an application the combined data is intended to be used for. For example, it may not be necessary for chairs identified in the building equipment to be included in the combined data set provided for MPC. As such, information regarding the chairs can be discarded in step 2710. In some embodiments, all data identified/generated in steps 2704-2708 is included in the combined data. Including all data identified/generated in steps 2704-2708 may reduce a computational load as determinations regarding if certain data should or should not be included may not need to be made. In some embodiments, step 2710 is performed by data combiner 2220.

Process 2700 is shown to include communicating combined data to a building management system (step 2712), according to some embodiments. The building management system (BMS) can utilize the combined data for various applications. For example, the BMS may forward the combined data to an asset allocator of the BMS to use in performing MPC for the building. If used in MPC, the combined data can provide a baseline for what building equipment can be operated and how operation of said building equipment may affect the building based on thermal properties and/or a thermal model of the building. Further, the combined data can be used to generate constraints on an optimization problem used in MPC to ensure control decision generated by MPC reflect limitations of the building. As another example, the BMS may perform further data analysis on the combined data to determine other information regarding the building.

In some embodiments, the combined data is provided to other systems and services at step 2712. For example, the combined data may be communicated to a cloud database to be stored for later access. It should be understood the BMS is used for sake of example; the combined data can be sent to any system, device, etc. determined to require the combined data. In some embodiments, step 2712 includes operating the building equipment based on the combined data to affect environmental conditions of the building.

In some embodiments, step 2712 includes performing a model-based operation using one or more models generated in step 2710. As described above, model-based operations can include any type of operation (e.g., fault detection operation, diagnostics operation, search operation, analysis operation, control operation, etc.) that uses a model(s) as an input. In this case, models generated in step 2710 (e.g., zone models) can be used to perform various model-based operations. For example, the models generated in step 2710 may be used in model-based operations for operating building equipment, fault detection, etc. If step 2712 includes performing model-based operations, step 2712 may or may not include providing the combined data to the BMS (or some other system, device, etc.). In some embodiments, step 2712 is performed by data combiner 2220.

CONFIGURATION OF EXEMPLARY EMBODIMENTS

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A controller for a building, the controller comprising:
one or more processors; and
one or more non-transitory computer-readable media storing instructions that, when executed by the one or more processors, cause the one or more processors to perform operations comprising:
parsing a computer-aided design (CAD) file or a building information model (BIM) file for the building to identify building equipment that operates to affect a variable state or condition of a zone of the building;
generating one or more zone models describing one or more control relationships between the building equipment and the variable state or condition of the zone based on the CAD file or the BIM file;
using the one or more zone models to perform a model-based operation for the building equipment;
determining if any properties of the building equipment cannot be obtained based on the CAD file or the BIM file;
in response to a determination that one or more properties of the building equipment cannot be obtained based on the CAD file or the BIM file, notifying a user regarding the one or more properties of the building equipment that cannot be obtained; and
receiving values of the one or more properties of the building equipment from the user, the one or more control relationships determined based on the values of the one or more properties of the building equipment.

2. The controller of claim 1, the operations further comprising:
in response to the determination that one or more properties of the building equipment cannot be obtained based on the CAD file or the BIM file, triggering a system identification experiment to obtain the one or more properties.

3. The controller of claim 1, wherein the operations further comprise:
formulating an optimization problem based on the one or more control relationships; and
solving the optimization problem to generate operating setpoints for the building equipment.

4. The controller of claim 3, wherein the operations further comprise generating one or more constraints on the optimization problem based on the one or more control relationships between the building equipment and the variable state or condition of the zone.

5. The controller of claim 1, wherein the one or more control relationships define how operation of the building equipment affects one or more environmental conditions of the building and how operation of the building equipment affects other building equipment of the building.

6. The controller of claim 1, wherein the operations further comprise:
identifying a layout of the zone indicated by the CAD file or the BIM file; and
determining the one or more control relationships based on a prediction of how the building equipment affects the variable state or condition of the zone provided the layout of the zone.

7. A method for operating building equipment of a building, the method comprising:

parsing a computer-aided design (CAD) file or a building information model (BIM) file for the building to determine a layout of a zone of the building;

predicting one or more thermal properties of the zone based on the layout of the zone, the one or more thermal properties comprising at least one of a thermal resistance associated with the zone or a thermal capacitance associated with the zone; and operating the building equipment to affect a variable state or condition of the zone based on the one or more thermal properties of the zone.

8. The method of claim 7, further comprising:

determining if any information associated with the layout of the zone cannot be obtained based on the CAD file or the BIM file;

in response to a determination that the information associated with the layout of the zone cannot be obtained based on the CAD file or the BIM file, notifying a user regarding the information associated with the layout of the zone that cannot be obtained; and receiving values of the information associated with the layout of the zone from the user, the one or more thermal properties predicted further based on the values of the information associated with the layout of the zone.

9. The method of claim 7, further comprising:

generating a zone model describing the layout of the zone and the variable state or condition of the zone;

generating control decisions based on the zone model; and operating the building equipment based on the control decisions.

10. The method of claim 7, further comprising:

formulating an optimization problem based on the one or more thermal properties of the zone;

generating one or more constraints on the optimization problem based on the layout of the zone; and solving the optimization problem to generate operating setpoints for the building equipment.

11. The method of claim 10, further comprising predicting thermal dynamics of the zone based on the one or more thermal properties.

12. The method of claim 7, further comprising identifying a type of material contained within one or more walls of the zone or within objects inside the zone based on the CAD file or the BIM file, wherein the thermal resistance or the thermal capacitance are predicted based on the type of material.

13. An environmental control system of a building, the system comprising:

building equipment that operates to affect a variable state or condition of a zone of the building; and a controller comprising a processing circuit configured to perform operations comprising:

parsing a computer-aided design (CAD) file or a building information model (BIM) file for the building to identify the building equipment that operates to affect the variable state or condition of the zone;

generating one or more zone models describing one or more control relationships between the building equipment and the variable state or condition of the zone based on the CAD file or the BIM file;

using the one or more zone models to perform a model-based operation for the building equipment;

determining if any properties of the building equipment cannot be obtained based on the CAD file or the BIM file; and in response to a determination that one or more properties of the building equipment cannot be obtained based on the CAD file or the BIM file, triggering a system identification experiment to obtain the one or more properties.

14. The system of claim 13, wherein the operations further comprise:

in response to a determination that one or more properties of the building equipment cannot be obtained based on the CAD file or the BIM file, notifying a user regarding the one or more properties of the building equipment that cannot be obtained; and receiving values of the one or more properties of the building equipment from the user, the one or more control relationships determined based on the values of the one or more properties of the building equipment.

15. The system of claim 13, wherein the operations further comprise:

formulating an optimization problem based on the one or more control relationships; and solving the optimization problem to generate operating setpoints for the building equipment.

16. The system of claim 15, wherein the operations further comprise generating one or more constraints on the optimization problem based on the one or more control relationships between the building equipment and the variable state or condition of the zone.

17. The system of claim 13, wherein the one or more control relationships define how operation of the building equipment affects one or more environmental conditions of the building and how operation of the building equipment affects other building equipment of the building.

18. The system of claim 13, wherein the operations further comprise:

identifying a layout of the zone indicated by the CAD file or the BIM file; and determining the one or more control relationships based on a prediction of how the building equipment affects the variable state or condition of the zone provided the layout of the zone.

19. A controller for a building, the controller comprising:

one or more processors; and one or more non-transitory computer-readable media storing instructions that, when executed by the one or more processors, cause the one or more processors to perform operations comprising:

parsing a computer-aided design (CAD) file or a building information model (BIM) file for the building to identify building equipment that operates to affect a variable state or condition of a zone of the building;

generating one or more zone models describing one or more control relationships between the building equipment and the variable state or condition of the zone based on the CAD file or the BIM file;

using the one or more zone models to perform a model-based operation for the building equipment;

determining if any properties of the building equipment cannot be obtained based on the CAD file or the BIM file; and in response to a determination that one or more properties of the building equipment cannot be obtained based on the CAD file or the BIM file, triggering a system identification experiment to obtain the one or more properties.

20. An environmental control system of a building, the system comprising:

building equipment that operates to affect a variable state or condition of a zone of the building; and a controller comprising a processing circuit configured to perform operations comprising:

parsing a computer-aided design (CAD) file or a building information model (BIM) file for the building to identify the building equipment that operates to affect the variable state or condition of the zone;

generating one or more zone models describing one or more control relationships between the building equipment and the variable state or condition of the zone based on the CAD file or the BIM file;

using the one or more zone models to perform a model-based operation for the building equipment;

determining if any properties of the building equipment cannot be obtained based on the CAD file or the BIM file;

in response to a determination that one or more properties of the building equipment cannot be obtained based on the CAD file or the BIM file, notifying a user regarding the one or more properties of the building equipment that cannot be obtained; and receiving values of the one or more properties of the building equipment from the user, the one or more control relationships determined based on the values of the one or more properties of the building equipment.

* * * * *